United States Patent
Kim et al.

(10) Patent No.: US 9,425,208 B2
(45) Date of Patent: Aug. 23, 2016

(54) VERTICAL MEMORY DEVICES

(71) Applicant: Samsung Electronics Co., Ltd., Suwon-si, Gyeonggi-do (KR)

(72) Inventors: Hong-Soo Kim, Seongnam-si (KR); Sung-Hoi Hur, Seoul (KR); So-Wi Chin, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 14/682,567

(22) Filed: Apr. 9, 2015

(65) Prior Publication Data

US 2015/0303214 A1    Oct. 22, 2015

(30) Foreign Application Priority Data

Apr. 17, 2014  (KR) .................. 10-2014-0045727
Apr. 1, 2015   (KR) .................. 10-2015-0045950

(51) Int. Cl.
  *H01L 29/66*  (2006.01)
  *H01L 27/115* (2006.01)
  *H01L 29/423* (2006.01)

(52) U.S. Cl.
  CPC ...... *H01L 27/11582* (2013.01); *H01L 27/1157* (2013.01); *H01L 27/11573* (2013.01); *H01L 27/11575* (2013.01); *H01L 29/42356* (2013.01)

(58) Field of Classification Search
  CPC ............. H01L 27/11582; H01L 27/11573; H01L 27/11514; H01L 23/528; H01L 27/11575; H01L 29/42356; H01L 27/1157
  USPC ............................................... 257/329
  See application file for complete search history.

(56) References Cited

U.S. PATENT DOCUMENTS

2012/0205779 A1* 8/2012 Kim .................. H01L 27/10852
                                             257/532
2012/0218836 A1  8/2012 Ozawa
2013/0215684 A1* 8/2013 Oh .................... H01L 27/11582
                                             365/185.29

* cited by examiner

*Primary Examiner* — Tu-Tu Ho
(74) *Attorney, Agent, or Firm* — Harness, Dickey & Pierce, P.L.C.

(57) ABSTRACT

A vertical memory device includes a substrate including a cell region and a peripheral circuit region, the peripheral circuit region including a gate structure comprising a transistor, a plurality of channels on the cell region, each of the channels extending in a first direction that is vertical with respect to a top surface of the substrate, a plurality of gate lines stacked in the first direction and spaced apart from each other, the gate lines surrounding outer sidewalls of the channels, and a blocking structure between the cell region and the peripheral circuit region, wherein a height of the blocking structure is greater than a height of the gate structure in the peripheral region.

20 Claims, 72 Drawing Sheets

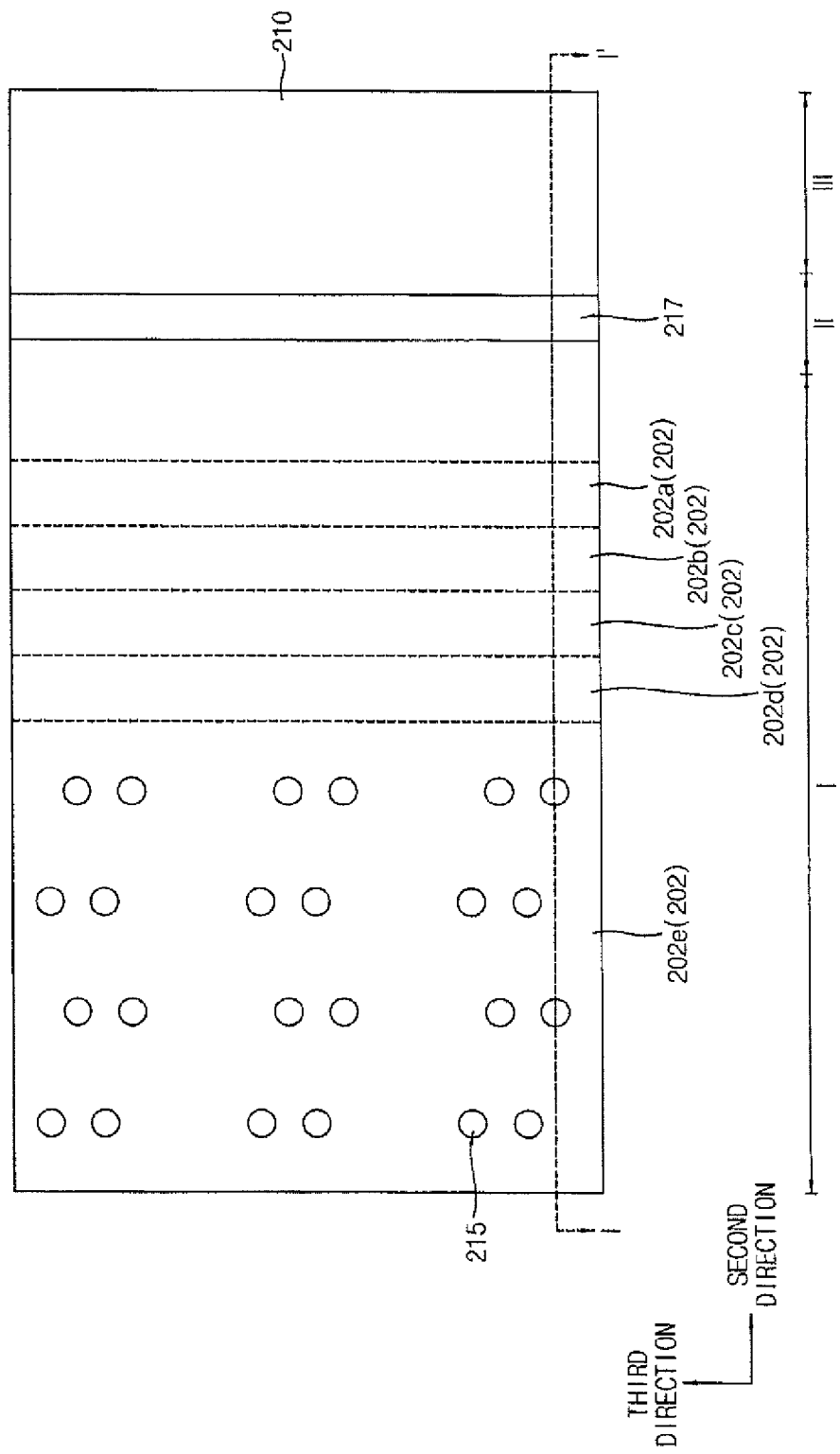

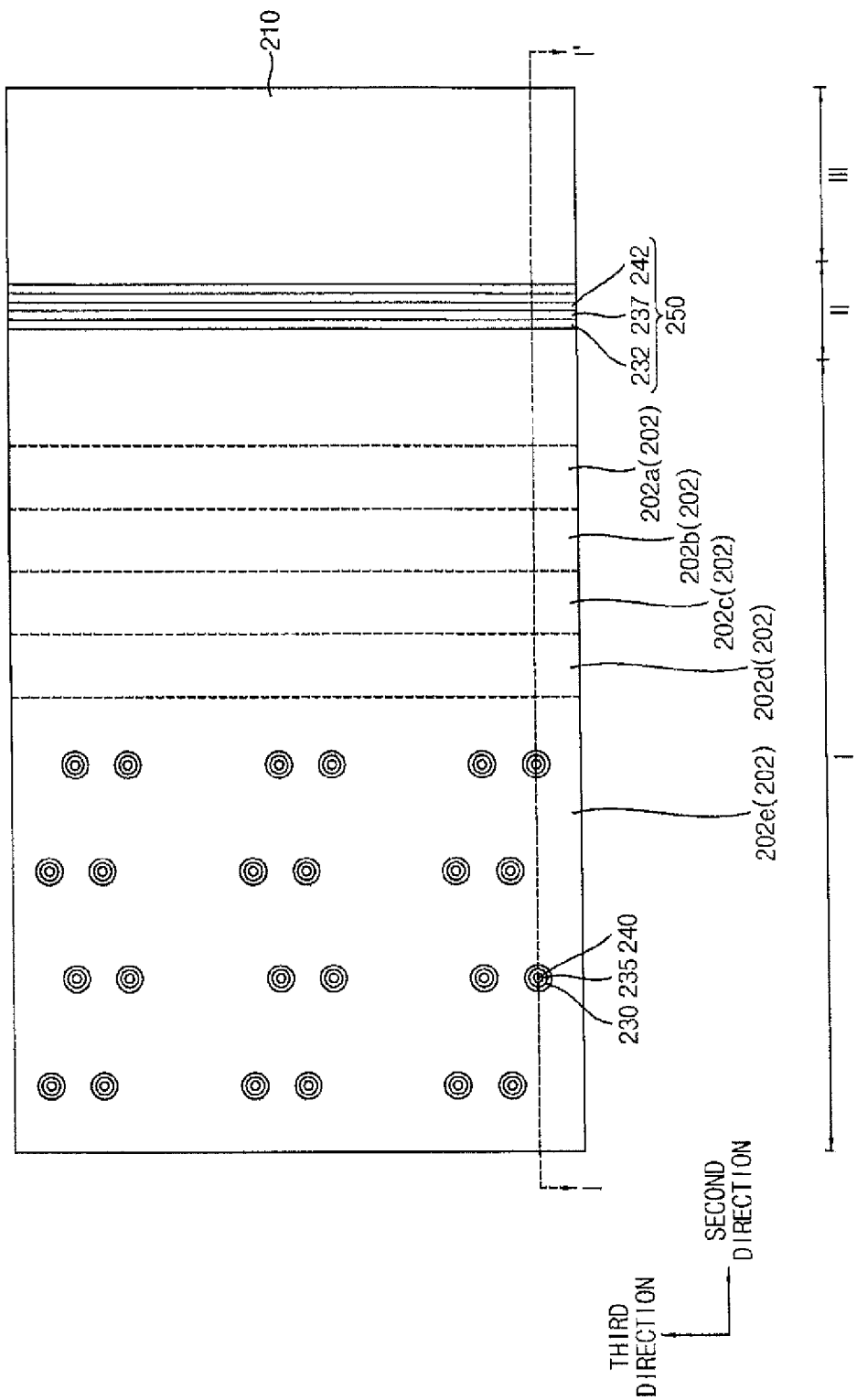

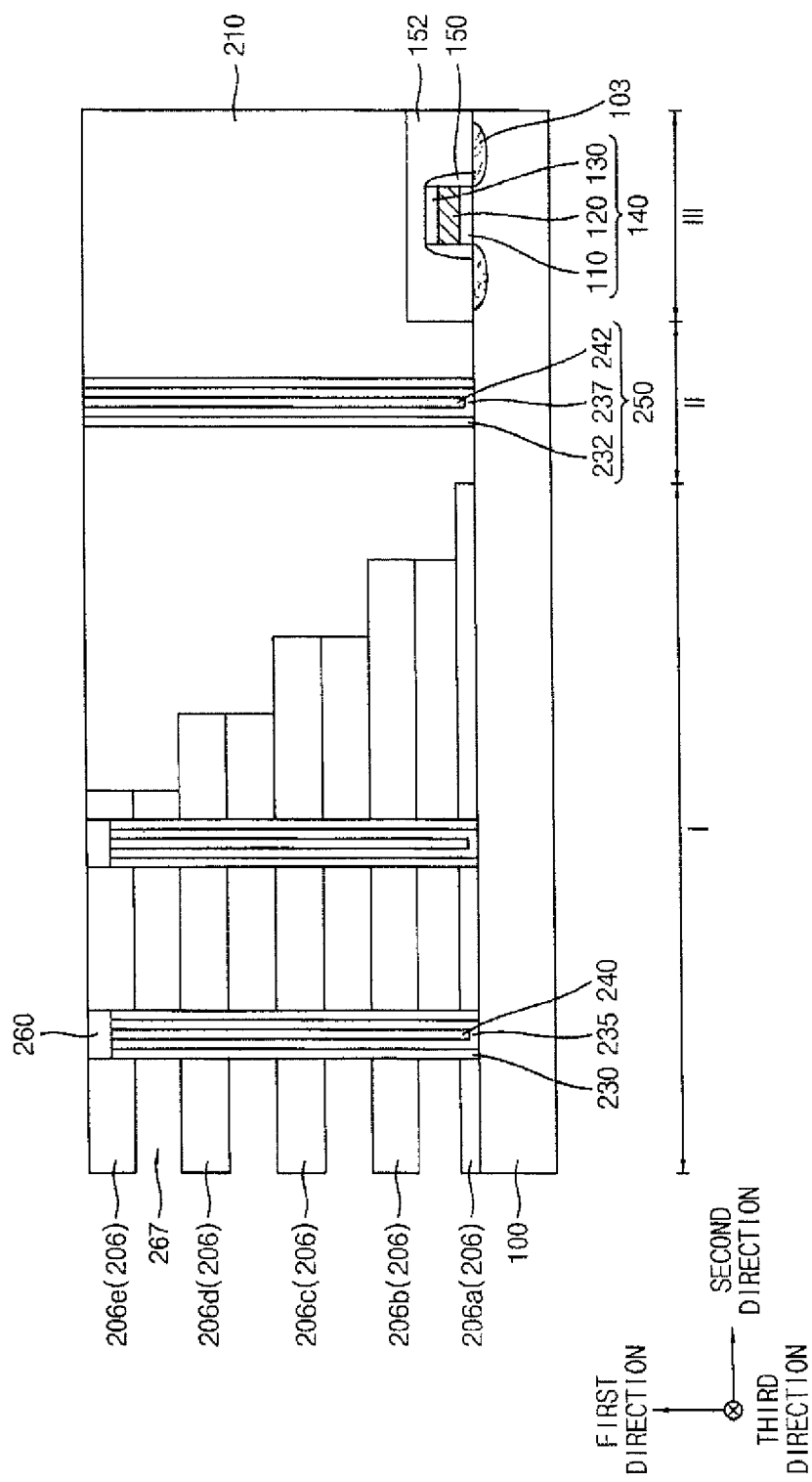

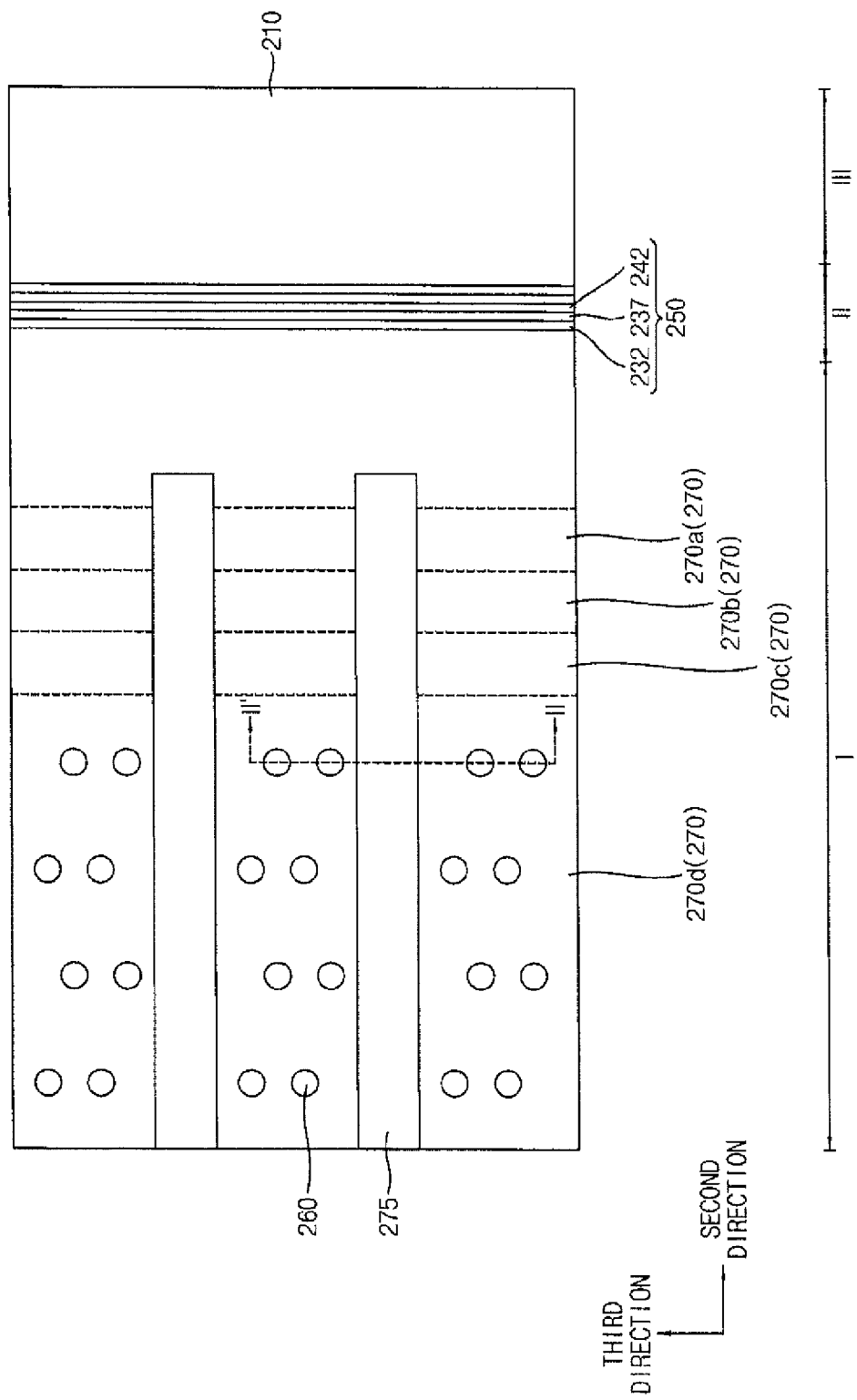

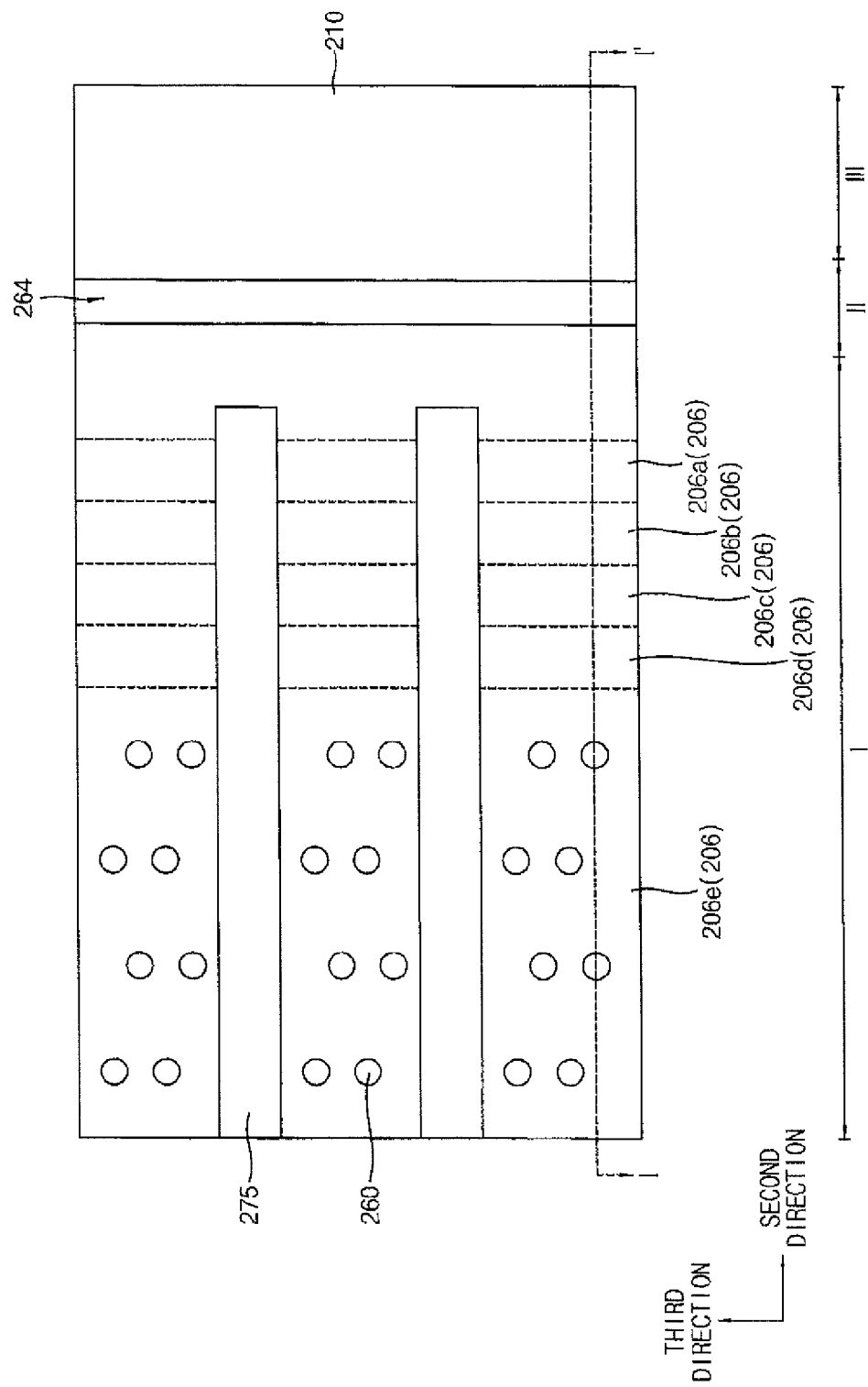

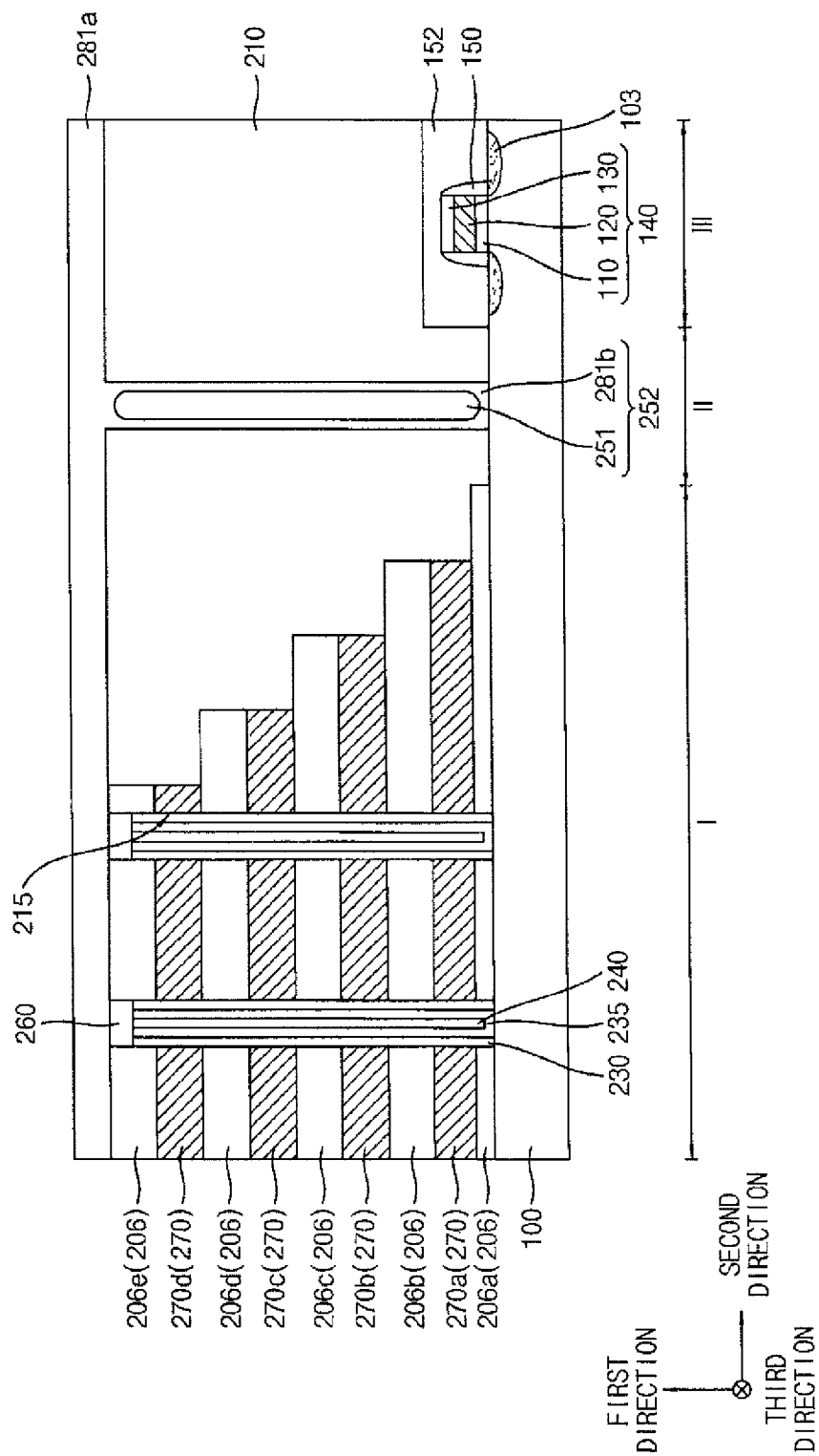

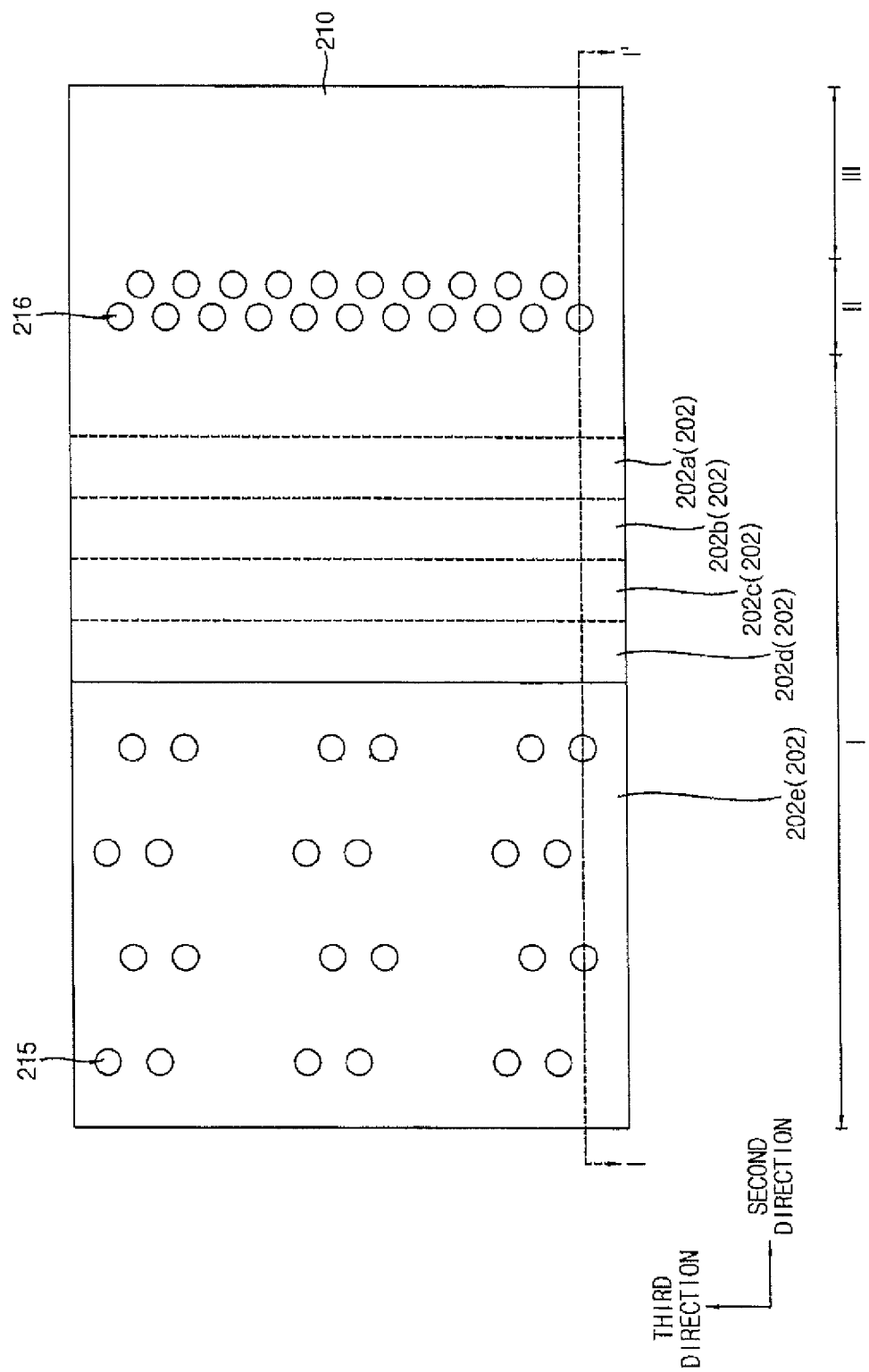

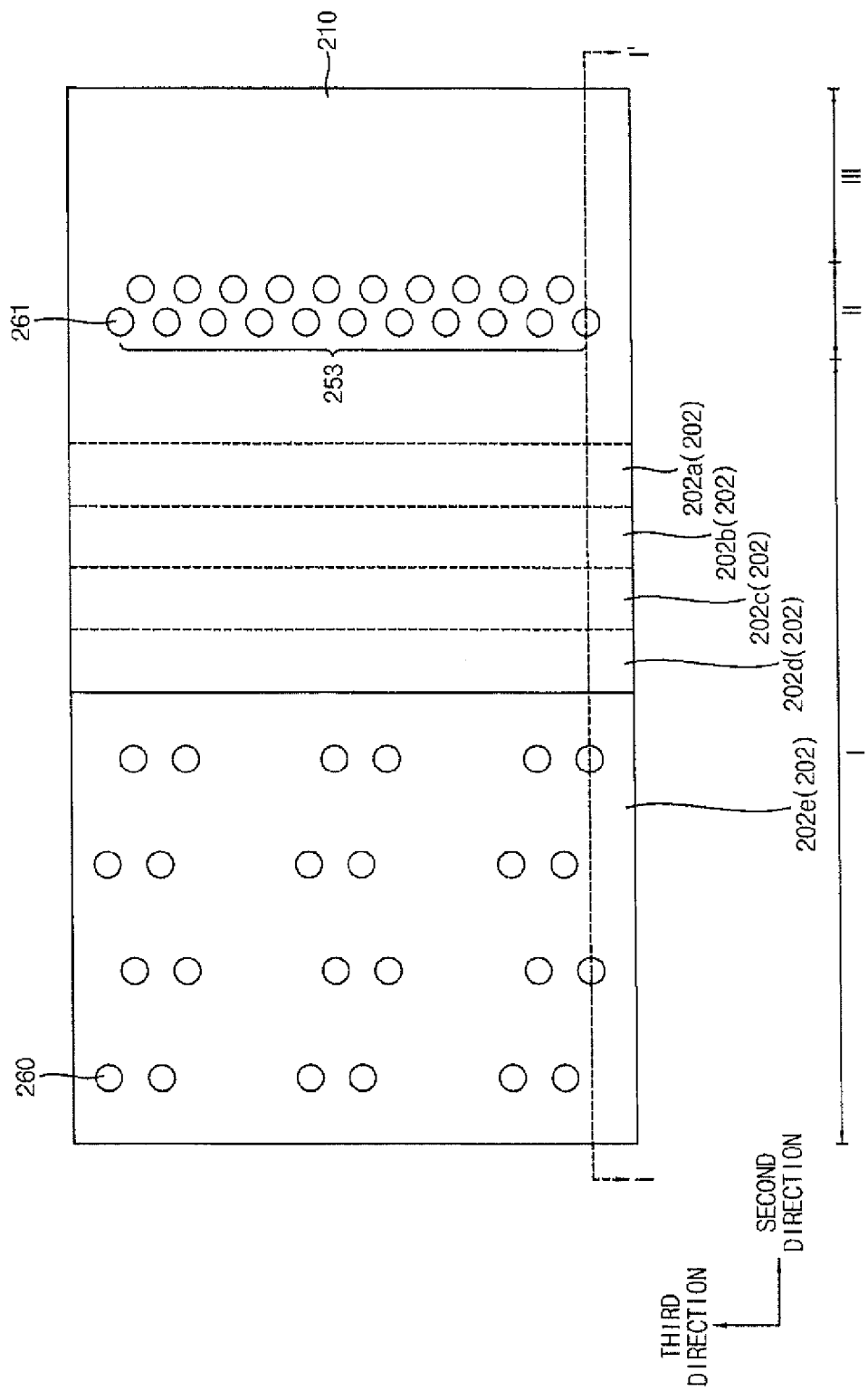

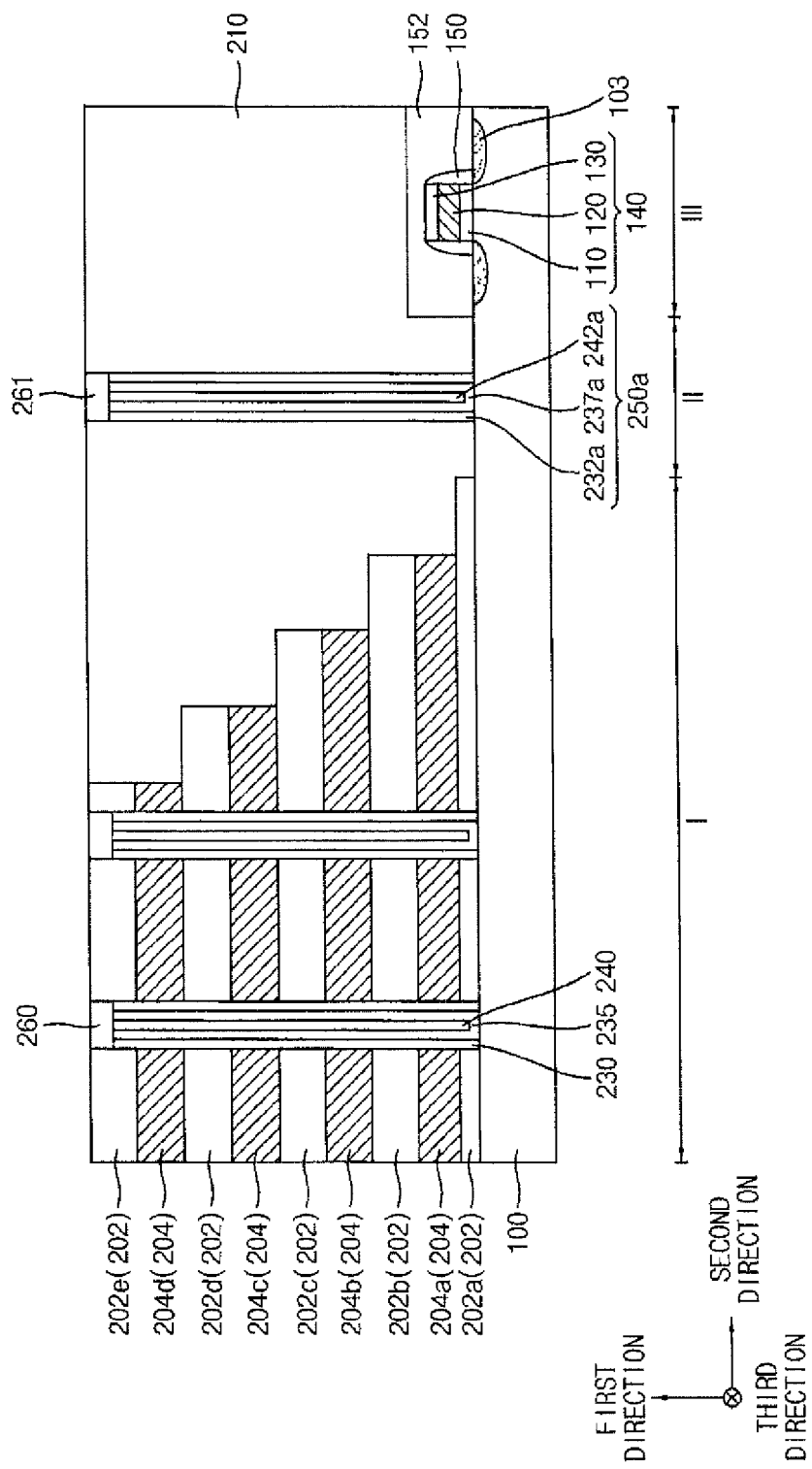

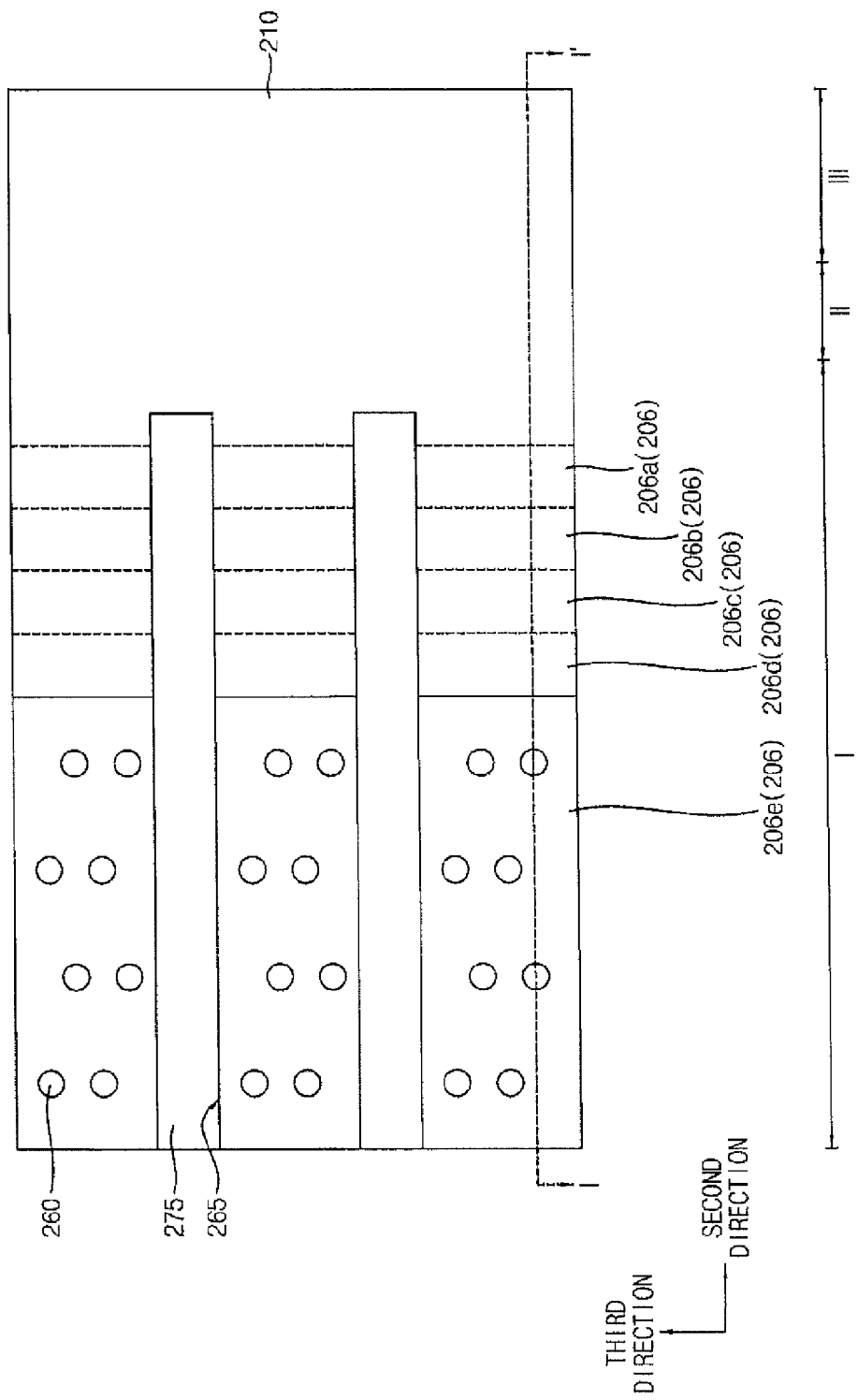

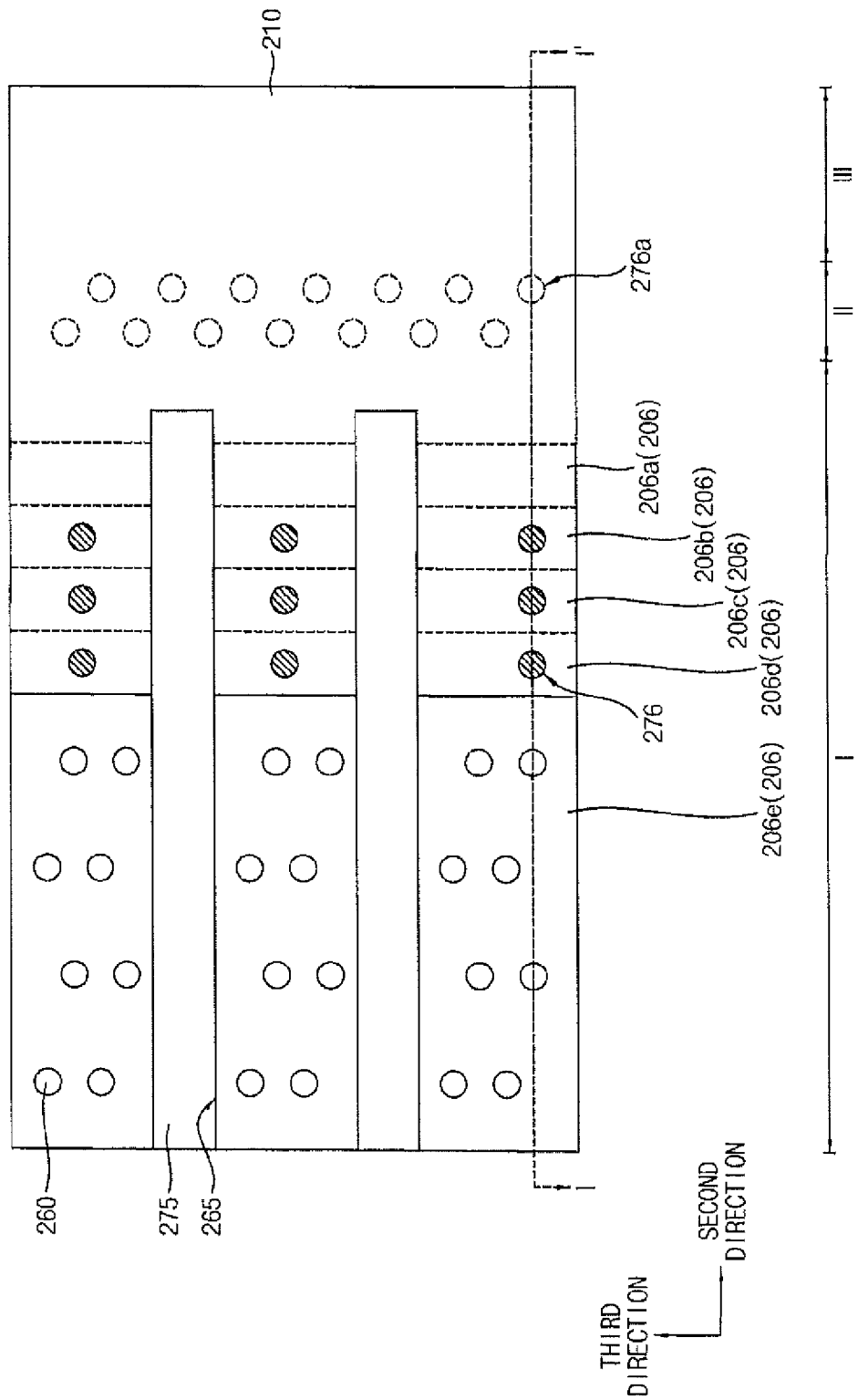

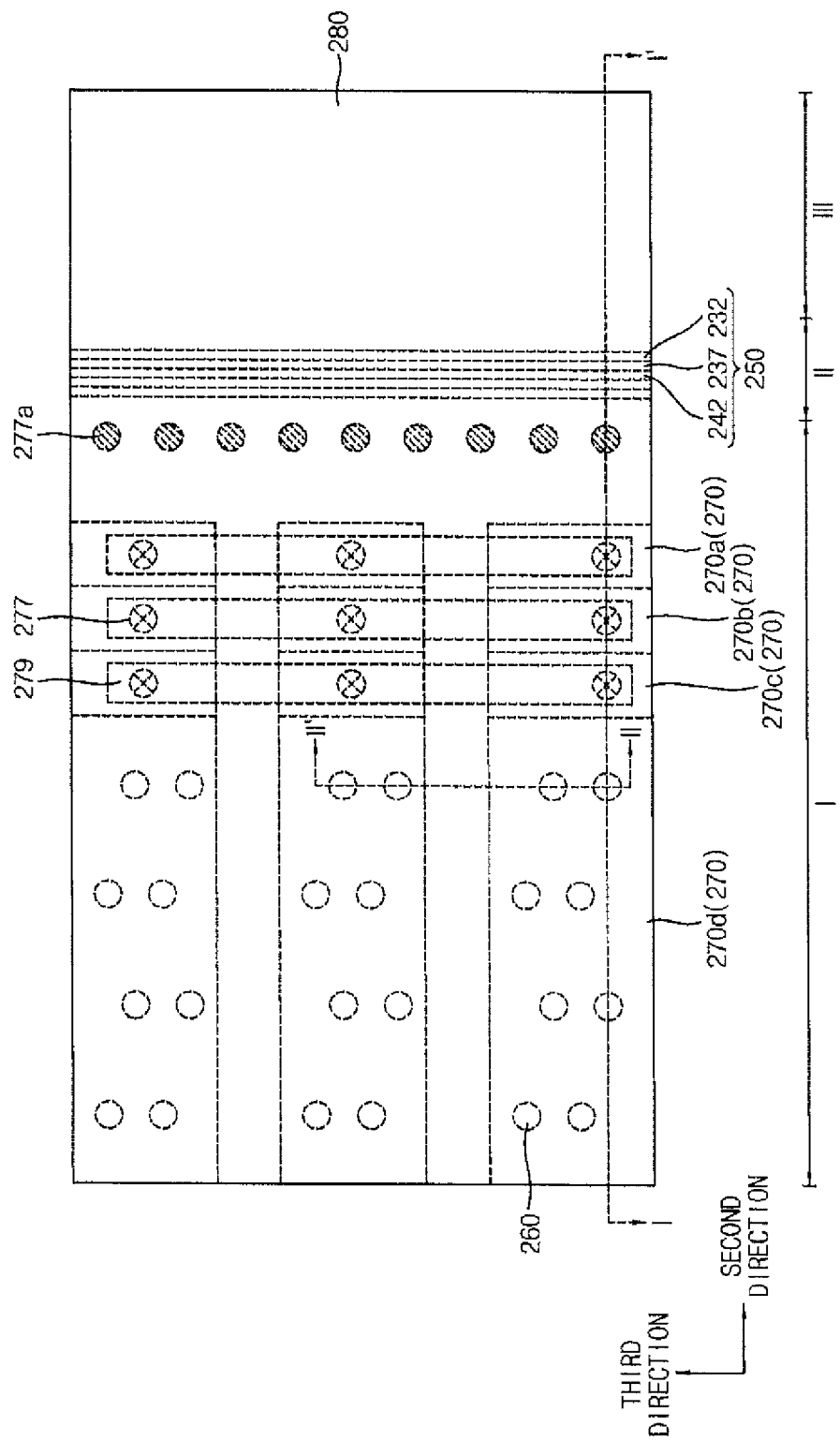

VERTICAL MEMORY DEVICES

CROSS-REFERENCE TO RELATED APPLICATION

This application claims priority under 35 USC §119 to Korean Patent Applications No. 10-2014-0045727, filed on Apr. 17, 2014 and No. 10-2015-0045950, filed on Apr. 1, 2015 in the Korean Intellectual Property Office (KIPO), the contents of which are incorporated by reference herein in their entirety.

BACKGROUND

1. Technical Field

Example embodiments relate to vertical memory devices. More particularly, example embodiments relate to non-volatile memory devices including vertical channels.

2. Description of the Related Art

Recently, a vertical memory device including a plurality of memory cells stacked repeatedly with respect to a surface of a substrate has been developed to realize a high degree of integration. In the vertical memory device, a channel having a pillar shape or a cylindrical shape may protrude vertically from the surface of the substrate, and gate lines and insulation layers surrounding the channel may be repeatedly stacked.

As the degree of integration of the vertical memory device becomes greater, the stacked number of the gate lines and the insulation layers may be increased. Thus, a stress may be caused due to stacking a plurality of layers and result in structural or electrical failures of the vertical memory device.

SUMMARY

Example embodiments provide a vertical memory device having improved structural stability and operational reliability.

According to example embodiments, there is provided a vertical memory device. The vertical memory device includes a substrate, a plurality of channels, a plurality of gate lines, and a blocking structure. The substrate includes a cell region and a peripheral circuit region. The channels are on the cell region. Each of the channels extends in a first direction vertical with respect to a top surface of the substrate. The gate lines are stacked in the first direction to be spaced apart from each other. Each of the gate lines surrounds outer sidewalls of the channels. The blocking structure is between the cell region and the peripheral circuit region. The peripheral circuit region may include a gate structure having a transistor. A height of the blocking structure can be greater than a height of the gate structure in the peripheral region.

In example embodiments, each of the gate lines may extend in a second direction parallel with respect to the top surface of the substrate. The blocking structure may extend in at least a third direction that is parallel with respect to the top surface of the substrate and crosses the second direction.

In example embodiments, the blocking structure may include a dummy channel including a material the same as that of the channel.

In example embodiments, the vertical memory device may further include a dielectric layer structure on each of the outer sidewalls of the channels. The blocking structure may include a dummy dielectric layer including a material the same as that of the dielectric layer structure.

In example embodiments, the blocking structure may include an air gap.

In example embodiments, the blocking structure may include at least one dummy channel column including a plurality of dummy channel structures.

In example embodiments, each of the dummy channel structures may include a dummy channel having a shape the same as that of the channel.

In example embodiments, the vertical memory device may further include contacts electrically connected to the gate lines on the cell region. The blocking structure may include at least one dummy contact column including a plurality of dummy contacts.

In example embodiments, the blocking structure may include a dummy conductive line.

In example embodiments, the vertical memory device may further include a common source line on the cell region. The common source line and the dummy conductive line may include the same conductive material.

In example embodiments, the blocking structure may be at least partially buried in the substrate.

In example embodiments, the vertical memory device may further include a gate structure on the peripheral circuit region. The gate structure may include a gate electrode buried in the substrate.

According to example embodiments, there is provided a vertical memory device. The vertical memory device includes a substrate, a plurality of channels, a plurality of gate lines, a common source line and a blocking structure. The substrate includes a cell region and a peripheral circuit region. The channels are on the cell region. Each of the channels extends in a first direction vertical with respect to a top surface of the substrate. The gate lines are stacked in the first direction to be spaced apart from each other. Each of the gate lines surrounds outer sidewalls of the channels. The common source line is on the cell region. The blocking structure is between the cell region and the peripheral circuit region and surrounds the cell region. The peripheral circuit region may include a gate structure having a transistor. A height of the blocking structure can be greater than a height of the gate structure in the peripheral region.

In example embodiments, the blocking structure may include a dummy channel including a material the same as that of the channel.

In example embodiments, the blocking structure may include at least one dummy channel column having a shape the same as that of the channels.

In example embodiments, the blocking structure may include a material the same as that of the common source line.

In example embodiments, the vertical memory device may further include a separation layer pattern formed on both sidewalls of the common source line facing each other. The blocking structure may include a dummy conductive line including a conductive material the same as that of the common source line, and a dummy separation layer pattern formed on both sidewalls of the dummy conductive line facing each other. The dummy separation layer pattern may include an insulation material the same as that of the separation layer pattern.

In example embodiments, the common source line may extend in a second direction parallel with respect to the top surface of the substrate. The blocking structure may extend in at least a third direction that is parallel with respect to the top surface of the substrate and crosses the second direction.

According to example embodiments, there is provided a vertical memory device. The vertical memory device includes a substrate, a gate line structure, a peripheral circuit and a blocking structure. The substrate includes a cell region, a blocking region and a peripheral circuit region. The gate line structure is on the cell region. The gate line structure includes a plurality of insulating interlayer patterns and a plurality of gate lines alternately stacked in a first direction vertical with respect to a top surface of the substrate, and a plurality of channels extending through the plurality of insulating interlayer patterns and the plurality of gate lines. The peripheral circuit is on the peripheral circuit region. The blocking structure is on the blocking region. The blocking structure defines a boundary between the gate line structure and the peripheral circuit. The peripheral circuit region may include a gate structure having a transistor. A height of the blocking structure can be greater than a height of the gate structure in the peripheral region.

In example embodiments, the gate line structure may extend in a second direction parallel with respect to the top surface of the substrate. A plurality of the gate line structures may be arranged in a third direction that is parallel with respect to the top surface of the substrate and crosses the second direction.

In example embodiments, the blocking structure may extend in at least the third direction.

BRIEF DESCRIPTION OF THE DRAWINGS

Example embodiments will be more clearly understood from the following detailed description taken in conjunction with the accompanying drawings. FIGS. 1 to 45 represent non-limiting, example embodiments as described herein.

FIG. 1 is a top plan view illustrating a vertical memory device in accordance with example embodiments;

FIGS. 2 and 3 are cross-sectional views taken along lines I-I' and II-IF of FIG. 1, respectively;

FIGS. 4 to 17B are top plan views and cross-sectional views illustrating a method of manufacturing a vertical memory device in accordance with example embodiments;

FIG. 18 is a cross-sectional view illustrating a vertical memory device in accordance with example embodiments;

FIGS. 19 to 24 are top plan views and cross-sectional views illustrating a method of manufacturing a vertical memory device in accordance with example embodiments;

FIGS. 25 and 26 are a top plan view and a cross-sectional view, respectively, illustrating a vertical memory device in accordance with example embodiments;

FIGS. 27 to 29B are top plan views and cross-sectional views illustrating a method of manufacturing a vertical memory device in accordance with example embodiments;

FIGS. 30 to 32 are a top plan view and cross-sectional views illustrating a vertical memory device in accordance with example embodiments;

FIGS. 33 to 36C are top plan views and cross-sectional views illustrating a method of manufacturing a vertical memory device in accordance with example embodiments;

FIGS. 37 and 38 are a top plan view and a cross-sectional view, respectively, illustrating a vertical memory device in accordance with example embodiments;

FIGS. 39 and 40 are a top plan view and a cross-sectional view, respectively, illustrating a vertical memory device in accordance with example embodiments;

FIGS. 42 to 44 are cross-sectional views illustrating vertical memory devices in accordance with example embodiments;

FIGS. 49A and 49B are a top plan view and a cross-sectional view, respectively, illustrating a vertical memory device in accordance with example embodiments;

DESCRIPTION OF EMBODIMENTS

Figure 1:
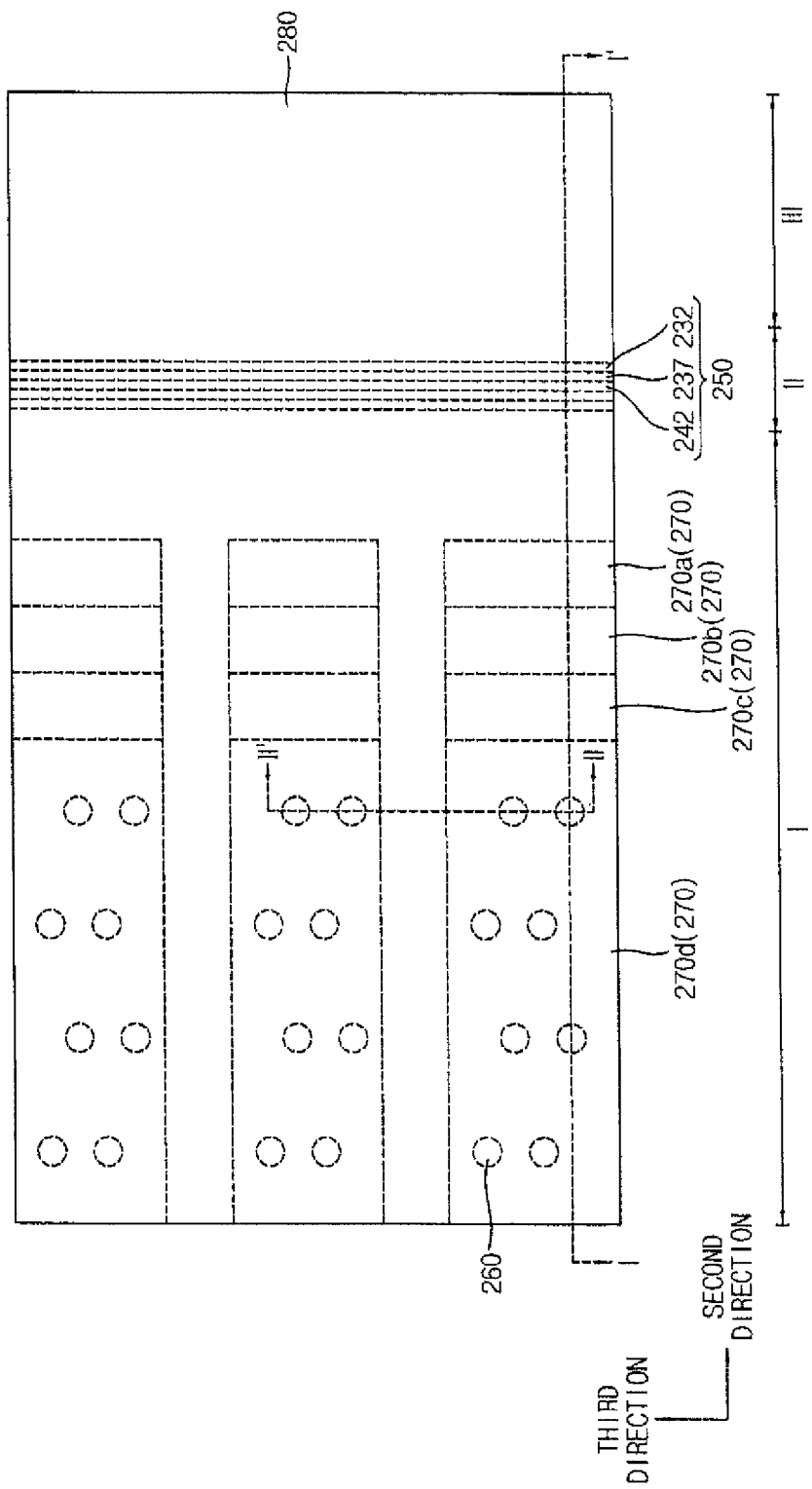

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
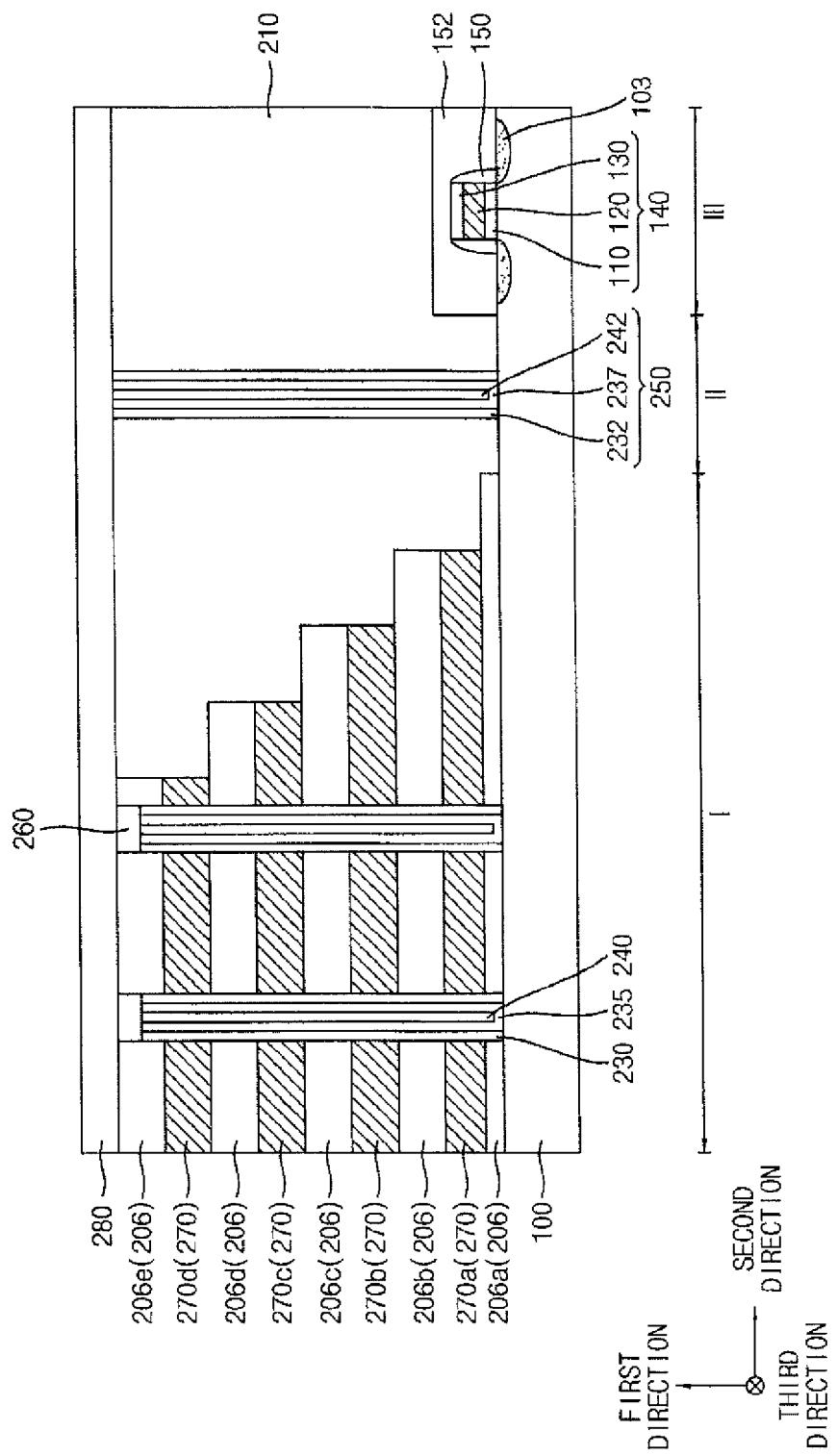
Figure 3:
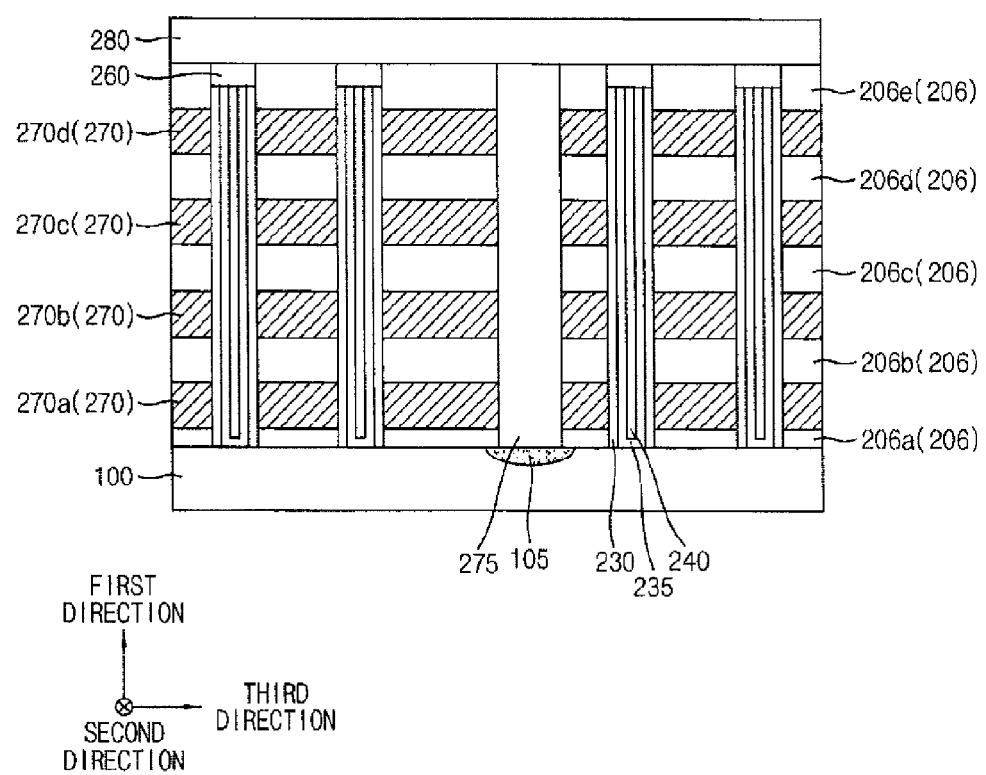

FIG. 1 is a cross-sectional view illustrating a vertical memory device in accordance with example embodiments. FIGS. 2 and 3 are cross-sectional views taken along lines I-I' and II-II' of FIG. 1, respectively In FIGS. 1 to 3, a direction substantially vertical to a top surface of a substrate is referred to as a first direction, and two directions substantially parallel to the top surface of the substrate and substantially crossing each other are referred to as a second direction and a third direction. For example, the second direction and the third direction are substantially perpendicular to each other. Additionally, a direction indicated by an arrow and a reverse direction thereof are considered as the same direction. The above mentioned definitions of the directions are the same throughout all the figures in this specification.

Referring to FIGS. 1 to 3, the vertical memory device may include a plurality of vertical channel structures protruding in the first direction from a top surface of the substrate 100. The vertical channel structure may include a channel 235, a dielectric layer structure 230 surrounding an outer sidewall of the channel 235, and a first filling layer 40 formed in the channel 235. The vertical memory device may include gate lines 270 spaced apart from each other along the first direction. Each of the gate lines 270 may be disposed on an outer sidewall of the dielectric layer structure 230 and may extend in the second direction. The vertical memory device may include a pad 260 disposed on the channel 235 and the dielectric layer structure 230. The pad 260 may be in contact with the channel 235 and the dielectric layer structure 230.

The substrate 100 may include a semiconductor material, e.g., silicon and/or germanium. For example, the substrate 100 may serve as a p-type well of the vertical memory device.

In example embodiments, the substrate 100 may include a cell region I and a peripheral circuit region III. The substrate 100 may further include a blocking region II between the cell region I and the peripheral circuit region III.

The channel 235 may be disposed on the cell region I of the substrate 100 and may contact the top surface of the substrate 100. The channel 235 may have a hollow cylindrical shape or a cup shape. The channel 235 may include polysilicon or single crystalline silicon, and may further include p-type impurities such as boron (B).

The first filling layer pattern 240 may fill an inner space of the channel 235, and may have a solid cylindrical shape or a pillar shape. The first filling layer pattern 240 may include an insulation material such as silicon oxide. In an embodiment, the channel 235 may have a pillar shape or a solid cylindrical shape, and the first filling layer pattern 240 may be omitted.

The dielectric layer structure 230 may be formed on the outer sidewall of the channel 230. The dielectric layer structure 230 may have a straw shape or a cup shape of which a central bottom is opened.

The dielectric layer structure 230 may include a tunnel insulation layer, a charge storage layer and a blocking layer which may be sequentially stacked from the outer sidewall of the channel 235. The blocking layer may include silicon oxide or a metal oxide such as hafnium oxide or aluminum oxide. The charge storage layer may include a nitride such as silicon nitride or a metal oxide, and the tunnel insulation layer pattern may include an oxide such as silicon oxide. For example, the dielectric layer structure 230 may have an oxide-nitride-oxide (ONO) layer structure.

In an embodiment, a semiconductor pattern (not illustrated) may be further disposed between the top surface of the substrate 100 and a bottom of the channel 235. In this case, the channel 235 may be disposed on a top surface of the semiconductor pattern, and the dielectric layer structure 230 may be disposed on a peripheral portion of the top surface of the semiconductor pattern. The semiconductor pattern may include, e.g., a single crystalline silicon or polysilicon.

The pad 260 may be formed on the dielectric layer structure 230, the channel 235 and the first filling layer pattern 240. For example, upper portions of the dielectric layer structure 230, the channel 235 and the first filling layer pattern 240 may be capped by the pad 260. The pad 260 may include polysilicon or single crystalline silicon, and may be optionally doped with n-type impurities such as phosphorus (P) or arsenic (As).

As illustrated in FIG. 1, a plurality of the pads 260 may be arranged in the second direction to form a pad row, and a plurality of the pad rows may be arranged in the third direction. A plurality of the dielectric layer structures 230, the channels 235 and the first filling layer patterns 240 may be formed in the second direction to form a channel row comparable to the pad row, and a plurality of the channel rows may be arranged in the third direction.

The gate lines 270 may be disposed on the cell region I of the substrate 100. The gate lines 270 may be formed on the outer sidewall of the dielectric layer structure 230 and may be spaced apart from each other along the first direction. In example embodiments, each of the gate line 270 may partially surround the channels 235 included in the plurality of the channel rows and may extend in the second direction.

As illustrated in FIG. 1, each of the gate line 270 may surround the channel rows corresponding to 4 pad rows. In this case, a gate line structure may be defined by 4 channel rows and the gate lines 270 surrounding 4 channel rows.

The gate line 270 may include a metal having a low electrical resistance or a nitride thereof. For example, the gate line 270 may include tungsten (W), tungsten nitride, titanium (Ti), titanium nitride, tantalum (Ta), tantalum nitride, platinum (Pt), or the like. In an embodiment, the gate line 270 may have a multi-layered structure including a barrier layer formed of a metal nitride and a metal layer.

For example, a lowermost gate line 270a may serve as a ground selection line (GSL). An uppermost gate line 270d may serve as a string selection lines (SSL). Gate lines 270b, and 270c between the GSL and the SSL may serve as word lines.

In this case, the GSL, the word lines, and the SSL may be formed at a single level, 2 levels and a single level, respectively. However, the number of levels at which the GSL, the word line and the SSL are formed are not specifically limited. In some embodiments, the word lines may be formed at 4 levels, 8 levels or at least 16 levels (e.g., "2×n" levels, n is an integer equal to or more than 8). The stacked number of the gate lines 270 may be determined in consideration of a circuit design and a degree of integration of the vertical memory device.

In the case that the semiconductor pattern is formed between the channel 235 and the substrate 100, the GSL 270a may surround an outer sidewall of the semiconductor pattern. A gate insulation layer (not illustrated) may be further formed between the GSL 270a and the outer sidewall of the semiconductor pattern.

As illustrated in FIGS. 1 and 2, widths or length of the gate lines 270 in the second direction may be reduced along the first direction from the top surface of the substrate 100. In example embodiments, a plurality of the gate lines 270 may be stacked in a pyramidal shape or a stepped shape. Accordingly, a stepped stack structure may be formed by the gate lines and insulating interlayer patterns 206.

The insulating interlayer patterns 206 (e.g., 206a through 206e) may be disposed between the gate lines 270 neighboring in the first direction. The insulating interlayer patterns 206 may include a silicon oxide-based material, e.g., silicon dioxide ($SiO_2$), silicon oxycarbide (SiOC) or silicon oxyfluoride (SiOF). The gate lines 270 included in one gate line structure may be insulated from each other by the insulating interlayer patterns 206. In example embodiments, the insulating interlayer patterns 206 may be stacked along the first direction in a pyramidal shape or a stepped shape substantially the same as or similar to that of the gate lines 270.

As illustrated in FIG. 3, a separation layer pattern 275 may be formed between the gate line structures neighboring in the third direction. For example, a plurality of the separation layer patterns 275 may be arranged in the third direction such that the gate lines 270 and the insulating interlayer patterns 206 may be separated from each other. The gate line structure may be confined by the separation layer patterns 275 and may extend in the second direction. The separation layer pattern 270 may extend in the second direction and may serve as a gate line cut pattern. The separation layer pattern 270 may include an insulation material such as silicon oxide.

As illustrated in FIG. 3, a second impurity region 105 may be formed at an upper portion of the substrate 100 adjacent to the separation layer pattern 275. The second impurity region 105 may extend in the second direction, and may serve as a common source line (CSL) of the vertical memory device. The second impurity region 105 may include n-type impurities such as P or As. A metal silicide pattern (not illustrated) such as a cobalt silicide pattern or a nickel silicide pattern may be further formed on the second impurity region 105.

A mold protection layer 210 may be formed throughout the cell region I, the blocking region II and the peripheral circuit region III, and may cover a lateral portion of the stepped stack structure. The mold protection layer 210 may include an insulation material such as silicon oxide.

An upper insulation layer 280 may be formed on an uppermost insulating interlayer pattern 206e, the pad 260, the separation layer pattern 275 and the mold protection layer 210. The upper insulation layer 280 may include an insulation material such as silicon oxide.

In example embodiments, the pads 260 may be protected by the upper insulation layer 280. A wiring structure including, e.g., a bit line may be disposed on the upper insulation layer 280.

A peripheral circuit of the vertical memory device may be disposed on the peripheral circuit region III of the substrate 100. The peripheral circuit may include, e.g., a transistor. The peripheral circuit may be covered by a peripheral circuit protection layer 152.

For example, a gate structure 140 including a gate insulation layer pattern 110, a gate electrode 120 and a gate mask 130 may be disposed on the peripheral circuit region III of the substrate 100. A first impurity region 103 may be formed at an upper portion of the substrate 100 adjacent to the gate structure 140. The transistor may be defined by the gate structure 140 and the first impurity region 103. The first impurity region 103 may serve as a source/drain region of the transistor. In an embodiment, a gate spacer 140 may be further formed on a sidewall of the gate structure 140.

The peripheral circuit protection layer 152 may be formed on the peripheral circuit region III of the substrate 100 to cover the gate structure 140, the gate spacer 150 and the first impurity region 103. Thus, the peripheral circuit may be protected by the peripheral circuit protection layer 152.

A blocking structure 250 may be disposed on the blocking region II of the substrate 100. In example embodiments, the blocking structure 250 may extend through the mold protection layer 210 in the first direction. The blocking structure 250 may have a dam shape or a fence shape extending at least in the third direction. In example embodiments, the blocking structure 250 may surround the cell region I continuously in the second and third directions. For example, the blocking structure 250 may have the fence shape continuously surrounding the cell region I.

In example embodiments, the blocking structure 250 may have a stacked structure including a dummy dielectric layer 232, a dummy channel 237 and a second filling layer pattern 242. The dummy dielectric layer 232, the dummy channel 237 and the second filling layer pattern 242 may include materials substantially the same as those of the dielectric layer structure 230, the channel 235 and the first filling layer pattern 240, respectively, on the cell region I.

In example embodiments, the blocking structure 250 may prevent thermal and/or mechanical stress from being transferred from the cell region I to the peripheral circuit region III.

For example, a deposition process may be performed at a high temperature for a formation of the dielectric layer structure 230, the channel 235, etc., on the cell region I. Thus, a thermal stress may be generated from the deposition process. Additionally, a plurality of the gate lines 270 and the insulating interlayer patterns 206 may be repeatedly stacked on the cell region I, thereby to generate a mechanical stress. When the thermal and/or the mechanical stresses are excessively accumulated on the cell region I, the stresses may be transferred or propagated to the peripheral circuit region III to cause a failure of the peripheral circuit. For example, a crack, a chemical modification and/or a dislocation of an active region of the peripheral circuit region III and the gate structure 140 may be caused. Thus, operational and electrical malfunctions may occur in the peripheral circuit to deteriorate a reliability of the vertical memory device.

However, according to example embodiments, the blocking structure 250 may be interposed between the cell region I and the peripheral circuit region III so that a transfer and/or a diffusion of the thermal and mechanical stresses may be avoided. Therefore, a structural stability and an operational reliability on the peripheral circuit region III may be improved.

FIGS. 4 to 17B are top plan views and cross-sectional views illustrating a method of manufacturing a vertical memory device in accordance with example embodiments. For example, FIGS. 4 to 17B illustrate a method of manufacturing the vertical memory device of FIGS. 1 to 3.

Specifically, FIGS. 7A, 11A, 14A and 17A are top plan views illustrating the method of manufacturing the vertical memory device. FIGS. 4 to 6, 7B, 8 to 10, 11B, 12, 13, 15A and 16A are cross-sectional views taken along lines I-I' indicated in FIGS. 7A and 11A in the first direction. FIGS. 14B, 15B, 16B and 17B are cross-sectional views taken along lines II-IF indicated in FIGS. 14A and 17A in the first direction.

Figure 4:
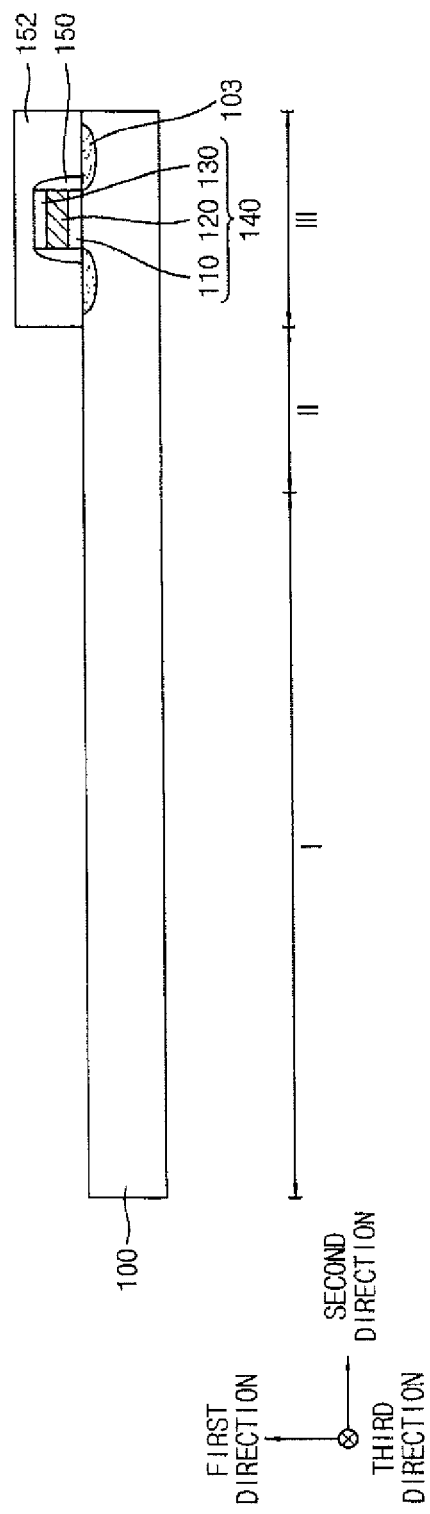

Referring to FIG. 4, a gate structure 140 and a first impurity region 103 may be formed on a substrate 100.

A semiconductor substrate including, e.g., single crystalline silicon or single crystalline germanium may be used as the substrate 100. The substrate 100 may be divided into a cell region I, a blocking region II and a peripheral circuit region III. The gate structure 140 and the first impurity region 103.

For example, a gate insulation layer, a gate electrode layer and a gate mask layer may be sequentially formed on the substrate 100. The gate mask layer may be partially etched to form a gate mask 130. The gate electrode layer and the gate insulation layer may be partially etched using the gate mask 130 as an etching mask to form a gate electrode 120 and a gate insulation layer pattern 110. Accordingly, the gate structure 140 including the gate insulation layer pattern 110, the gate electrode 120 and the gate mask 130 sequentially stacked on the substrate 100 may be obtained.

The gate insulation layer may be formed using silicon oxide or a metal oxide. The gate electrode layer may be formed using a metal, a metal nitride or doped polysilicon. The gate mask layer may be formed using silicon nitride. The gate insulation layer, the gate electrode layer and the gate mask layer may be formed by at least one of a chemical vapor deposition (CVD) process, a plasma enhanced chemical vapor deposition (PECVD) process, a high density plasma chemical vapor deposition (HDP-CVD) process, an atomic layer deposition (ALD) process or a sputtering process. In an embodiment, the gate insulation layer may be formed by performing a thermal oxidation process on a top surface of the substrate 100.

An ion-implantation process may be performed using the gate structure 140 as an implantation mask to form the first impurity region 103 at an upper portion of the substrate 100 in the peripheral circuit region III adjacent to the gate structure 140. A transistor may be defined on the peripheral circuit region III by the gate structure 140 and the first impurity region 103

In an embodiment, a spacer layer covering the gate structure 140 may be formed on the substrate 100. The spacer layer may be anisotropically etched to form a gate spacer 150 on a sidewall of the gate structure 140.

A peripheral circuit protection layer 152 covering the transistor may be further formed. For example, a protection layer covering the first impurity region 103, the gate structure 140 and the gate spacer 150 may be formed on the substrate 100. A portion of the protection layer formed on the cell region I and the blocking region II may be removed to form the peripheral circuit protection layer 152. The protection layer may be formed as an oxide layer.

Figure 5:
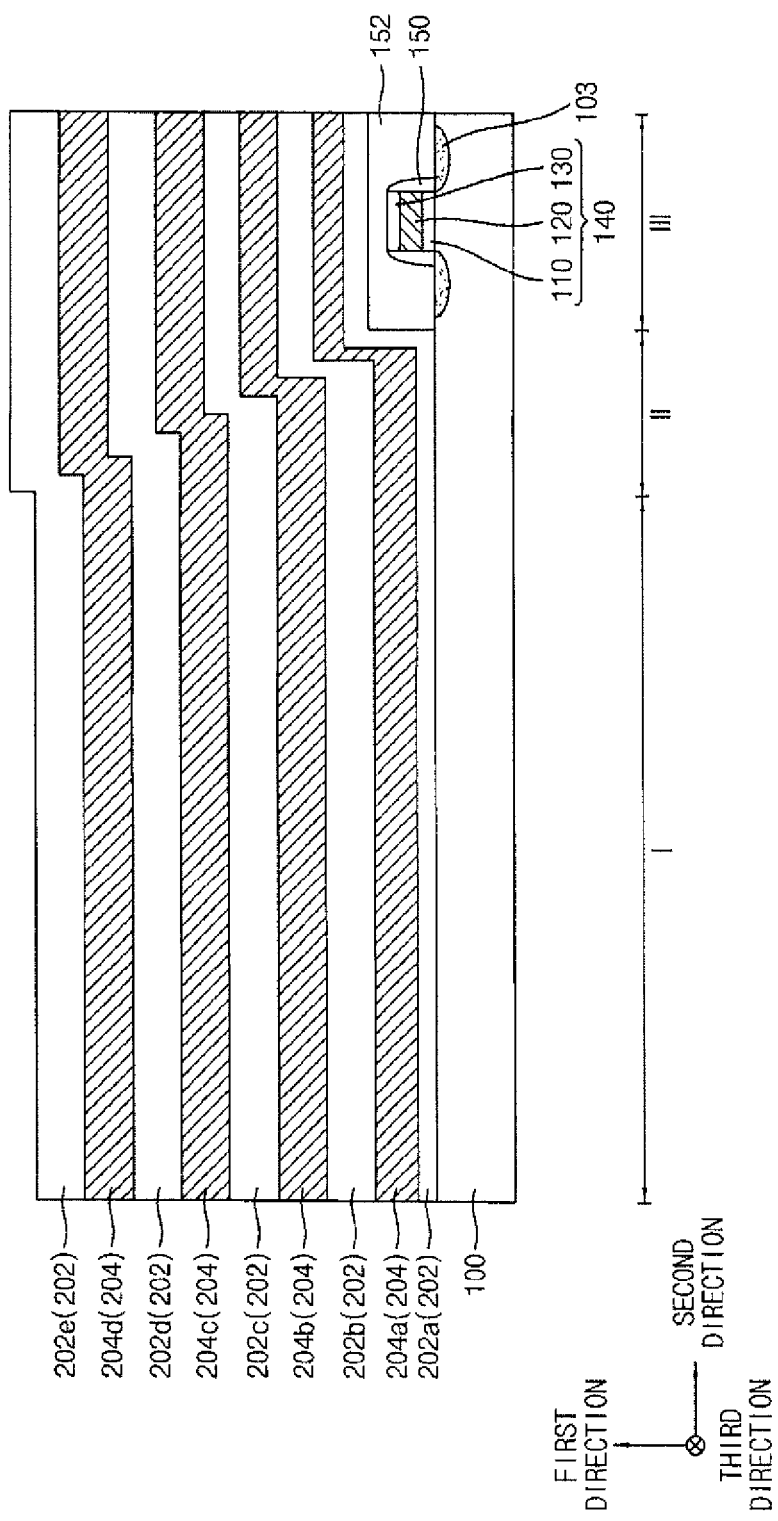

Referring to FIG. 5, an insulating interlayer 202 and a sacrificial layer 204 may be alternately and repeatedly formed on the substrate 100 to form a mold structure. For example, a plurality of the insulating interlayers 202 (e.g., 202a through 202e) and a plurality of the sacrificial layers 204 (e.g., 204a through 204d) may be alternately formed on each other at a plurality of levels.

In example embodiments, the insulating interlayer 202 may be formed using an oxide based material, e.g., silicon dioxide, silicon oxycarbide and/or silicon oxyfluoride. The sacrificial layer 204 may be formed using a material that may have an etching selectivity with respect to the insulating interlayer 202 and may be easily removed by a wet etching process. For example, the sacrificial layer 204 may be formed using a nitride based material, e.g., silicon nitride and/or silicon boronitride.

The insulating interlayer 202 and the sacrificial layer 204 may be formed by a CVD process, a PECVD process, a spin coating process, etc. A lowermost insulating interlayer 202a may be formed by a thermal oxidation process on the top surface of the substrate 100. In this case, a lowermost insulating interlayer 202a may have a thin thickness relatively to other insulating interlayers 202b through 202e.

The sacrificial layers 204 may be removed in a subsequent process to provide spaces for a GSL, a word line and an SSL. Thus, the number of the insulating interlayers 202 and the sacrificial layers 204 may be adjusted in consideration of the number of the GSL, the word line and the SSL. In example embodiments, each of the GSL and the SSL may be formed at a single level, and the word line may be formed at 2 levels. Accordingly, the sacrificial layers 204 may be formed at 4 levels, and the insulating interlayers 202 may be formed at 5 levels as illustrated in FIG. 5. However, the number of the GSL, the SSL and the word line may not be limited to the examples provided herein. For example, each of the GSL and the SSL may be formed at 2 levels, and the word line may be formed at 4, 8 or 16 levels. In this case, the sacrificial layers 204 may be formed at 8, 12 or 20 levels, and the insulating interlayers 202 may be formed at 9, 13 or 21 levels. The word line may be formed at equal to or more than 16 levels, e.g., at "2×n" levels. Here, n is an integer equal to or more than 8.

Figure 6:
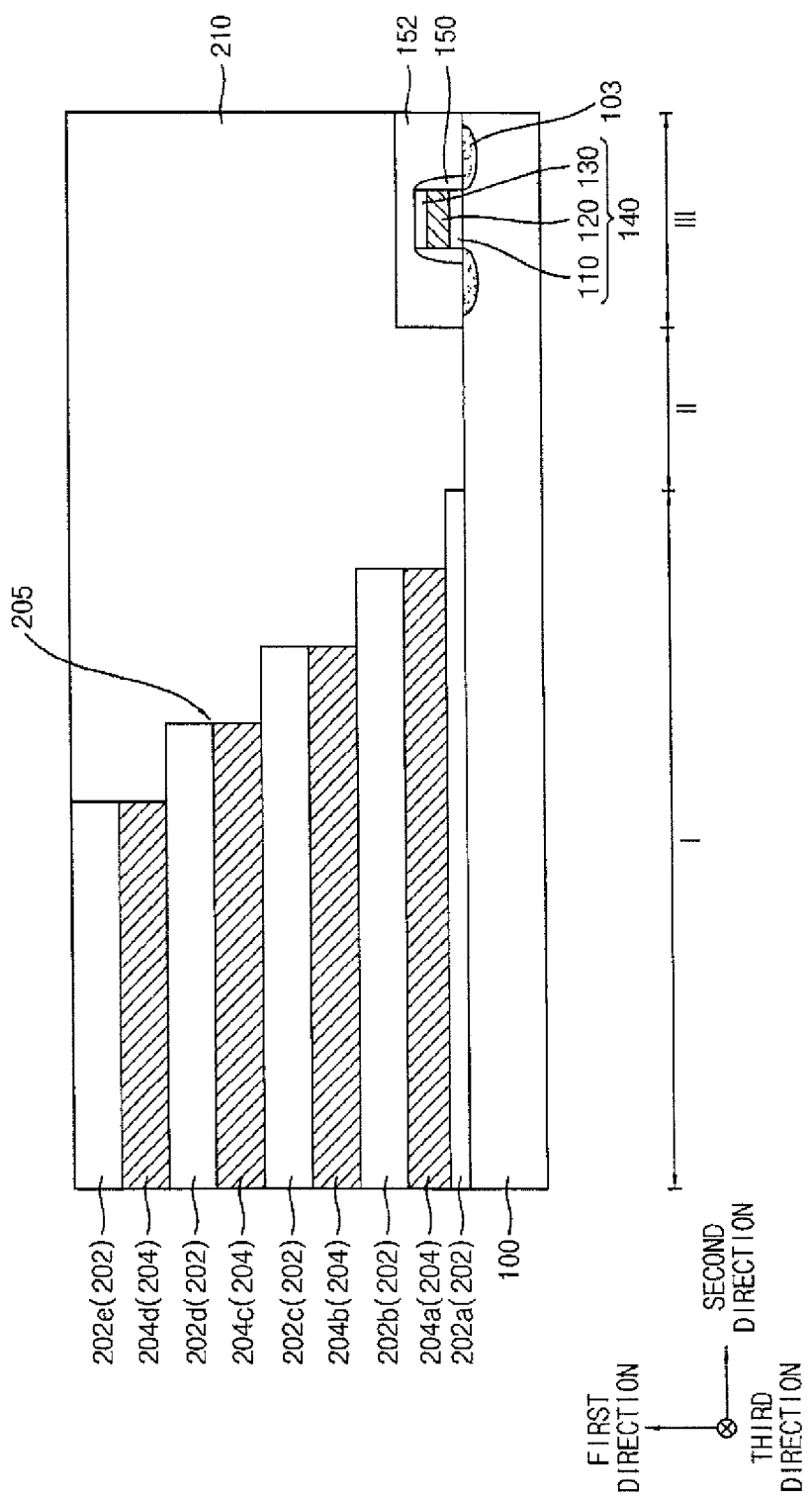

Referring to FIG. 6, the insulating interlayers 202 and the sacrificial layers 204 may be partially etched to form a stepped mold structure 205.

In example embodiments, a photoresist pattern (not illustrated) partially covering an uppermost insulating interlayer 202e may be formed. Both ends of the insulating interlayers 202 (e.g., 202e, 202d, 202c and 202b) and the sacrificial layers 204 (e.g., 204d, 204c, 204b, and 204a) may be etched using the photoresist pattern as an etching mask. Both ends of the photoresist pattern may then be removed so that a width of the photoresist pattern may be reduced. Next, both ends of the insulating interlayers 202e, 202d and 202c, and the sacrificial layers 204d, 204c and 204b may be etched using the photoresist pattern as the etching mask again. Etching processes may be repeated in a similar manner as described above to obtain the stepped mold structure 205 illustrated in FIG. 6.

In example embodiments, portions of the insulating interlayer 202 and the sacrificial layer 204 formed on the blocking region II and the peripheral circuit region III may be substantially removed. The transistor formed on the peripheral circuit region III may be protected during the etching processes for the formation of the stepped mold structure 205 by the peripheral circuit protection layer 152.

In an embodiment, a portion of the lowermost insulating interlayer 202a formed on the blocking region II may not be etched to remain on the blocking region II.

After the formation of the stepped mold structure 205, a mold protection layer 210 covering lateral portions or steps of the stepped mold structure 205 may be formed. For example, an insulation layer covering the stepped mold structure 205 may be formed on the substrate 100 using, e.g., silicon oxide by a CVD process or a spin coating process. An upper portion of the insulation layer may be planarized until the uppermost insulating interlayer 202e is exposed to form the mold protection layer 210. The planarization process may include a chemical mechanical polish (CMP) process and/or an etch-back process.

In an embodiment, the mold protection layer 210 may include a material substantially the same as or similar to that of the insulating interlayer 202. In this case, the mold protection layer 210 may be substantially merged or integral with the insulating interlayers 202.

Figure 7B:
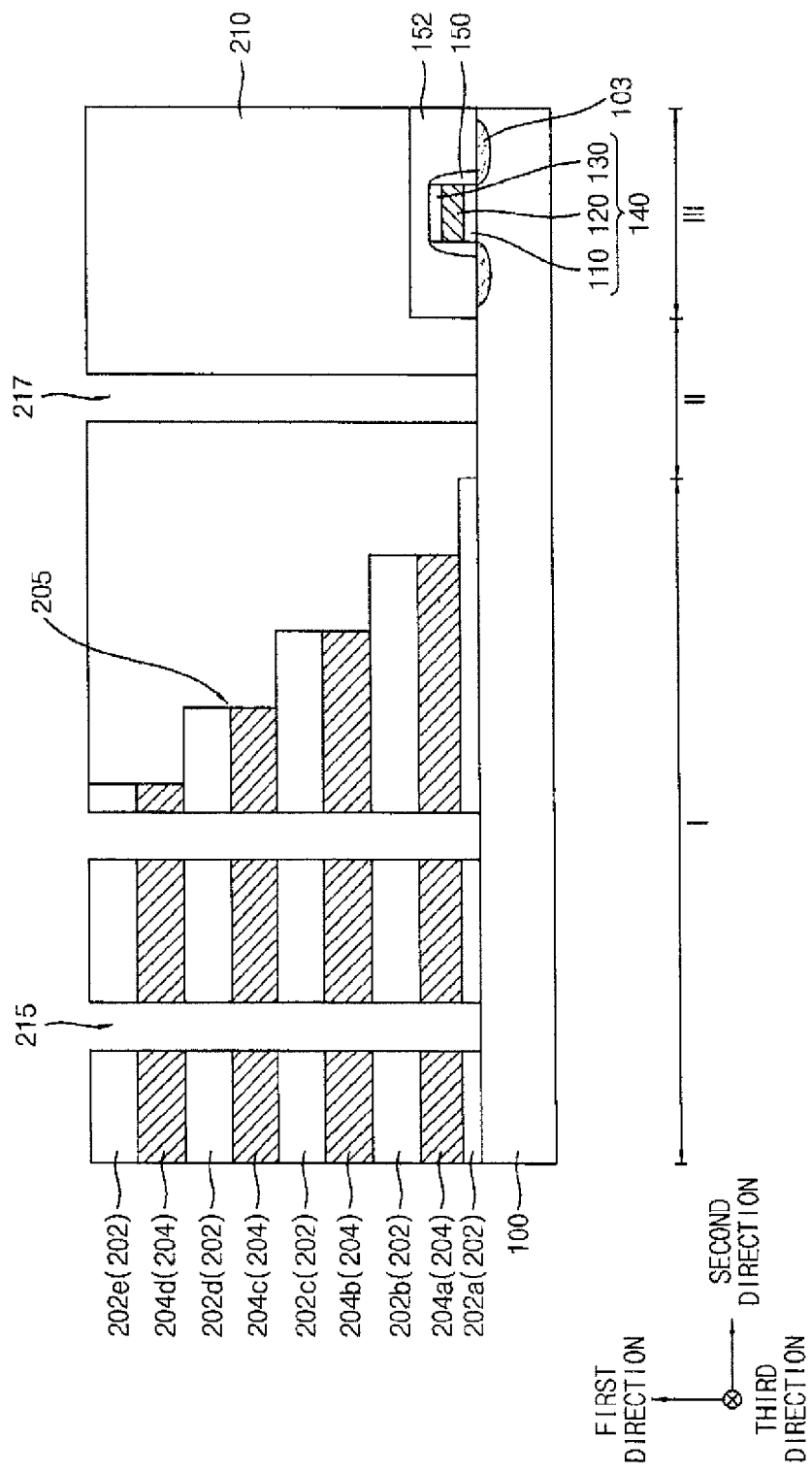

Referring to FIGS. 7A and 7B, a plurality of channel holes 215 may be formed through the stepped mold structure 205, and a first opening 217 may be formed through the mold protection layer 210.

In example embodiments, a hard mask (not illustrated) may be formed on an uppermost insulating interlayer 202e and the mold protection layer 210. The insulating interlayers 202 and the sacrificial layers 204 of the stepped mold structure 205 may be partially etched by performing, e.g., a dry etching process. The hard mask may be used as an etching mask to form the channel hole 215. A top surface of the substrate 100 may be partially exposed by the channel hole 215. The channel hole 215 may extend in the first direction from the top surface of the substrate 100. The hard mask may be formed of silicon-based or carbon-based spin-on hardmask (SOH) materials, and/or a photoresist material.

As illustrated in FIG. 7A, a plurality of the channel holes 215 may be formed in the second direction to form a channel hole row. A plurality of the channel hole rows may be formed in the third direction.

The channel hole rows may be formed in a zigzag arrangement along the third direction. In example embodiments, the channel holes 215 may be formed on the cell region I of the substrate 100.

The first opening 217 may be formed on the blocking region II defined between the cell region I and the peripheral circuit region III. In example embodiments, the first opening 217 may be formed by the dry etching process simultaneously with the channel holes 215.

The first opening 217, as illustrated in FIG. 7B, may extend through the mold protection layer 210 in the first direction. The top surface of the substrate 100 may be exposed through the first opening 217. As illustrated in FIG. 7A, the first opening 217 may have a trench shape or a ditch shape extending in the third direction. In some embodiments, the first opening 217 may extend in the second and third directions to surround the cell region I. For example, the first opening 217 may be formed as a fence shape continuously surrounding the cell region I.

After the formation of the channel hole 215 and the first opening 217, the hard mask may be removed by an ashing process and/or a strip process.

Figure 8:
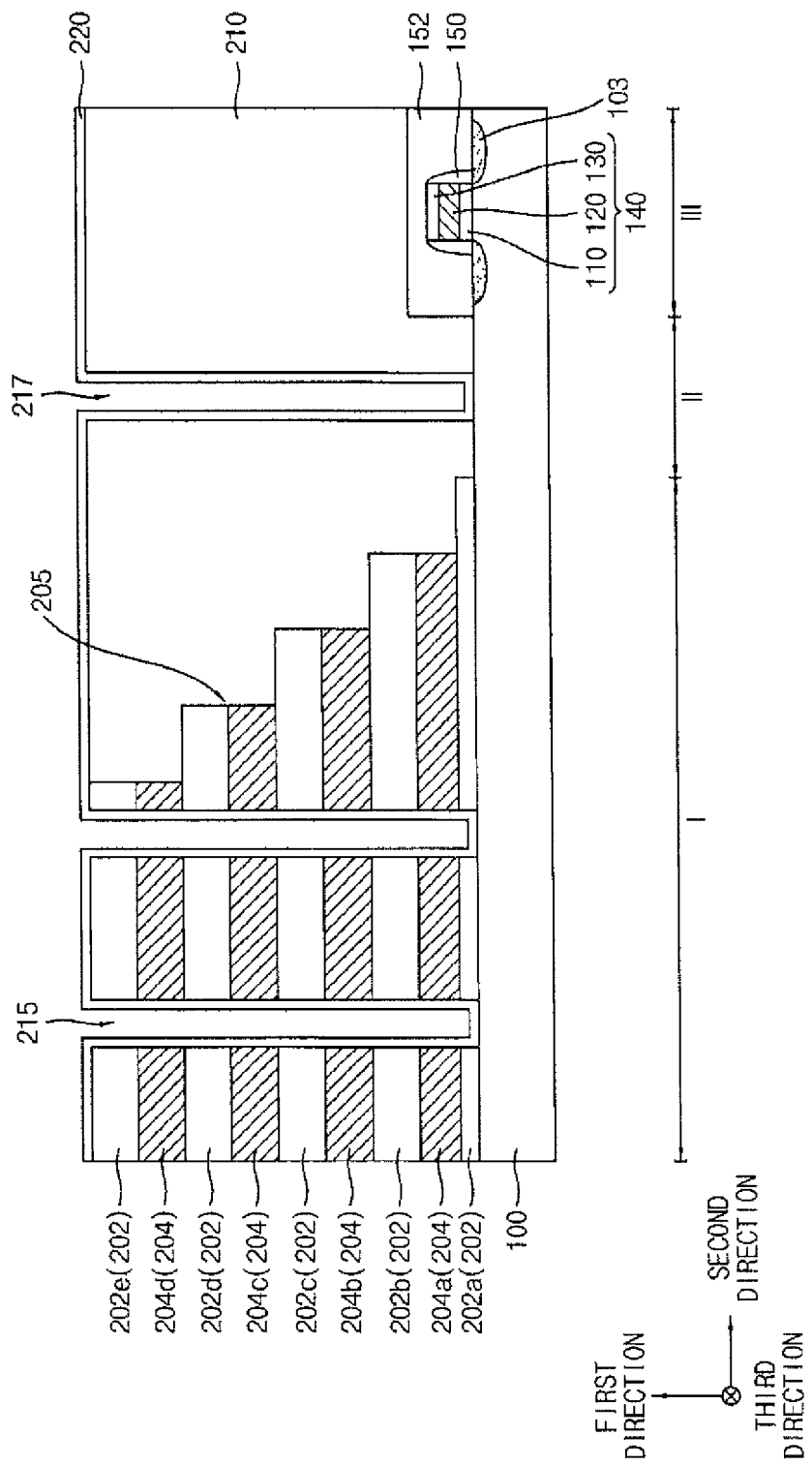

Referring to FIG. 8, a dielectric layer 220 may be formed on sidewalls and bottoms of the channel holes 215 and the first opening 217, and on the uppermost insulating interlayer 202e and the mold protection layer 210.

In example embodiments, a blocking layer, a charge storage layer and a tunnel insulation layer may be sequentially formed to obtain the dielectric layer 220. For example, the blocking layer may be formed using an oxide, e.g., silicon oxide, the charge storage layer may be formed using silicon nitride or a metal oxide, and the tunnel insulation layer may be formed using an oxide, e.g., silicon oxide. In example embodiments, the dielectric layer 220 may be formed as an oxide-nitride-oxide (ONO) layer structure. The blocking layer, the charge storage layer and the tunnel insulation layer may be formed by a CVD process, a PECVD process, an ALD process, etc.

Figure 9:
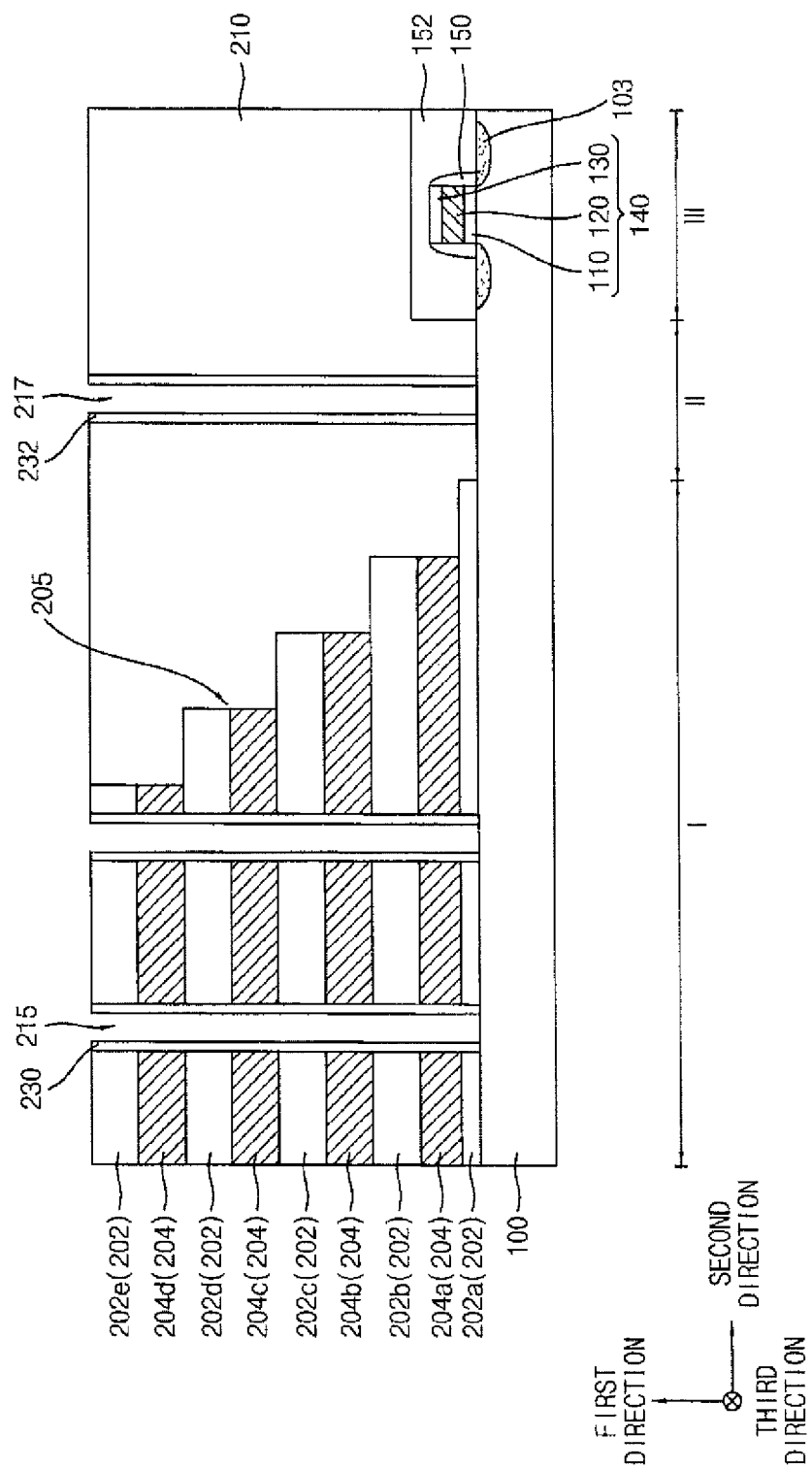

Referring to FIG. 9, a portion of the dielectric layer 220 formed on the bottom of the channel hole 215 may be removed by, e.g., an etch-back process to expose the top surface of the substrate 100. Portions of the dielectric layer 220 formed on the uppermost insulating interlayer 202e and the mold protection layer 210 may be substantially removed by the etch-back process. Accordingly, a dielectric layer structure 230 may be formed on the sidewall of the channel hole 215. The dielectric layer structure 230 may have a hollow cylindrical shape of which a central bottom is removed or a straw shape in the channel hole 215.

A portion of the dielectric layer 225 formed on the bottom of the first opening 217 may be also removed by the etch-back process. Accordingly, a dummy dielectric layer 232 may be formed on the sidewall of the first opening 217.

Figure 10:
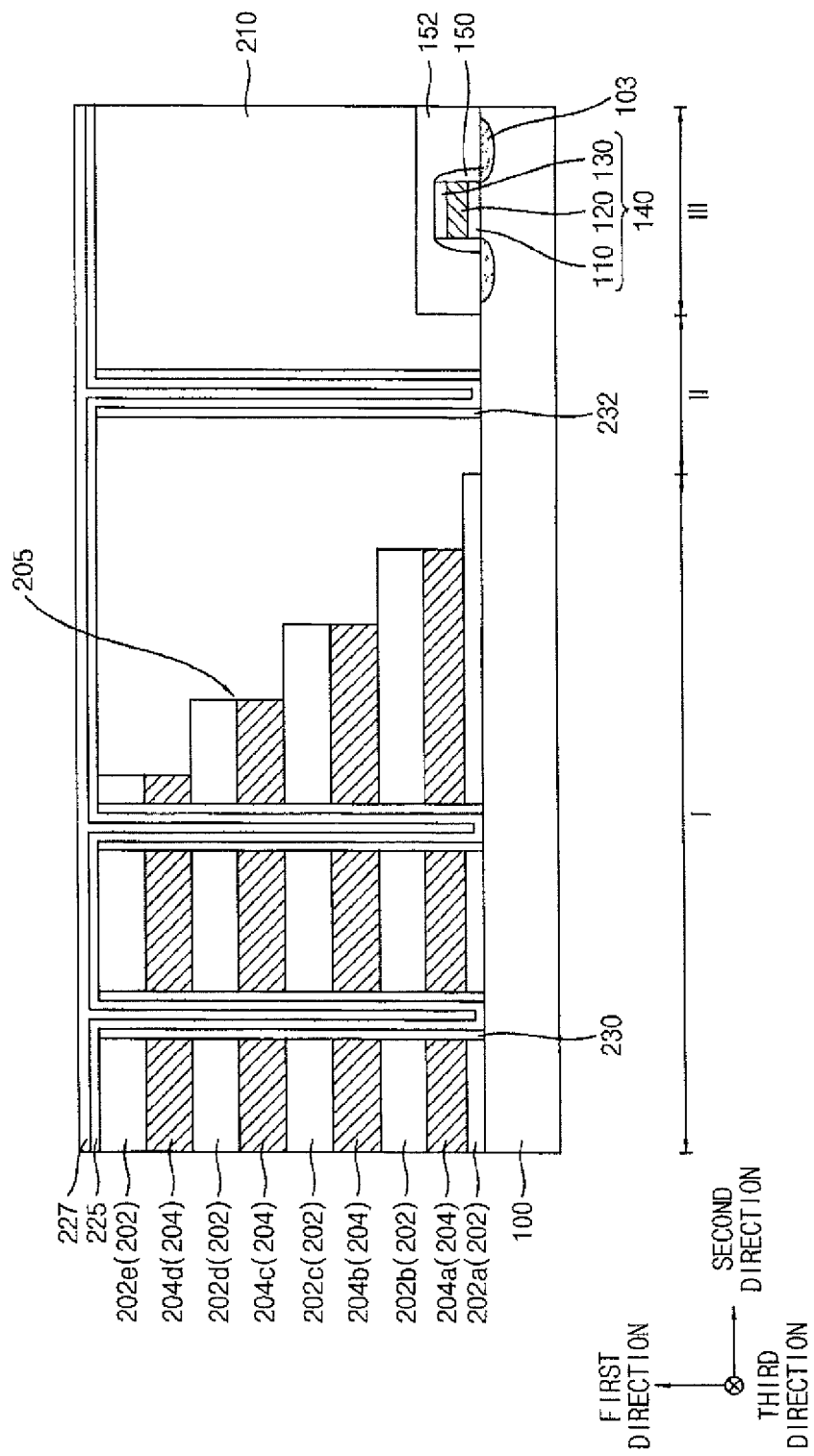

Referring to FIG. 10, a channel layer 225 may be formed on the uppermost insulating interlayer 202e, the dielectric layer structure 230, and the top surface of the substrate 100 exposed through the channel hole 215 and the first opening 217, and then a first filling layer 227 may be formed on the channel layer 225 to sufficiently fill remaining portions of the channel hole 215 and the first opening 217. The channel layer 225 may be formed using polysilicon or amorphous silicon which is optionally doped with impurities. In an embodiment, a heat treatment or a laser beam irradiation may be further performed on the channel layer 225. In this case, the channel layer 225 may include single crystalline silicon and defects in the channel layer 225 may be cured so that properties of a channel 235 (see FIGS. 11A and 11B) may be improved. The first filling layer 227 may be formed using an insulation material, e.g., silicon oxide or silicon nitride.

Figure 11B:
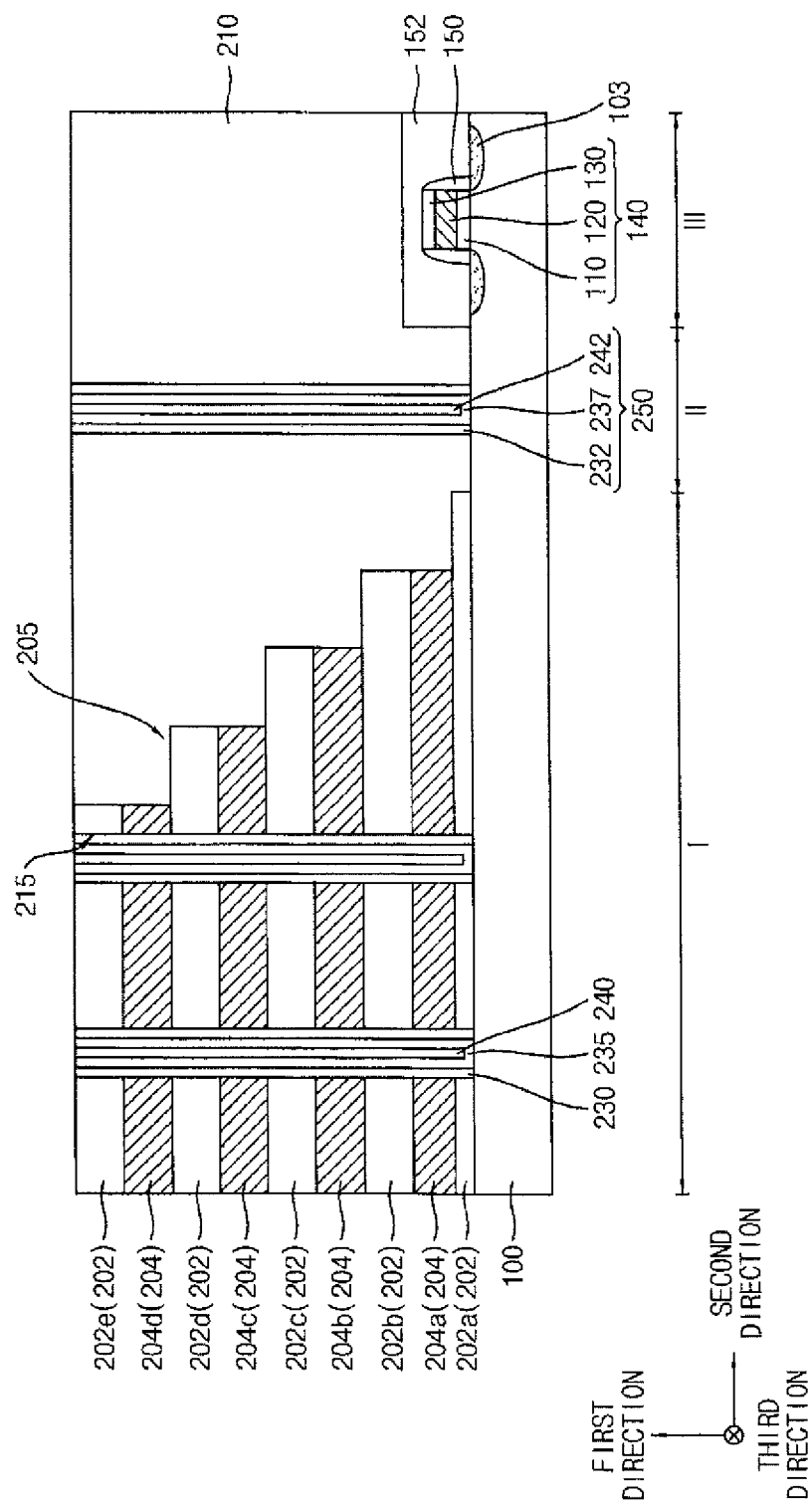

The channel layer 225 and the first filling layer 227 may be formed by a CVD process, a PECVD process, an ALD process, a PVD process, a spine coating process, etc Referring to FIGS. 11A and 11B, upper portions of the first filling layer 227 and the channel layer 225 may be planarized by, e.g., a CMP process until the uppermost insulating interlayer 202e is exposed. Accordingly, the dielectric layer structure 230, the channel 235 and a first filling layer pattern 240 sequentially stacked on the sidewall of the channel hole 215 may be formed to fill the channel hole 215. A channel row including a plurality of the channels 235 may be formed according to the channel hole row.

In the first opening 217, the dummy dielectric layer 232, a dummy channel 237 and a second filling layer pattern 242 may be formed sequentially from the sidewall of the first opening 217. Accordingly, a blocking structure 250 including the dummy dielectric layer 232, the dummy channel 237 and the second filling layer pattern 242 may be formed in the first opening 217.

The channel 235 may have a cup shape, and the first filling layer pattern 240 may have a solid cylindrical shape or a pillar shape. The dielectric layer structure 230 may include the tunnel insulation layer, the charge storage layer, the blocking layer sequentially stacked from an outer sidewall of the channel 235.

The blocking structure 250 may have a dam shape or a fence shape extending in the third direction, and may form a boundary between the cell region I and the peripheral circuit region III. In some embodiments, the blocking structure 250 may extend in the second and third directions, and may surround the cell region I. For example, the blocking structure 250 may be formed as a fence structure continuously surrounding the cell region I.

In an embodiment, the channel layer 225 may be formed to sufficiently fill the channel hole 215. In this case, the formation of the first filling layer pattern 240 may be omitted, and the channel 235 may have a solid cylindrical shape or a pillar shape. The second filling layer pattern 242 may be also omitted, and the dummy channel 237 may fill the remaining portion of the first opening 217. According to an exemplary embodiment, a height of the blocking structure 250 is greater than a height of a gate structure 140 in the peripheral region.

In an embodiment, after the formation of the channel hole 215 as illustrated in FIGS. 7A and 7B, a semiconductor pattern may be further formed at a lower portion of the channel hole 215 before forming the dielectric layer 220 and the channel layer 225. The semiconductor pattern may be formed by a selective epitaxial growth (SEG) process using the top surface of the substrate as a seed. The semiconductor pattern may include polysilicon or single crystalline silicon. Alternatively, an amorphous silicon layer filling the lower portion of the channel hole 215 may be formed, and then a laser epitaxial growth (LEG) process or a solid phase epitaxi (SPE) process may be performed on the amorphous silicon layer to form the semiconductor pattern. In this case, the dielectric layer structure 230 and the channel 235 may be formed on a top surface of the semiconductor pattern.

In an embodiment, a dummy semiconductor pattern (not illustrated) may be further formed at a lower portion of the first opening 217 simultaneously with the semiconductor pattern. In this case, the dummy dielectric layer 232 and the dummy channel 237 may be formed on a top surface of the dummy semiconductor pattern.

Figure 12:
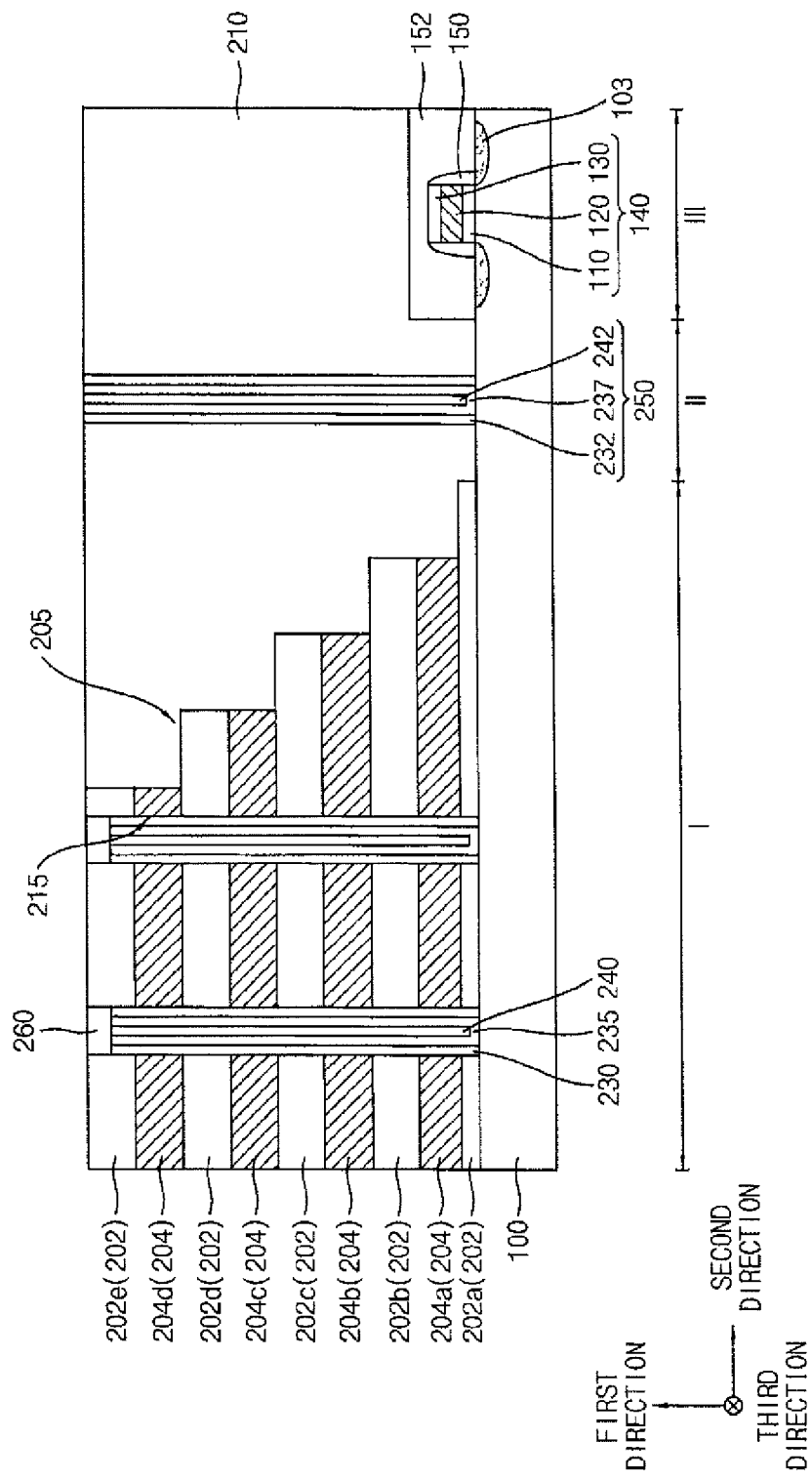
Figure 13:
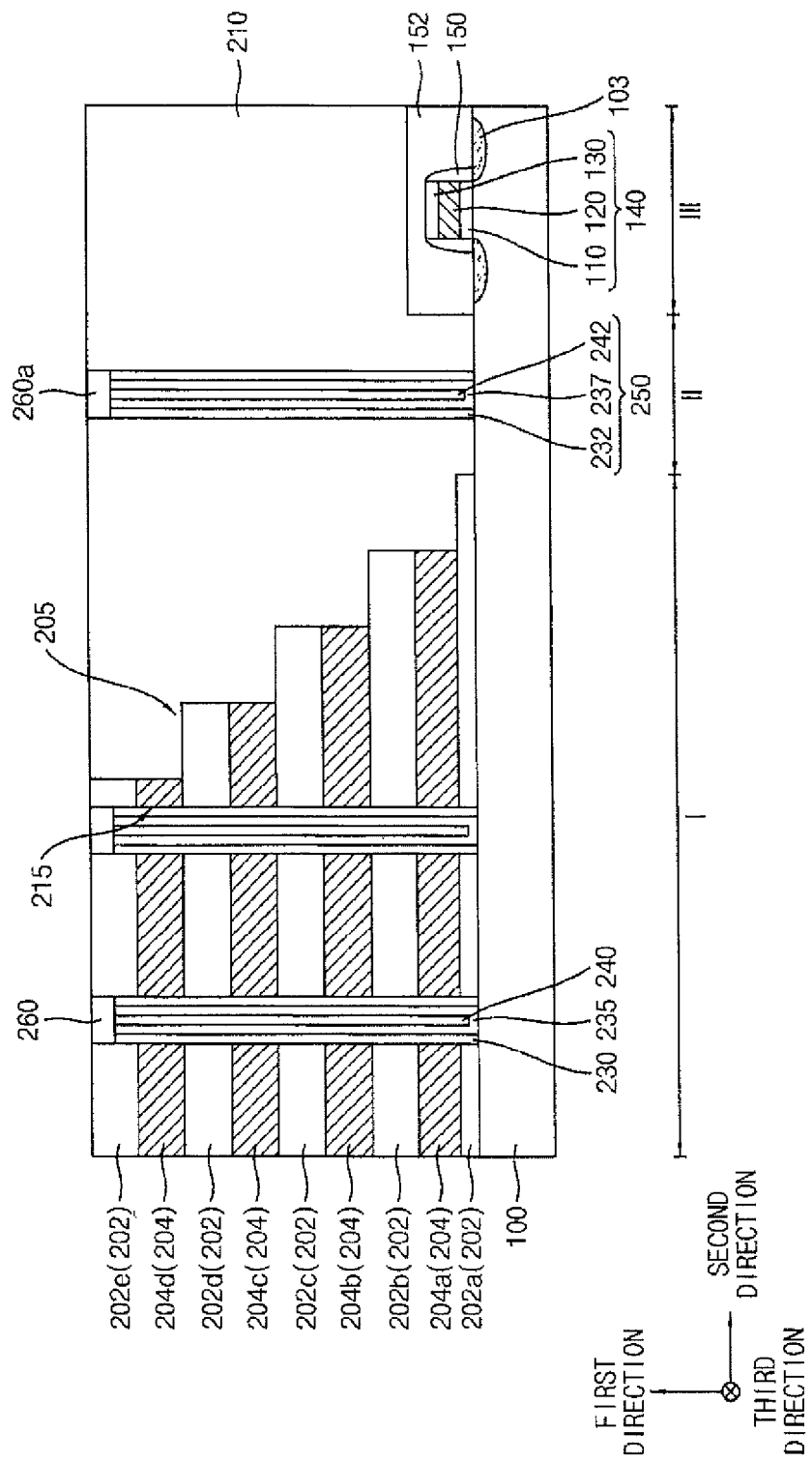

Referring to FIGS. 12 and 13, a pad 260 filling an upper portion of the channel hole 215 may be formed.

In example embodiments, as illustrated in FIG. 12, upper portions of the dielectric layer structure 230, the channel 235 and the first filling layer pattern 240 may be partially removed by, e.g., an etch-back process to form a recess. A pad layer may be formed on the dielectric layer structure 230, the channel 235, the first filling layer pattern 240 and the uppermost insulating interlayer 202e to sufficiently fill the recess. An upper portion of the pad layer may be planarized until a top surface of the uppermost insulating interlayer 202e is exposed to form the pad 260 from a remaining portion of the pad layer. In example embodiments, the pad layer may be formed using polysilicon optionally doped with n-type impurities. In an embodiment, a preliminary pad layer including amorphous silicon may be formed, and then a crystallization process may be performed thereon to form the pad layer. The planarization process may include a CMP process.

In an embodiment, as illustrated in FIG. 13, a dummy pad 260a filling an upper portion of the first opening 217 may be formed by a process substantially the same as or similar to that for the pad 260. The dummy pad 260a may be formed simultaneously with the pad 260, and may have a linear shape extending in the third direction.

Figure 14A:
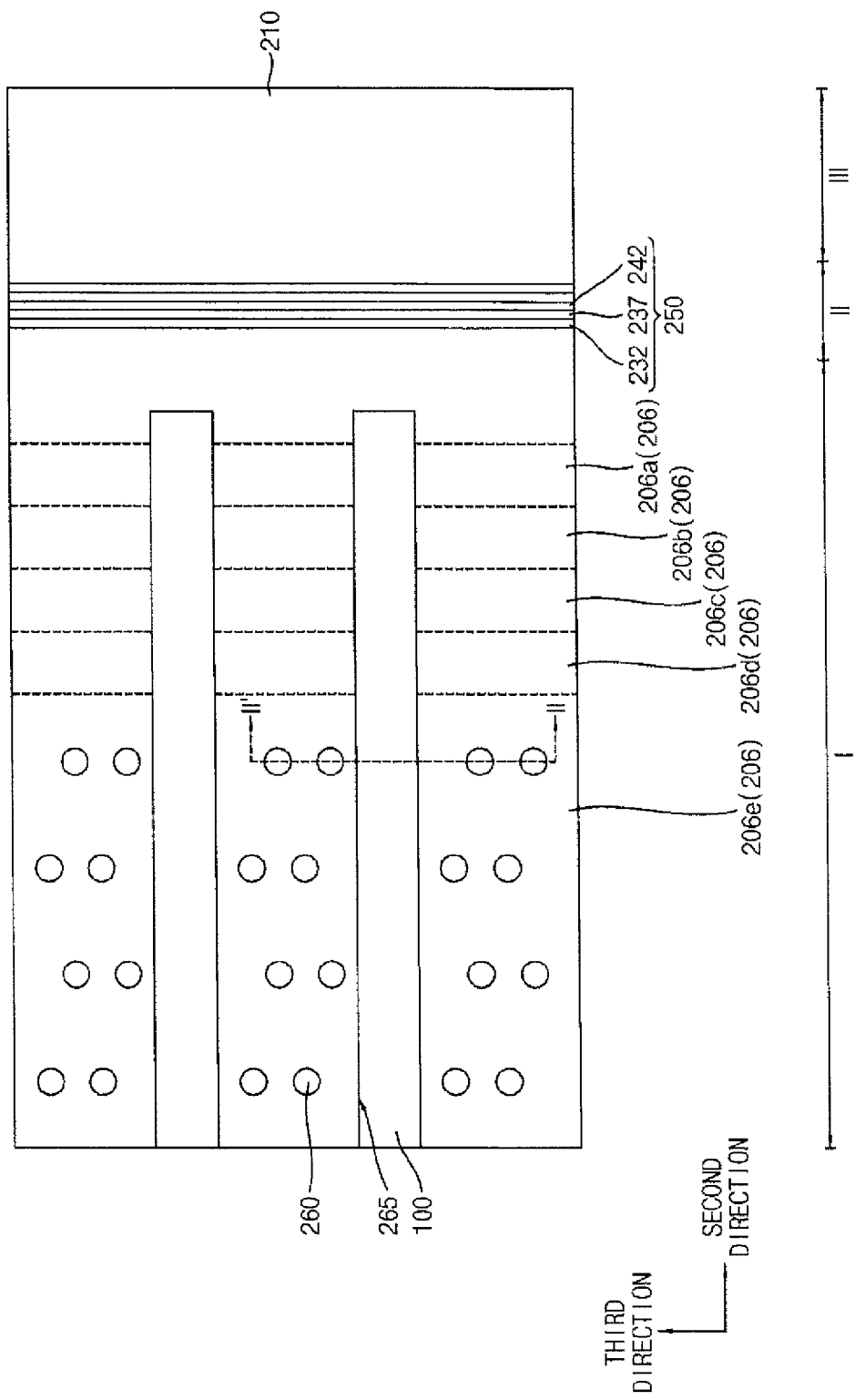
Figure 14B:
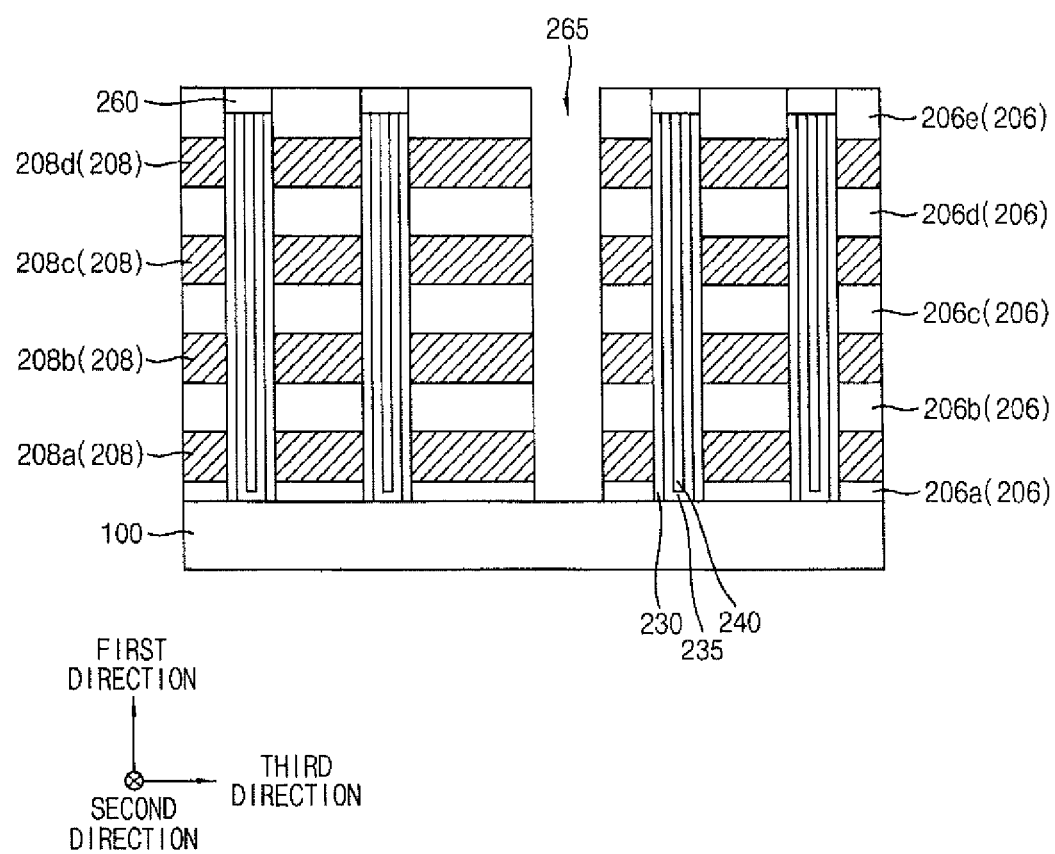

Referring to FIGS. 14A and 14B, the stepped mold structure 205 may be partially etched to form a second opening 265.

For example, a hard mask (not illustrated) covering the pads 260 and partially exposing the uppermost insulating interlayer 202e and the mold protection layer 210 between some of the channel rows may be formed on the uppermost insulating interlayer 202e and the mold protection layer 210. The mold protection layer 210, the insulating interlayers 202 and the sacrificial layers 204 may be partially etched by, e.g., a dry etching process using the hard mask as an etching mask to form the second opening 265. The hard mask may be formed using a photoresist material or an SOH material. The hard mask may be removed by an ashing process and/or a strip process after the formation of the second opening 265.

In example embodiments, the second opening 265 may extend in the second direction on the cell region I of the substrate 100. The second opening 265 may not extend to the blocking region II. In an embodiment, the second opening 265 may partially extend on the blocking region II and may not extend to the blocking structure 250. In an embodiment, the second opening 265 may extend to the blocking region II, and may be blocked or terminated by the blocking structure 250.

The second opening 265 may cut or intersect the stepped mold structure 205, and thus the predetermined number of the channel rows may form a channel row group or a channel row unit. For example, as illustrated in FIG. 14A, one channel row group may include 4 channel rows by the formation of the second opening 265. However, the number of the channel rows included in the channel row group may be adjusted in consideration of a circuit design and a degree of integration of the vertical memory device.

By the formation of the second opening 265, the insulating interlayers 202 and the sacrificial layers 204 may be changed into insulating interlayer patterns 206 (e.g., 206a through 206e) and sacrificial layer patterns 208 (e.g., 208a through 208d). The insulating interlayer pattern 206 and the sacrificial layer pattern 208 at each level may extend in the second direction. The top surface of the substrate 100, and sidewalls of the insulating interlayer patterns 206 and the sacrificial layer patterns 208 may be exposed through the second opening 265.

Figure 15B:
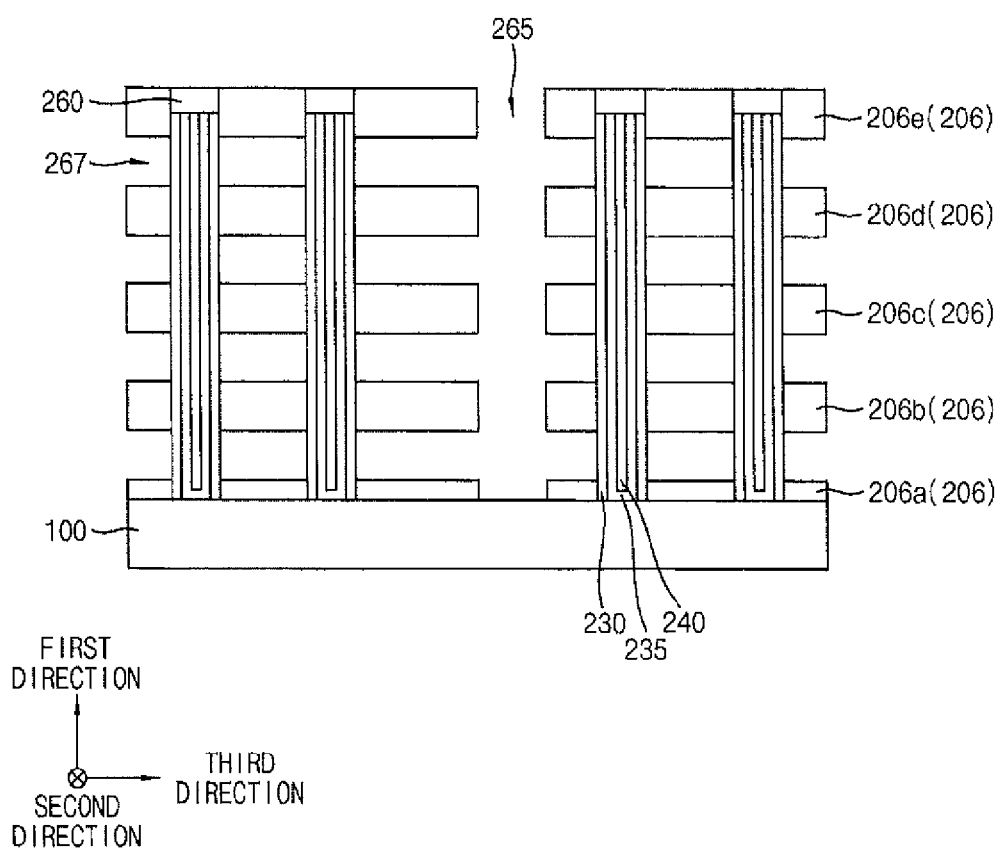

Referring to FIGS. 15A and 15B, the sacrificial layer patterns 208, the sidewalls of which are exposed by the second opening 265 may be removed. In example embodiments, the sacrificial layer patterns 208 may be removed by a wet etching process using, e.g., phosphoric acid and/or sulfuric acid as an etchant solution.

A gap 267 may be defined by a space from which the sacrificial layer pattern 208 is removed. A plurality of the gaps 267 may be formed along the first direction. Each gap 267 may be formed between the adjacent insulating interlayer patterns 206. Outer sidewalls of the dielectric layer structure 230 may be at least partially exposed by the gap 267.

Figure 16A:
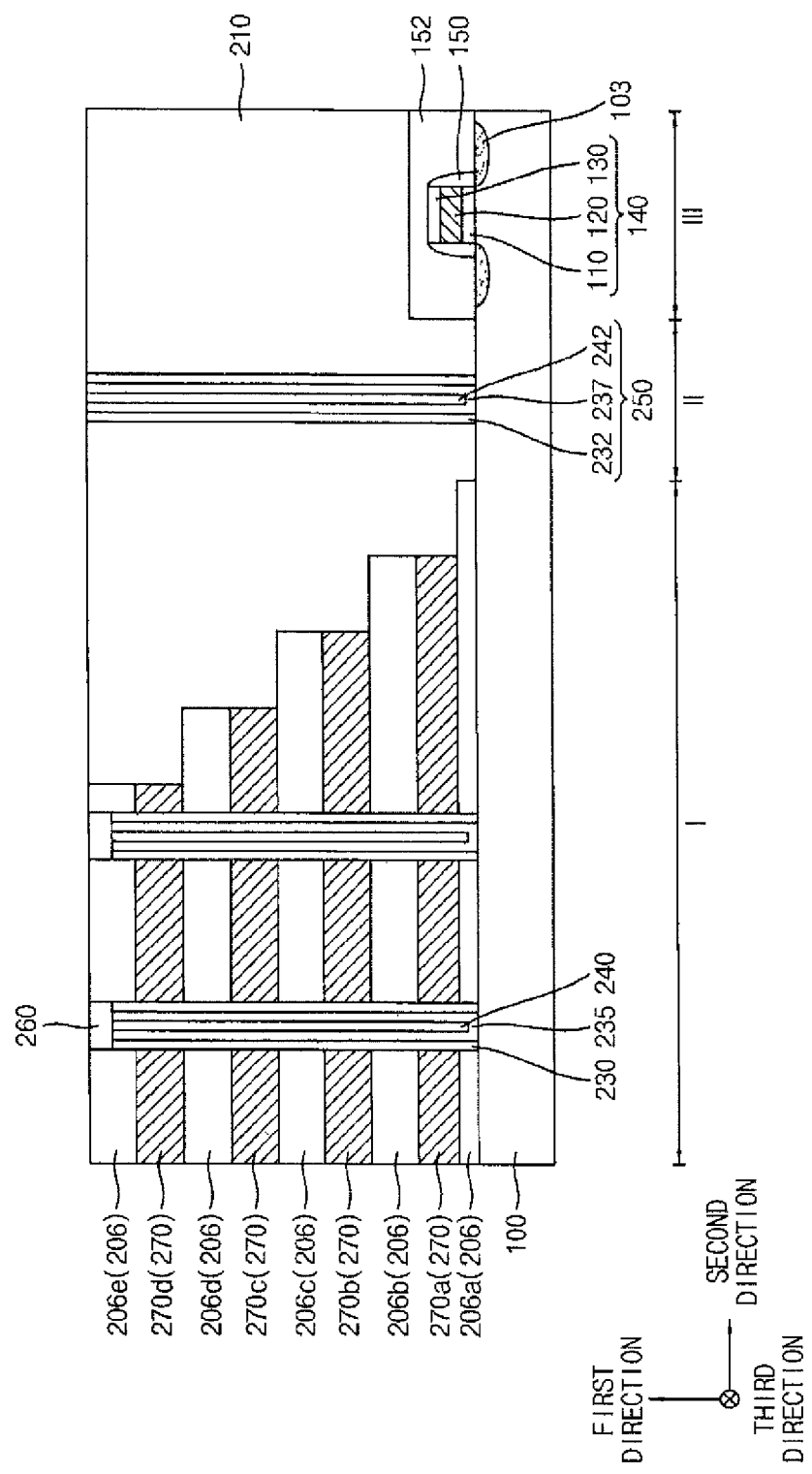
Figure 16B:
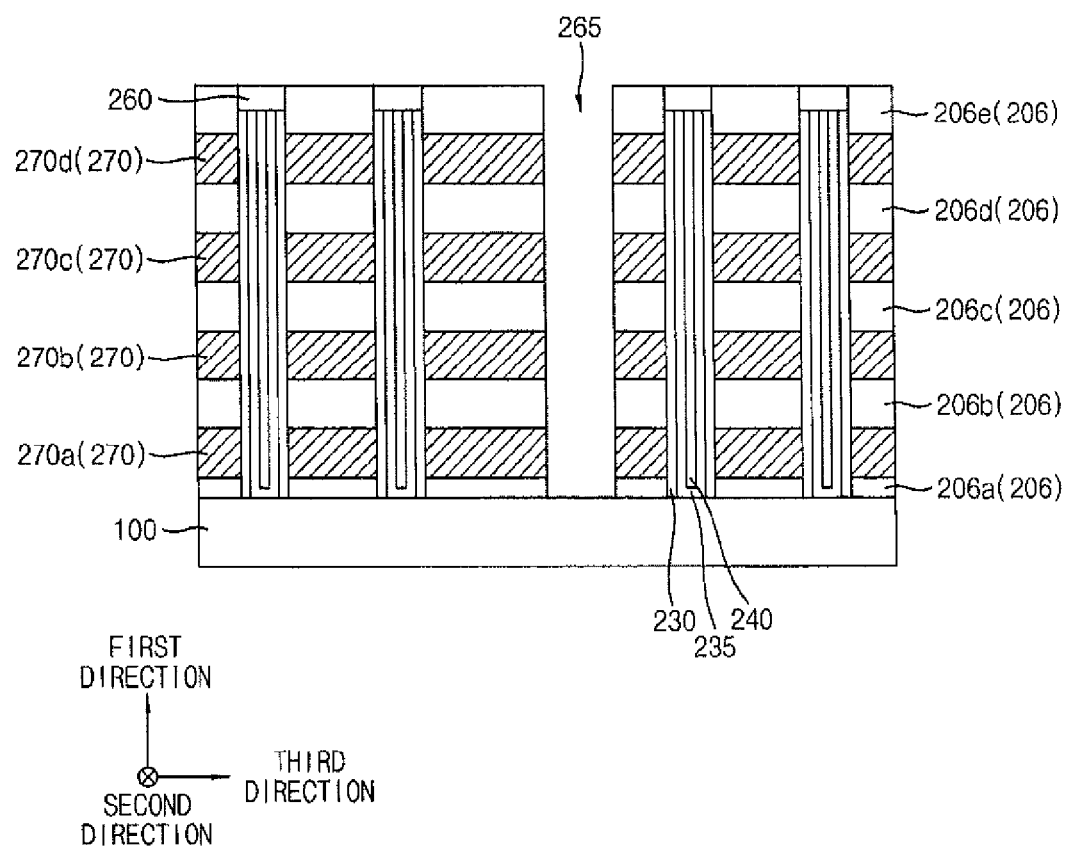

Referring to FIGS. 16A and 16B, a gate line 270 may be formed in each gap 267. Accordingly, the sacrificial layer 204 or the sacrificial layer pattern 208 of each level may be replaced with the gate line 270.

In example embodiments, a gate electrode layer may be formed on the exposed outer sidewalls of the dielectric layer structure 230, surfaces of the insulating interlayer patterns 206, the exposed top surface of the substrate 100 and a top surface of the pad 260. The gate electrode layer may sufficiently fill the gaps 267 and at least partially fill the second opening 265. The gate electrode layer may cover top surfaces of the mold protection layer 210 and the blocking structure 250.

The gate electrode layer may be formed using a metal or a metal nitride having low electrical resistance and work function. For example, the gate electrode layer may be formed using tungsten, tungsten nitride, titanium, titanium nitride, tantalum, tantalum nitride, platinum, etc. In an embodiment, the gate electrode layer may be formed as a multi-layered structure including a barrier layer formed of a metal nitride and a metal layer. The gate electrode layer may be formed by a CVD process, a PECVD process, an ALD process, a PVD process, a PVD process, a sputtering process, etc.

In an embodiment, an additional blocking layer may be formed along inner walls of the gaps 267 and the surfaces of the insulating interlayer patterns 206 prior to the formation of the gate electrode layer. The additional blocking layer may be formed using silicon oxide or a metal oxide.

Subsequently, the gate electrode layer may be partially removed to form the gate line 270 in the gap 267 at each level.

For example, an upper portion of the gate electrode layer may be planarized by a CMP process until an uppermost insulating interlayer pattern 206e is exposed. Portions of the gate electrode layer formed in the second opening 265 and on the top surface of the substrate 100 may be etched to obtain the gate lines 270. The gate electrode layer may be partially etched by a wet etching process using, e.g., a hydrogen peroxide-containing solution.

The gate lines 270 may include the GSL, the word line and the SSL sequentially stacked and spaced apart from one another in the first direction. For example, a lowermost gate line 270a may serve as the GSL. Two gate lines 270b and 270c on the GSL may serve as the word lines. An uppermost gate line 270d on the word line may serve as the SSL.

The gate line 270 at each level may partially surround the dielectric layer structure 230 and the channel 235 and extend in the second direction. The gate line 270 at each level may surround the predetermined number of the channel rows, e.g., four channel rows. Accordingly, a gate line structure may be defined by the gate lines 270 that are stacked in the first direction, surround the predetermined number of the channel rows and extend in the second direction.

Figure 17B:
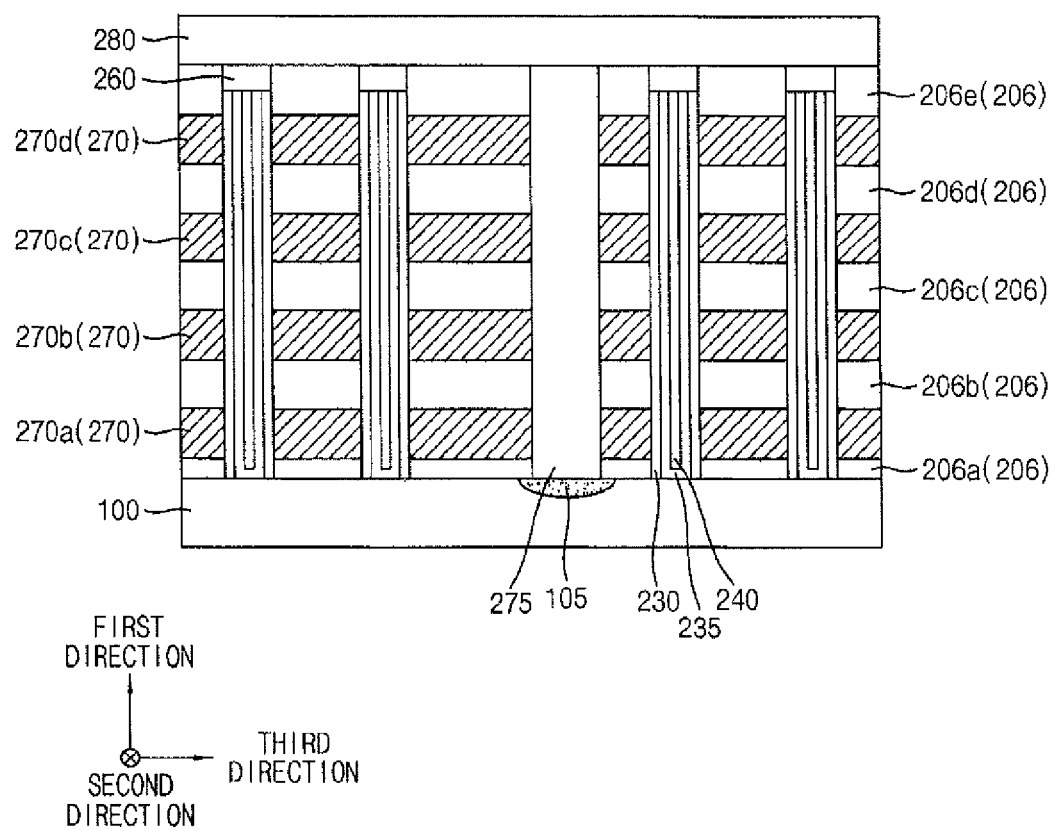

Referring to FIGS. 17A and 17B, a second impurity region 105 may be formed at an upper portion of the substrate 100 exposed through the second opening 265, and a separation layer pattern 275 filling the second opening 265 may be formed.

In example embodiments, an ion-implantation mask (not illustrated) covering the pads 260 may be formed on an uppermost insulating interlayer pattern 206e. N-type impurities such as P or As may be implanted through the second opening 265 using the ion-implantation mask to form the second impurity region 105. The second impurity region 105 may serve as a CSL extending in the second direction. In an embodiment, a metal silicide pattern (not illustrated) including, e.g., nickel silicide or cobalt silicide may be further formed on the second impurity region 105 to reduce a resistance of the CSL.

A separation layer sufficiently filling the second opening 265 may be formed on the second impurity region 105, the uppermost insulating interlayer pattern 206e, the pad 260 and the mold protection layer 210. An upper portion of the separation layer may be planarized by a CMP process or an etch-back process until the uppermost insulating interlayer pattern 206e is exposed to form the separation layer pattern 275. The separation layer may be formed using an insulation material, e.g., silicon oxide.

An upper insulation layer 280 may be formed on the uppermost insulating interlayer pattern 206e, the separation layer pattern 275, the pad 260 and the mold protection layer 210. The upper insulation layer 280 may be formed using an insulation material such as silicon oxide by a deposition process such as a CVD process. For a convenience of explanation, the illustration of the upper insulation layer 280 is omitted in FIG. 17A.

In an embodiment, a wiring structure including, e.g., a bit line may be further formed on the upper insulation layer 280.

Figure 18:
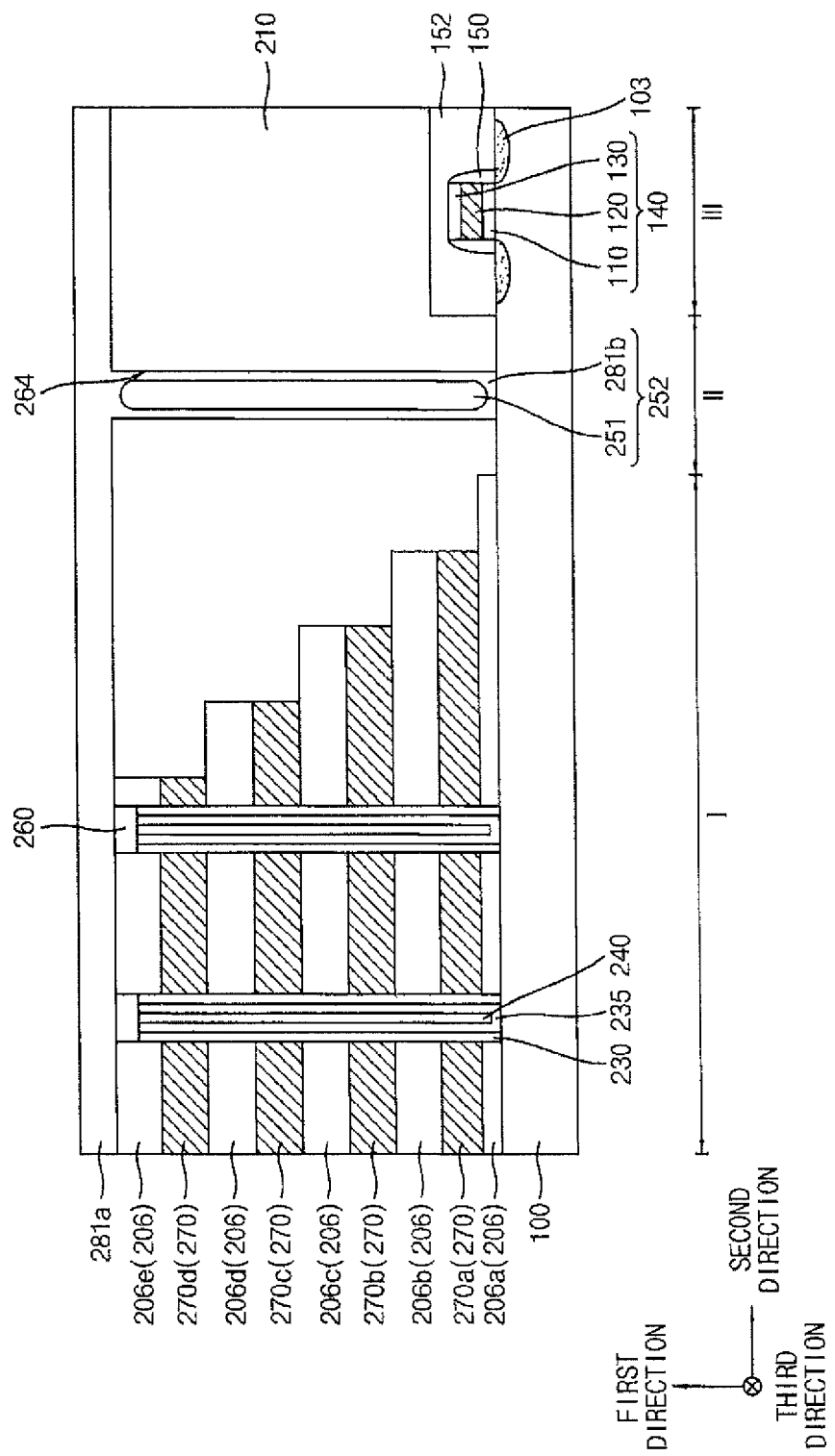

FIG. 18 is a cross-sectional view illustrating a vertical memory device in accordance with example embodiments. The vertical memory device of FIG. 18 may have elements and/or constructions substantially the same as or similar to those illustrated with reference to FIGS. 1 to 3 except for a blocking structure. Thus, detailed descriptions on repeated elements are omitted, and like reference numerals are used to designate like elements.

Referring to FIG. 18, an air gap 251 may substantially serve as a blocking structure 252.

In example embodiments, a first opening 264 may be formed through a mold protection layer 210 on a blocking region II of a substrate 100. The first opening 264 may extend in the third direction. A partial filling layer 281b may be formed in the first opening 264 to partially fill the first opening 264, and an air gap 254 may be defined in the partial filling layer 281b.

In example embodiments, the partial filling layer 281b may be merged or integral with an upper insulation layer 281a. For example, while forming the upper insulation layer 281a on the mold protection layer 210, the first opening 264 may be also partially filled with the upper insulation layer 281a such that the partial filling layer 281b may be formed.

The upper insulation layer 281a and the partial filling layer 281b may be formed using silicon oxide that may have poor gap-filling and/or conformal properties such as tetraethyl orthosilicate (TEOS) or a CVD oxide. Thus, the upper insulation layer 281a may be overhung at an entrance of the first opening 264 such that the air gap 251 may be formed in the first opening 264. The partial filling layer 281b may fill a lower portion of the first opening 264 and may be formed along a sidewall of the first opening 264.

In example embodiments, the blocking structure 252 may include the air gap 251. Accordingly, a medium for propagation of stress from a cell region I to a peripheral circuit region III may be removed. Therefore, the stress may be efficiently prevented from being transferred to the peripheral circuit region III.

FIGS. 19 to 24 are top plan views and cross-sectional views illustrating a method of manufacturing a vertical memory device in accordance with example embodiments. For example. FIGS. 19 to 24 illustrate a method of manufacturing the vertical memory device of FIG. 18.

Figure 21:
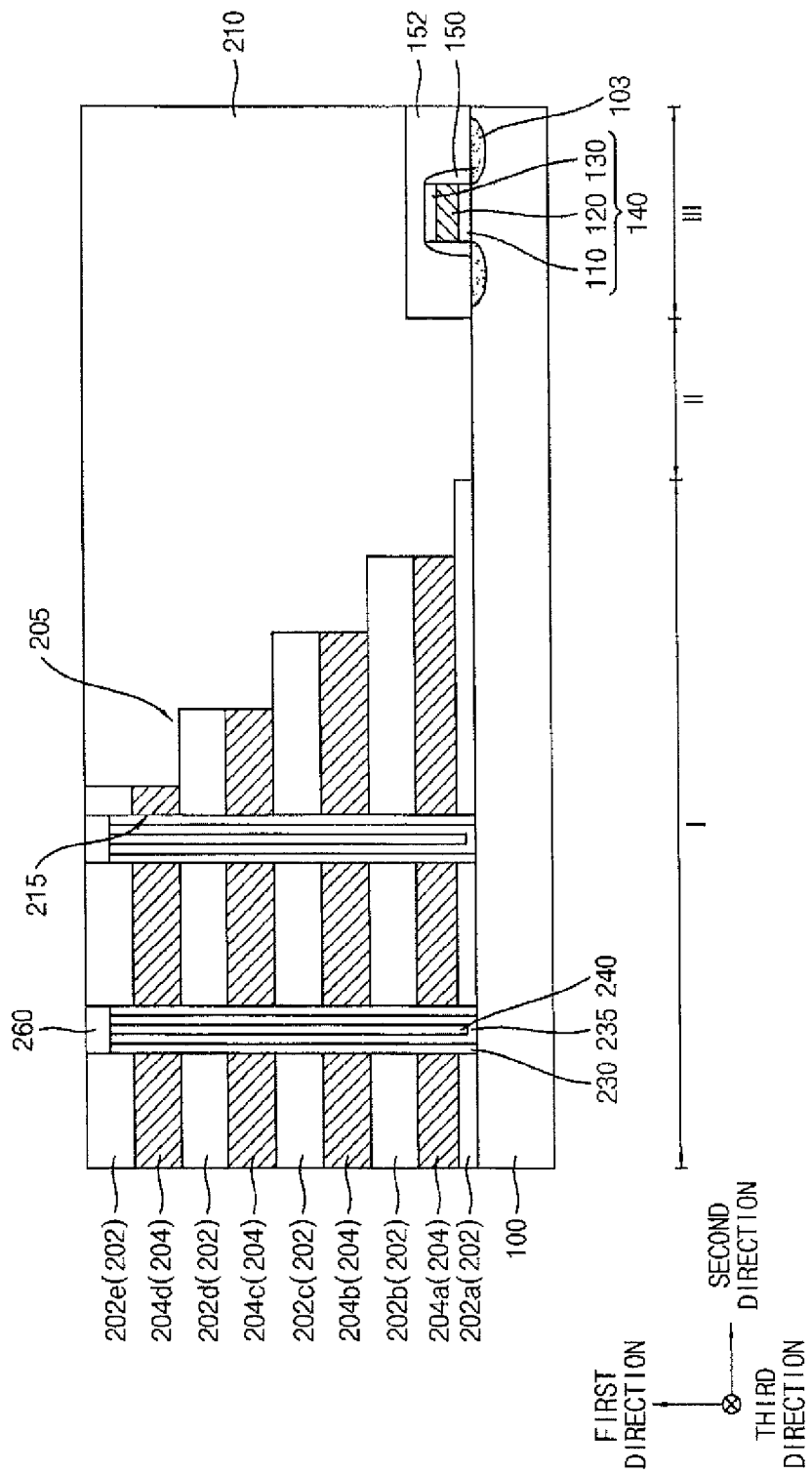
Figure 22A:
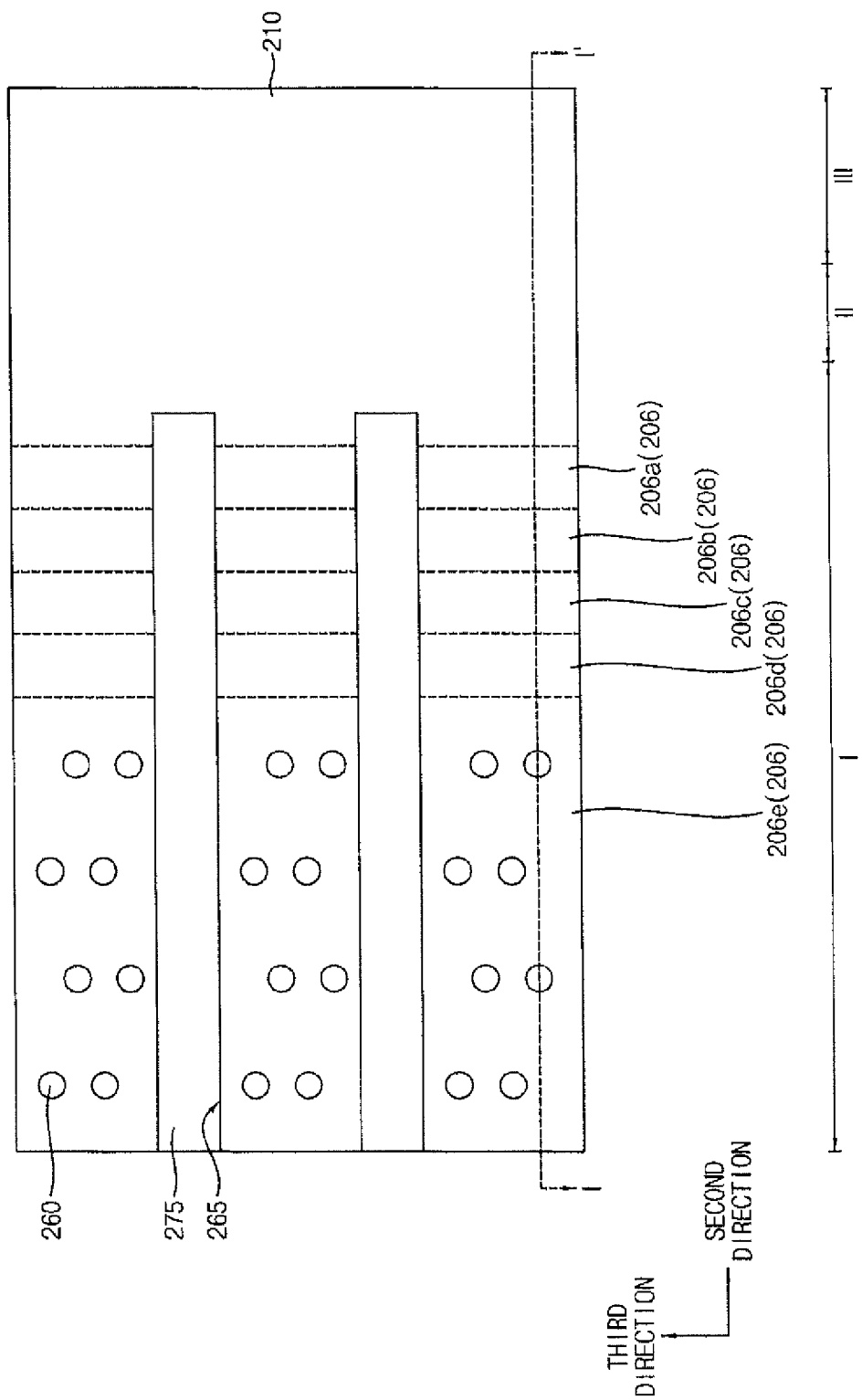
Figure 22B:
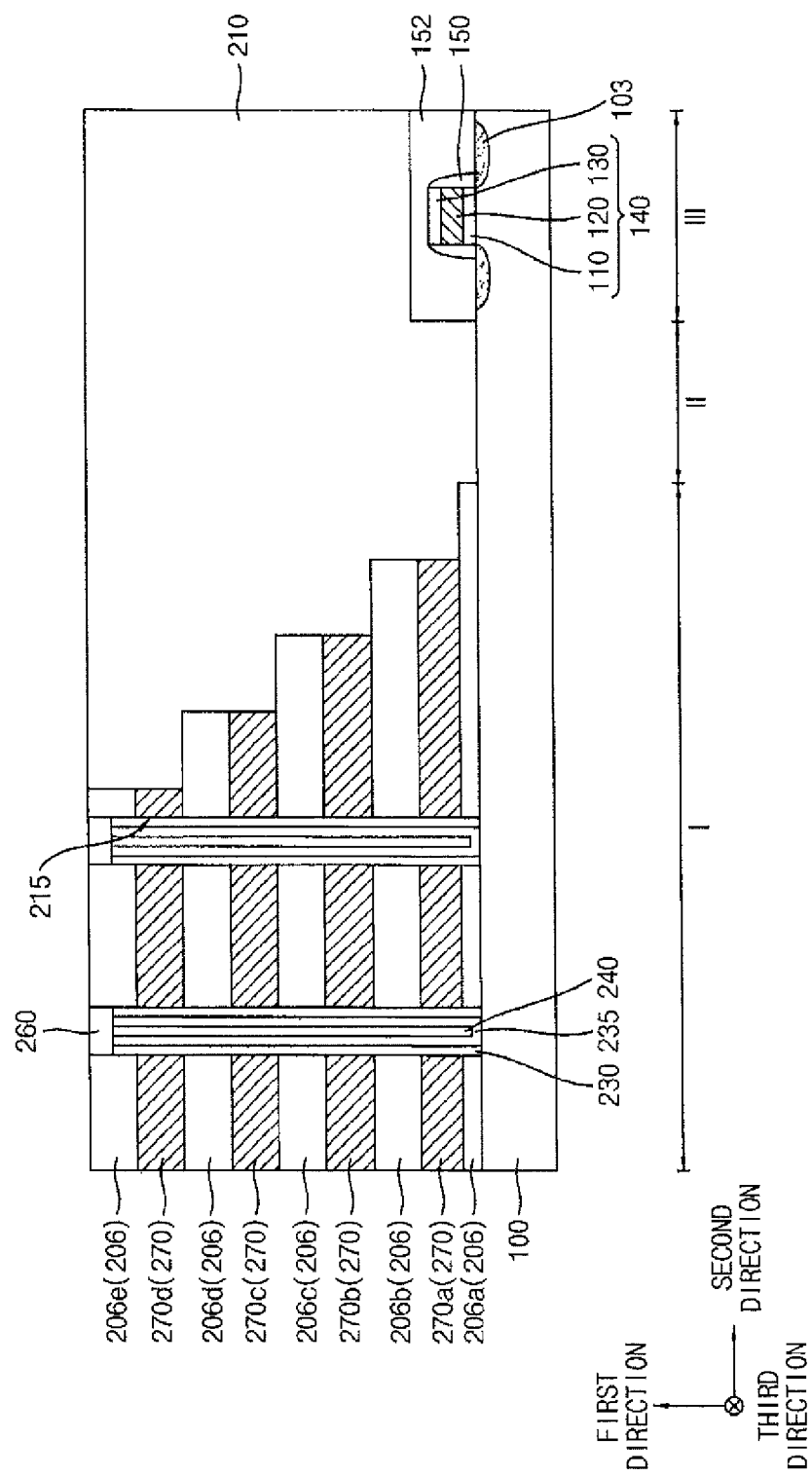
Figure 23B:
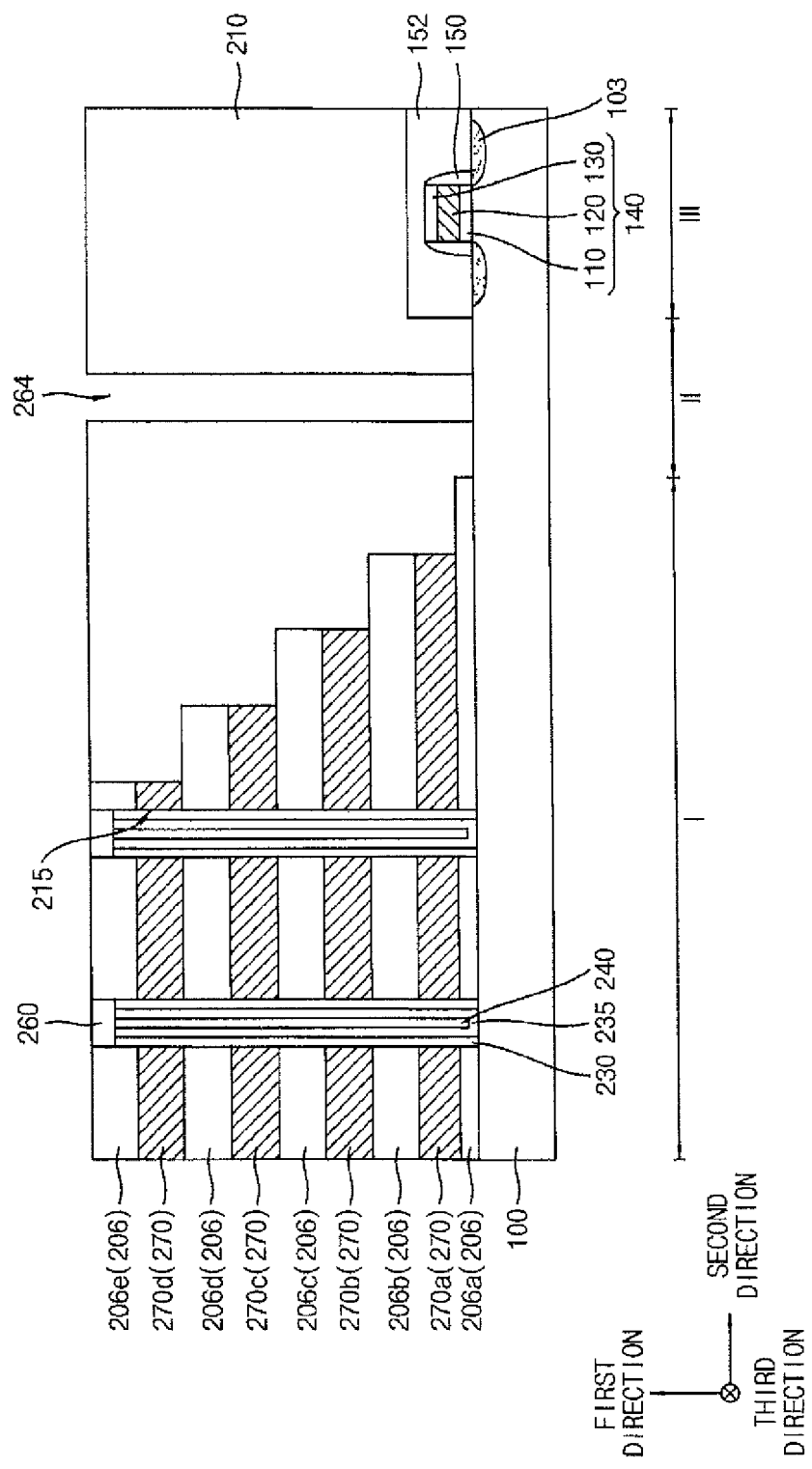

Specifically, FIGS. 22A and 23A are top plan views illustrating the method of manufacturing the vertical memory device. FIGS. 19 to 21, 22B, 23B and 24 are cross-sectional views taken along line I-I' indicated FIGS. 22A and 23A in the first direction.

Detailed descriptions on processes and/or materials substantially the same as or similar to those illustrated with reference to FIGS. 4 to 17B are omitted herein.

Figure 19:
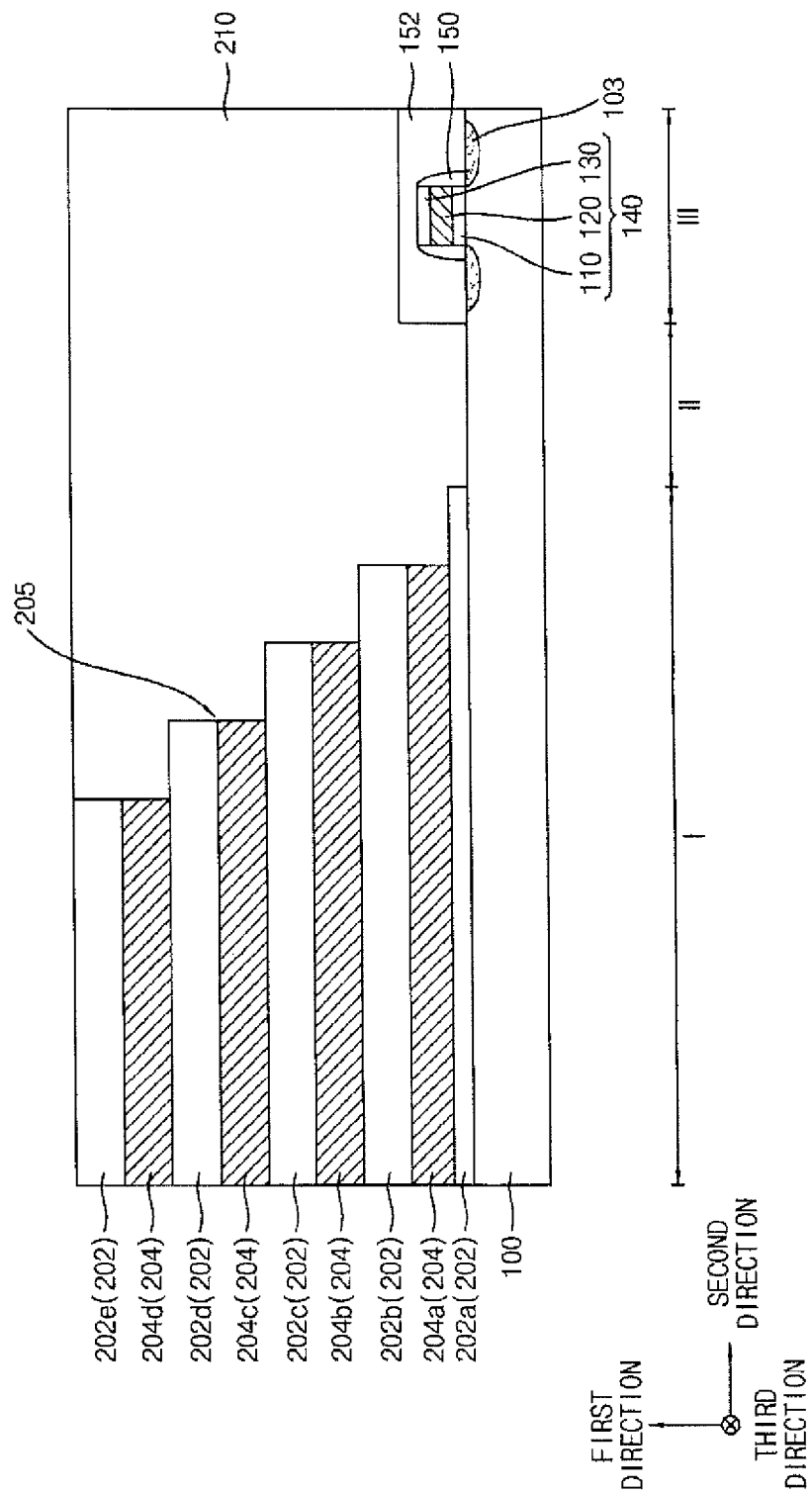

Referring to FIG. 19, processes substantially the same as or similar to those illustrated with reference to FIGS. 4 to 6 may be performed. Accordingly, a gate structure 140 and a first impurity region 103 may be formed on a peripheral circuit region III of a substrate 100, and a mold structure 205 may be formed on a cell region I of the substrate 100. A mold protection layer 210 covering a lateral portion of the mold structure 205 may be formed on the cell region I, a blocking region II and the peripheral circuit region III of the substrate 100.

Figure 20:
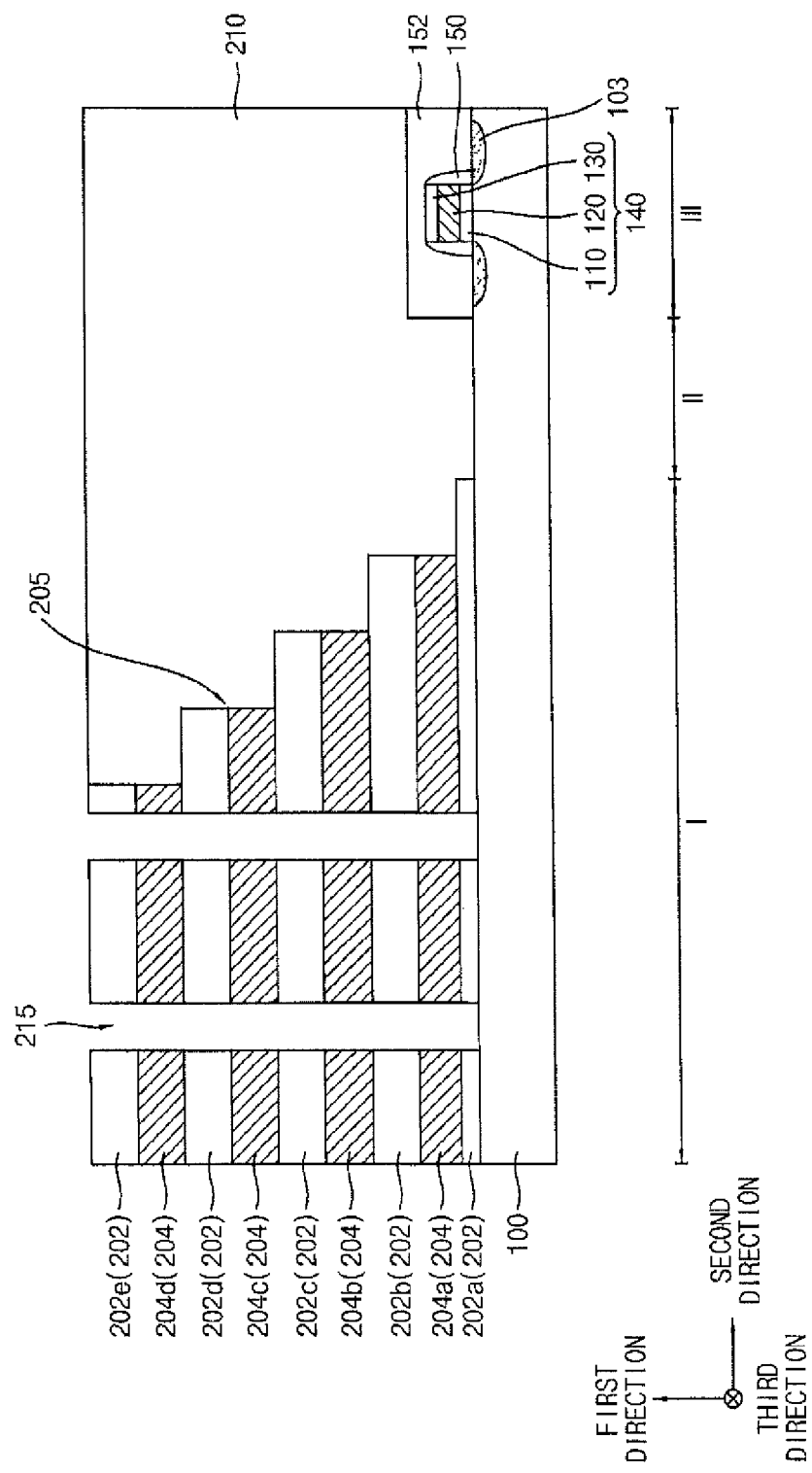

Referring to FIG. 20, a process substantially the same as or similar to that illustrated with reference to FIGS. 7A and 7B may be performed to form a plurality of channel holes 215 extending through the mold structure 205. In this embodiment, the first opening 217 of FIGS. 7A and 7B may not be formed.

Referring to FIG. 21, processes substantially the same as or similar to those illustrated with reference to FIGS. 8 to 12 may be performed. Accordingly, a dielectric layer structure 230, a channel 235 and a first filling layer pattern 240 may be formed in the channel hole 215, and a pad 260 filling an upper portion of the channel hole 215 may be formed.

Referring to FIGS. 22A and 22B, processes substantially the same as or similar to those illustrated with reference to FIGS. 14A to 17B may be performed. Accordingly, a second opening 265 for a gate line cut (also refer to FIGS. 14A and 14B) may be formed, and sacrificial layers 204 may be replaced with gate lines 270. A second impurity region 105 (also refer to FIG. 17B) may be formed at an upper portion of the substrate 100 exposed through the second opening 265, and a separation layer pattern 275 may be formed in the second opening 265.

Referring to FIGS. 23A and 23B, a first opening 264 extending through the mold protection layer 210 may be formed on the blocking region II of the substrate 100.

In example embodiments, a hard mask (not illustrated) covering the cell region I and the peripheral circuit region III may be formed. A portion of the mold protection layer 210 on the blocking region II may be exposed by the hard mask. The mold layer 210 may be partially removed using the hard mask as an etching mask to form the first opening 264.

The first opening 264 may have a trench shape or a ditch shape extending in the third direction. The first opening 264 illustrated in FIGS. 23A and 23B may have a width smaller than that of the first opening 217 illustrated in FIGS. 7A and 7B. In some embodiments, the first opening 264 may extend in the second and third directions to surround the cell region I. For example, the first opening 264 may be formed as a fence shape continuously surrounding the cell region I.

Referring to FIG. 24, an upper insulation layer 281a may be formed on an uppermost insulating interlayer pattern 206e, the separation layer pattern 275, the pads 264 and the mold protection layer 210.

In example embodiments, the upper insulation layer 281a may be formed using a material and a process condition that may have poor gap-filling and/or conformal properties. For example, the upper insulation layer 281a may be formed using TEOS or a CVD oxide by a CVD process or a spin coating process having the low gap-fill property.

Thus, the upper insulation layer 281a may be overhung at an entrance of the first opening 264 such that an air gap 251 may be formed in the first opening 264. In an embodiment, as illustrated in FIG. 24, a portion of the upper insulation layer 281a may be extended into the first opening 264 to form a partial filling layer 281b. The partial filling layer 281b may fill a lower portion of the first opening 264 and may be formed on a sidewall of the first opening 264.

Accordingly, a blocking structure 252 including the partial filling layer 281b and the air gap 251 may be formed in the first opening 264, and the vertical memory device illustrated in FIG. 18 may be manufactured.

Figure 25:
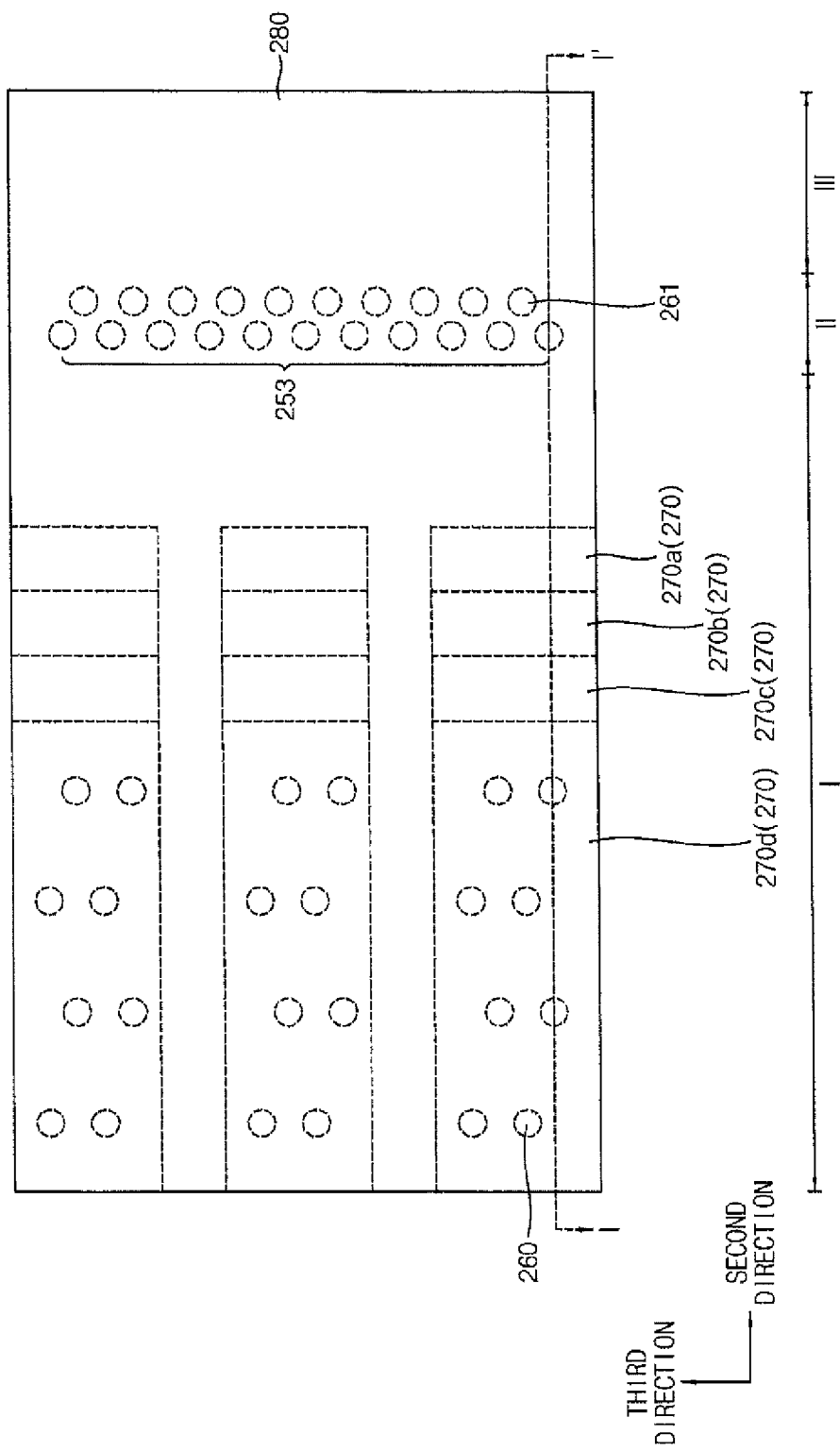
Figure 26:
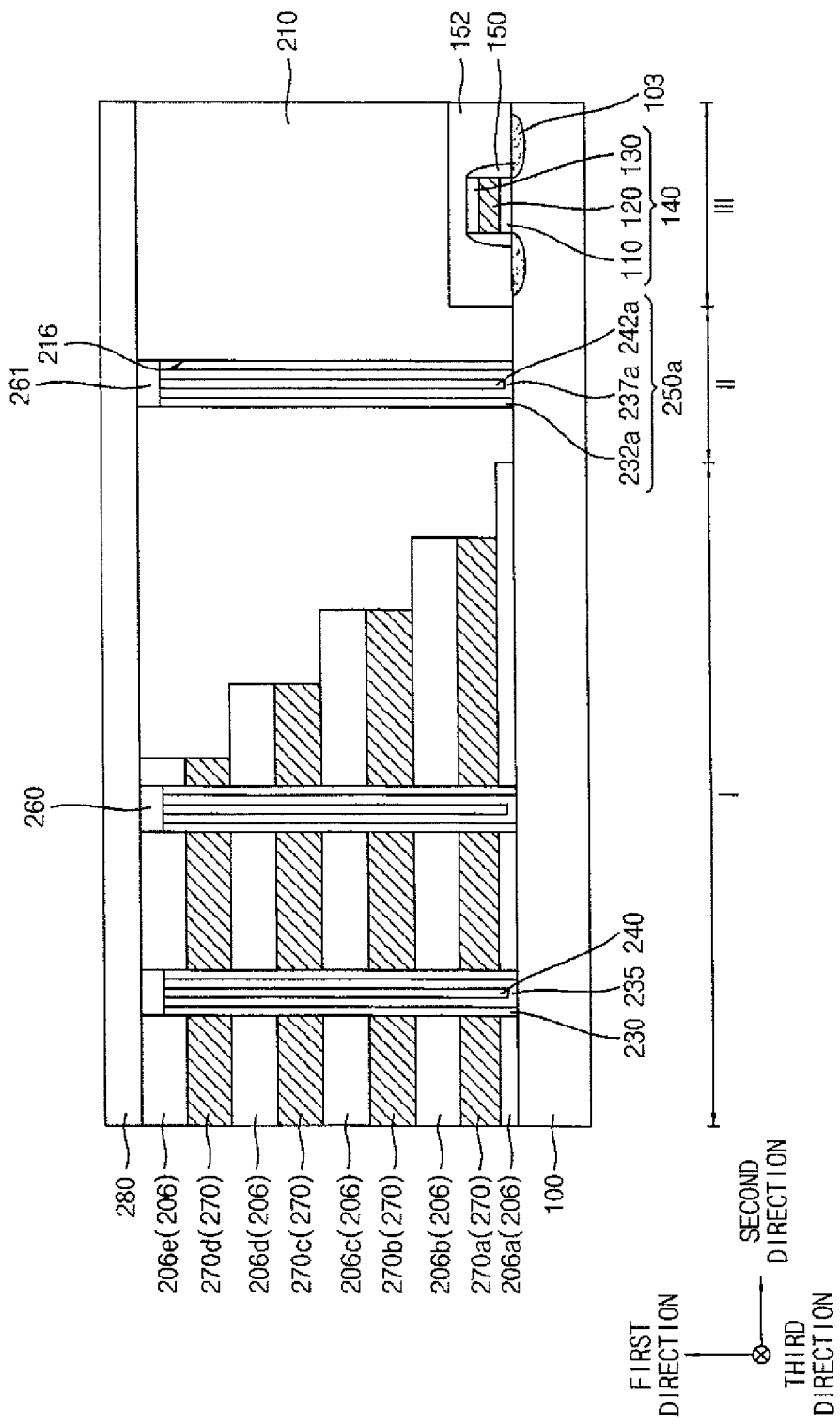

FIGS. 25 and 26 are a top plan view and a cross-sectional view, respectively, illustrating a vertical memory device in accordance with example embodiments. The vertical memory device of FIGS. 25 and 26 may have elements and/or constructions substantially the same as or similar to those illustrated with reference to FIGS. 1 to 3 except for a blocking structure. Thus, detailed descriptions on repeated elements and/or structures are omitted, and like reference numerals are used to designate like elements.

Referring to FIGS. 25 and 26, the vertical memory device may include a plurality of dummy channel structures 250a on a blocking region II of a substrate 100.

The dummy channel structure 250a may include a dummy dielectric layer structure 232a, a dummy channel 237a and a second filling layer pattern 242a stacked in a dummy channel hole 216. A dummy pad 261 may be formed on the dummy dielectric layer structure 232a, the dummy channel 237a and the second filling layer pattern 242a to cap an upper portion of the dummy channel hole 216.

In example embodiments, the dummy channel hole 216 may have a shape or a structure substantially the same as or similar to that of a channel hole 215 formed on a cell region I. The dummy dielectric layer structure 232a, the dummy channel 237a, the second filling layer pattern 242a and the dummy pad 261 may have shapes or structures substantially the same as or similar to those of a dielectric layer structure 230, a channel 235, a first filling layer pattern 240 and a pad 260, respectively, formed on the cell region I.

Figure 27:
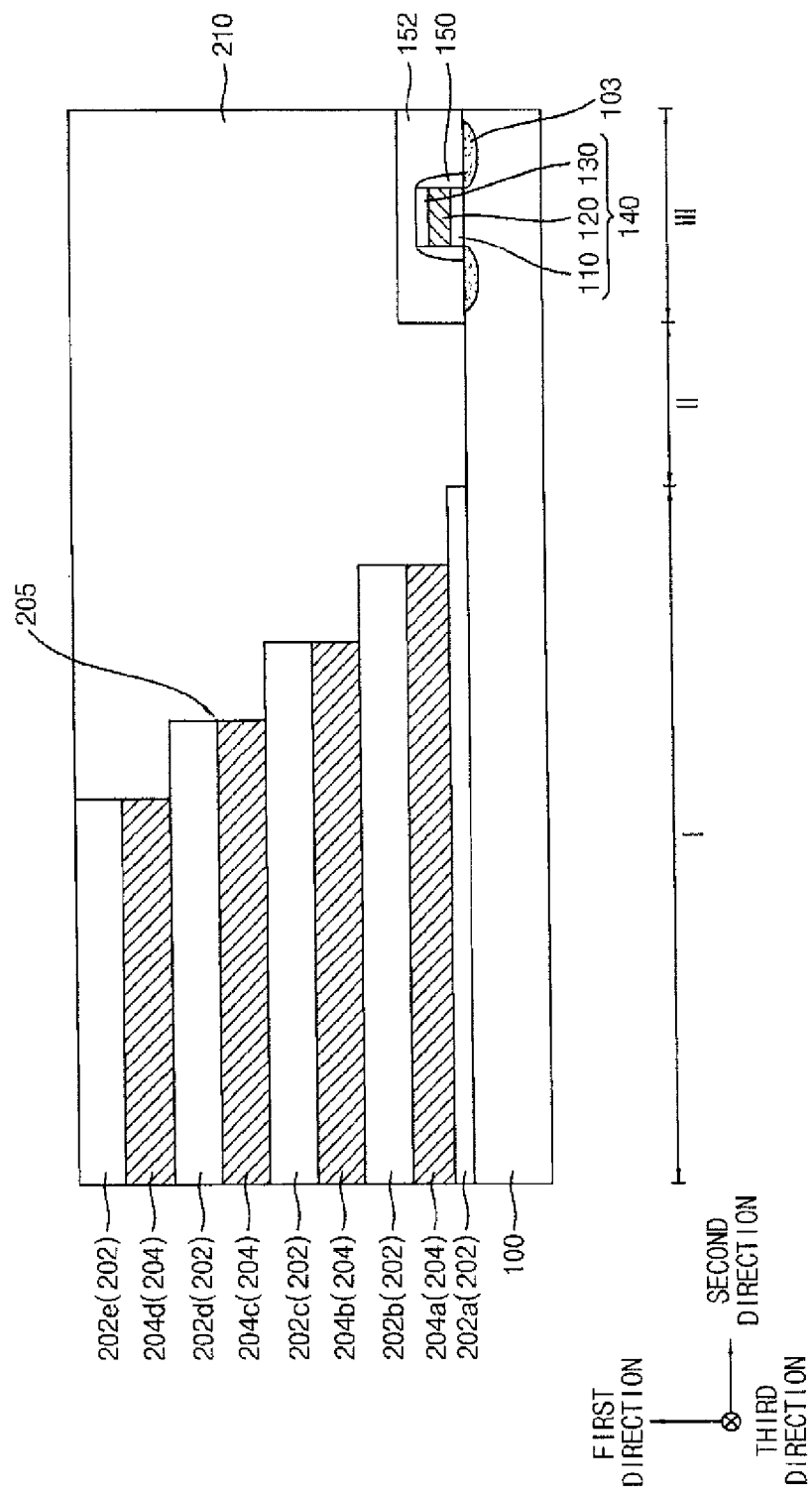

As illustrated in FIG. 25, a plurality of the dummy channel structures 250a may be arranged in the third direction to form a dummy channel column, and a plurality of dummy channel columns may be arranged in the second direction. Thus, a blocking structure including at least one dummy channel column may be formed on the blocking region II of the substrate 100 to prevent a stress propagation from the cell region I to a peripheral circuit region III. FIG. 27 illustrates that the blocking structure 253 include 2 dummy channel columns, however, the blocking structure 253 may include at least 3 dummy channel columns.

In example embodiments, the dummy channel structures 250a included in the different dummy channel columns may be formed in a zigzag arrangement. Thus, a density of the dummy channel structures 250a on the blocking region II may be increased so that the stress propagation may be efficiently prevented.

FIGS. 27 to 29B are top plan views and cross-sectional views illustrating a method of manufacturing a vertical memory device in accordance with example embodiments. For example, FIGS. 27 to 29B illustrate a method of manufacturing the vertical memory device of FIGS. 25 and 26.

Figure 28B:
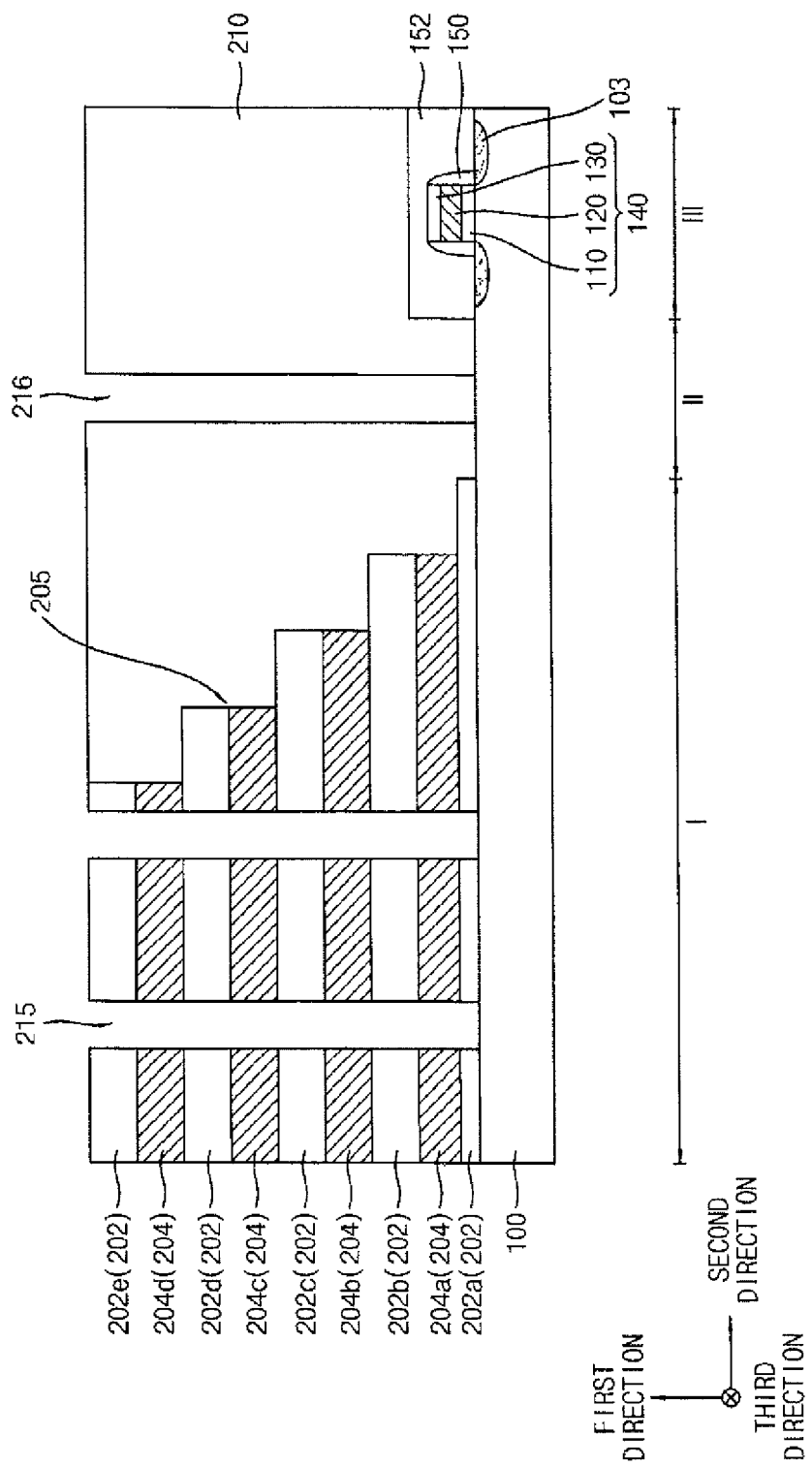

Specifically, FIGS. 28A and 29A are top plan views illustrating the method of manufacturing the vertical memory device. FIGS. 27, 28B and 29B are cross-sectional views taken along lines I-I' indicated in FIGS. 28A and 29A.

Detailed descriptions on processes and/or materials substantially the same as or similar to those illustrated with reference to FIGS. 4 to 17B are omitted herein.

Referring to FIG. 27, processes substantially the same as or similar to those illustrated with reference to FIGS. 4 to 6 may be performed. Accordingly, a peripheral circuit including a gate structure 140, a gate spacer 150 and a first impurity region 103 may be formed on a peripheral circuit region III of a substrate 100, and a peripheral circuit protection layer 152 covering the peripheral circuit may be formed. A mold structure 205 may be formed on a cell region I. A mold protection layer 210 covering a lateral portion of the mold structure 205 may be formed on a cell region I, a blocking region II and the peripheral circuit region III.

Referring to FIGS. 28A and 28B, a process substantially the same as or similar to that illustrated with reference to FIGS. 7A and 7B may be performed to form a plurality of channel holes 215 extending through the mold structure 205 on the cell region I, and a plurality of dummy channel holes 216 extending through the mold protection layer 210 on the blocking region II.

As illustrated in FIG. 28A, a plurality of the channel holes 215 may be formed in the second direction to form a channel hole row, and a plurality of the channel hole rows may be formed along the third direction on the cell region I. A plurality of the dummy channel holes 216 may be formed in the third direction to form a dummy channel hole column, and a plurality of the dummy channel hole columns may be formed along the second direction on the blocking region II.

In example embodiments, the channel hole 215 and the dummy channel hole 216 may have a shape or a structure substantially the same as or similar to that of each other. The channel hole 215 and the dummy channel hole 216 may be formed simultaneously from an etching process using a single mask.

Referring to FIGS. 29A and 29B, processes substantially the same as or similar to those illustrated with reference to FIGS. 8 to 13. Accordingly, a dielectric layer structure 230, a channel 235 and a first filling layer pattern 240 may be formed in the channel hole 215, and a pad 260 capping an upper portion of the channel hole 215 may be formed. A dummy dielectric layer structure 232a, a dummy channel 237a and a second filling layer pattern 242a may be formed in the dummy channel hole 216, and a dummy pad 261 capping an upper portion of the dummy channel hole 216 may be formed. Thus, a dummy channel structure 250a including the dummy dielectric layer structure 232a, the dummy channel 237a, the second filling layer pattern 242a and the dummy pad 261 may be formed in the dummy channel hole 216.

As illustrated in FIG. 29A, a plurality of the dummy channel structures 250a may be arranged in the third direction to form a dummy channel columns. At least one dummy channel columns may be formed on the blocking region II to form a blocking structure 253. In example embodiments, a plurality of the dummy channel structures 250a may be arranged in the second and third directions to form a plurality of dummy channel rows and dummy channel columns. In this case, the plurality the dummy channel rows and the dummy channel columns may surround the cell region I to form the blocking structure 253 having a fence shape.

Subsequently, processes substantially the same as or similar to those illustrated with reference to FIGS. 14A to 17B may be performed to obtain the vertical memory device of FIGS. 25 and 26.

For example, sacrificial layers 204 may be replaced with gate lines 270, and a separation layer pattern 275 (refer to FIGS. 17A and 17B) dividing gate line structures may be formed. An upper insulation layer 280 (refer to FIG. 17B) may be formed on the gate line structure, the mold protection layer 210 and the blocking structure 253.

Figure 30:
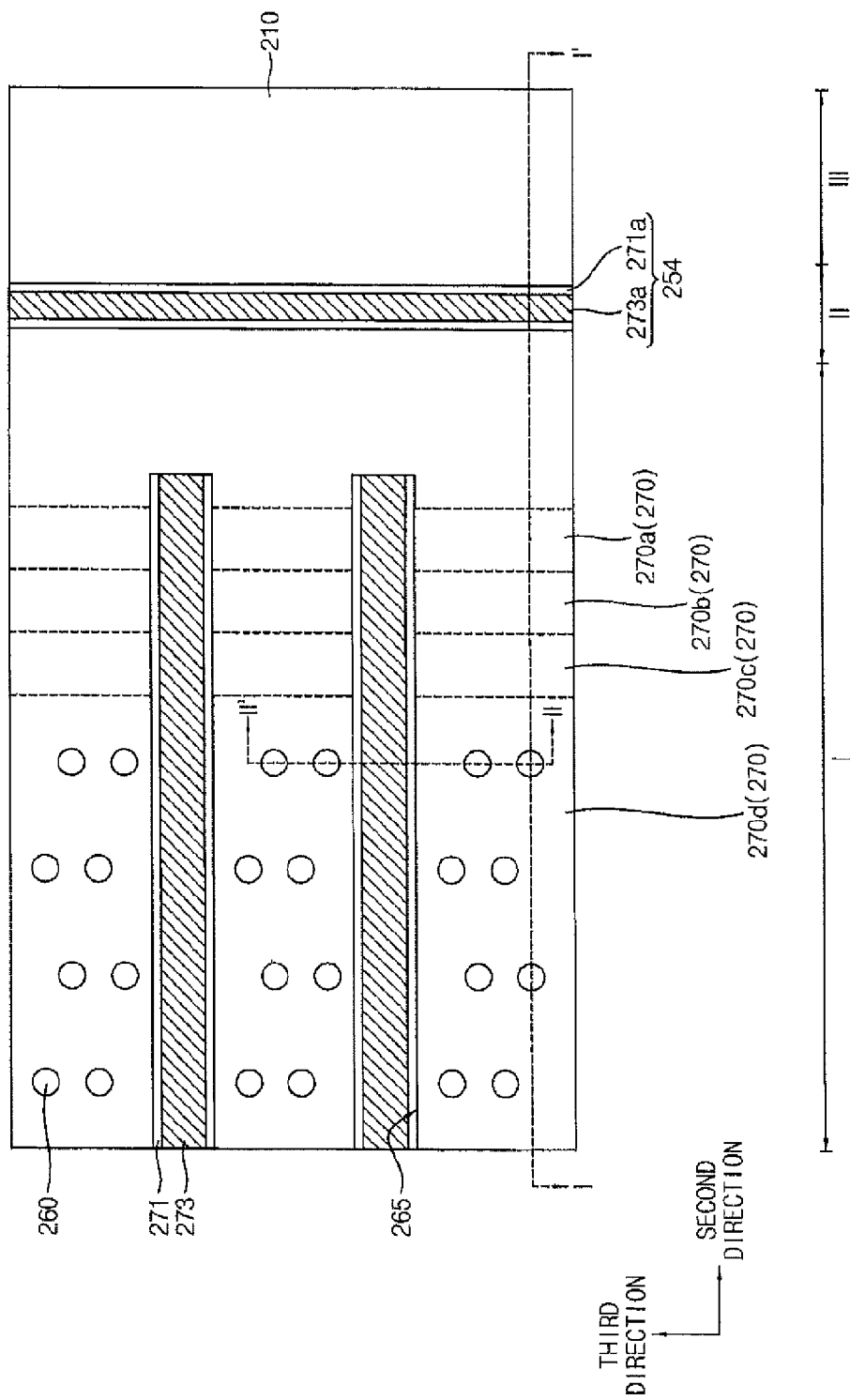
Figure 31:
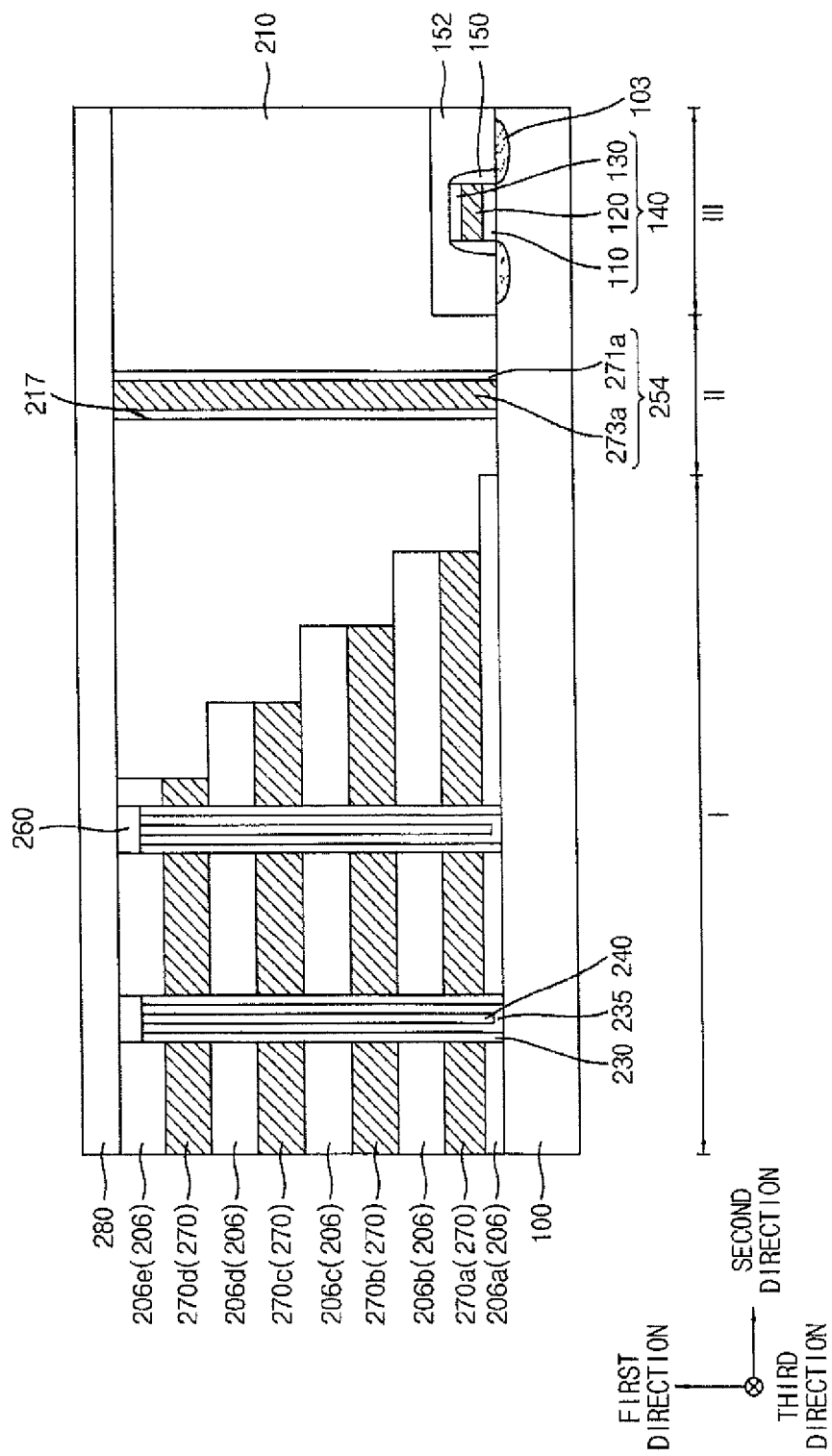
Figure 32:
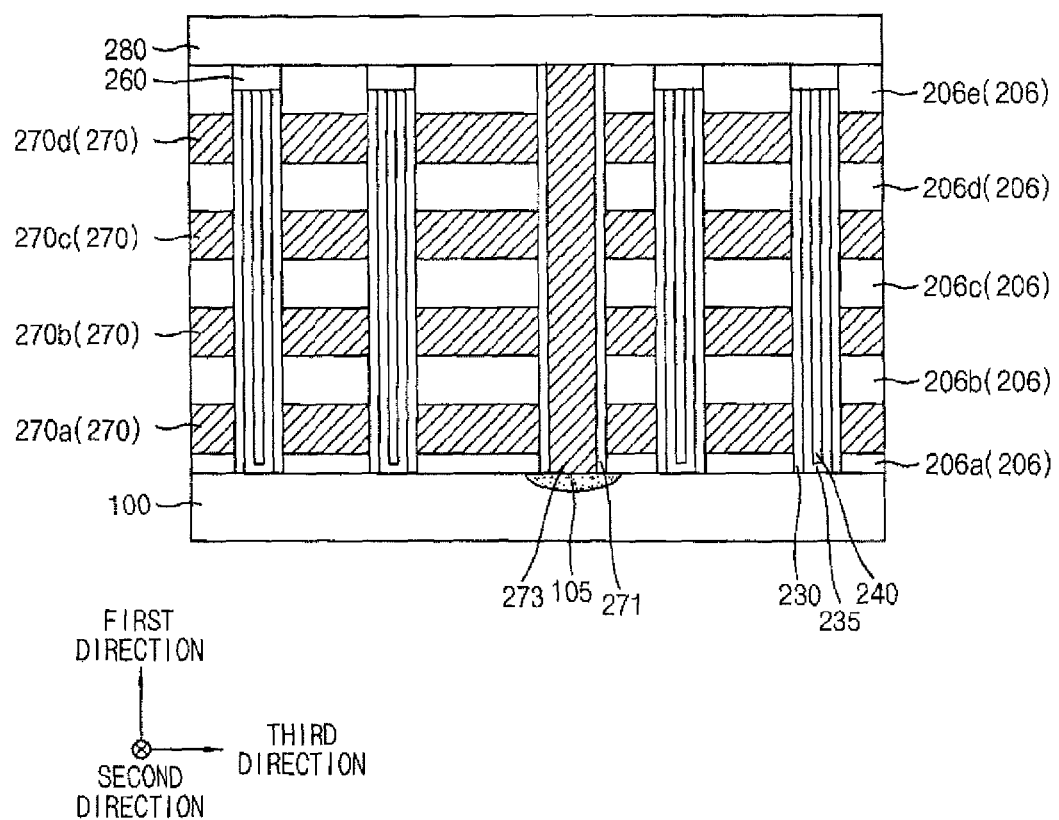

FIGS. 30 to 32 are a top plan view and cross-sectional views illustrating a vertical memory device in accordance with example embodiments. Specifically, FIG. 30 is a top plan view illustrating the vertical memory device. FIGS. 31 and 32 are cross-sectional views taken along lines I-I' and II-IF, respectively.

The vertical memory device of FIGS. 30 to 32 may have elements and/or constructions substantially the same as or similar to those illustrated with reference to FIGS. 1 to 3 except for a separation layer pattern and a blocking structure. Thus, detailed descriptions on repeated elements and/or structures are omitted, and like reference numerals are used to designate like elements.

For a convenience of explanation, an illustration of an upper insulation layer is omitted in FIG. 30.

Referring to FIGS. 30 to 32, a separation layer pattern 271 may be formed on a sidewall of a second opening 265. The second opening 265 may serve as a gate line cut region such that gate line structures may be confined by the second opening 265. The gate line structures neighboring each other may be insulated from each other by the separation layer pattern 271. A CSL 273 may be formed on sidewalls of the separation layer patterns 271 facing each other to fill a remaining portion of the second opening 265. The CSL 273 may be sandwiched between the separation layer patterns 271 in the second opening 265.

As illustrated in FIG. 32, the CSL 273 may be in contact with a second impurity region 105 formed at an upper portion of a substrate 100. In an embodiment, a metal silicide pattern may be further formed between the CSL 273 and the second impurity region so that a contact resistance may be reduced therebetween.

A first opening 217 extending in the third direction may be formed through a mold protection layer 210 on a blocking region II. A blocking structure 254 including a dummy separation layer pattern 271a and a dummy conductive line 273a may be formed in the first opening 217.

The dummy separation layer pattern 271a may be formed on sidewalls of the first opening 217, and the dummy conductive line 273a may be formed on a sidewall of the dummy separation layer pattern 271a to fill a remaining portion of the first opening 217. The dummy separation layer pattern 271a and the dummy conductive line 273a may have a dam shape or a fence shape extending in the third direction. In some embodiments, the blocking structure 254 may extend in the second and third directions. For example, the blocking structure 254 may have a fence shape surrounding a cell region I.

In example embodiments, the dummy separation layer pattern 271a may include a material substantially the same as or similar to that of the separation layer pattern 271. For example, the separation layer pattern 271 and the dummy separation layer pattern 271a may include the same silicon oxide.

In example embodiments, the CSL 273 and the dummy conductive line 273a may include substantially the same conductive material. For example, the CSL 273 and the dummy conductive line 273a may include the same metal, metal nitride or doped polysilicon. In an embodiment, the CSL 273 and the dummy conductive line 273a may include tungsten (W).

According to example embodiments, the dummy conductive line 273a of the blocking structure 254 may include the conductive material such as tungsten having a ductility. Thus, a stress generated from the cell region I may be reduced or absorbed efficiently by the dummy conductive line 273a.

FIGS. 33 to 36C are top plan views and cross-sectional views illustrating a method of manufacturing a vertical memory device in accordance with example embodiments. For example, FIGS. 33 to 36C illustrate a method of manufacturing the vertical memory device of FIGS. 30 to 32.

Figure 33:
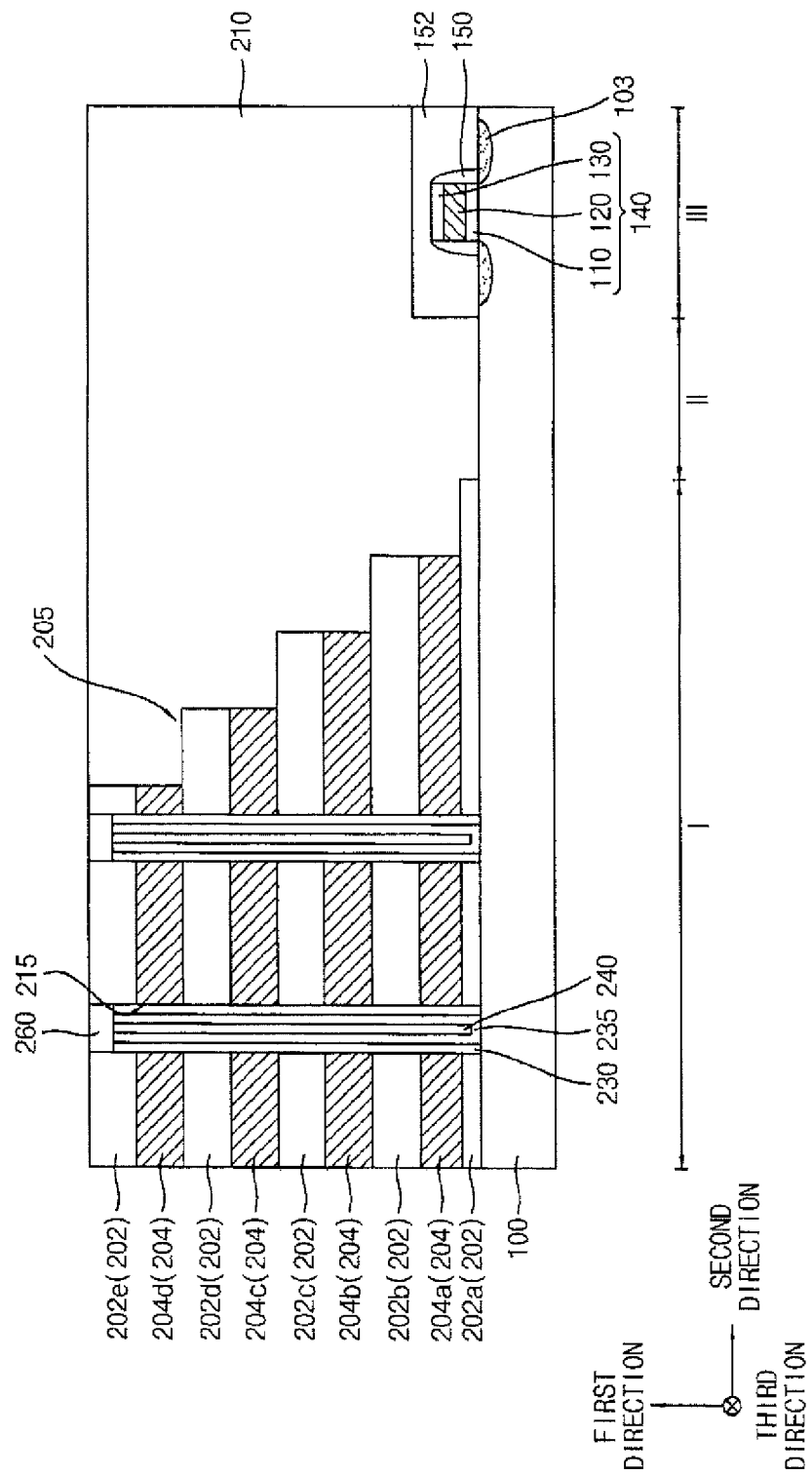
Figure 34A:
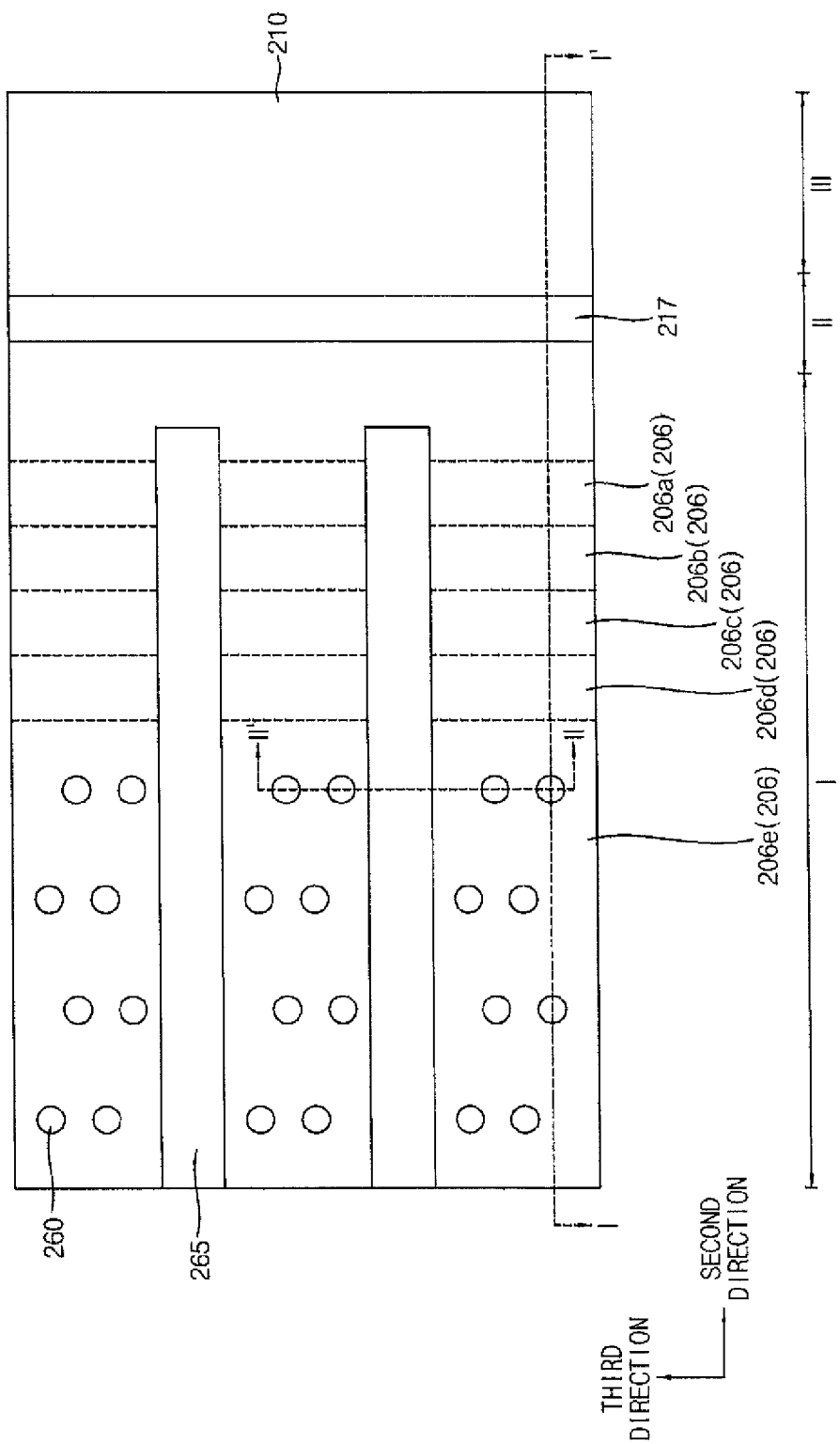
Figure 35A:
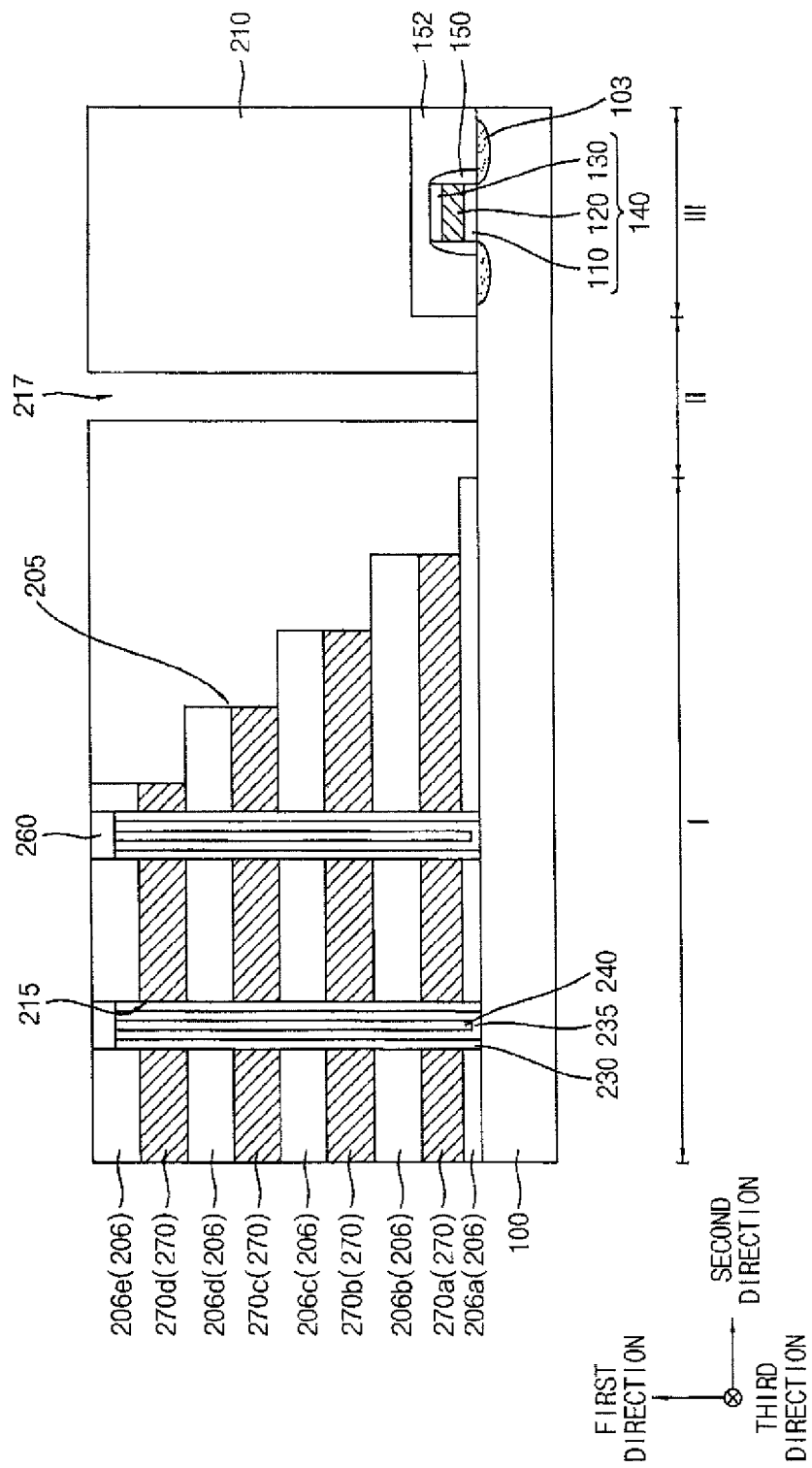
Figure 35B:
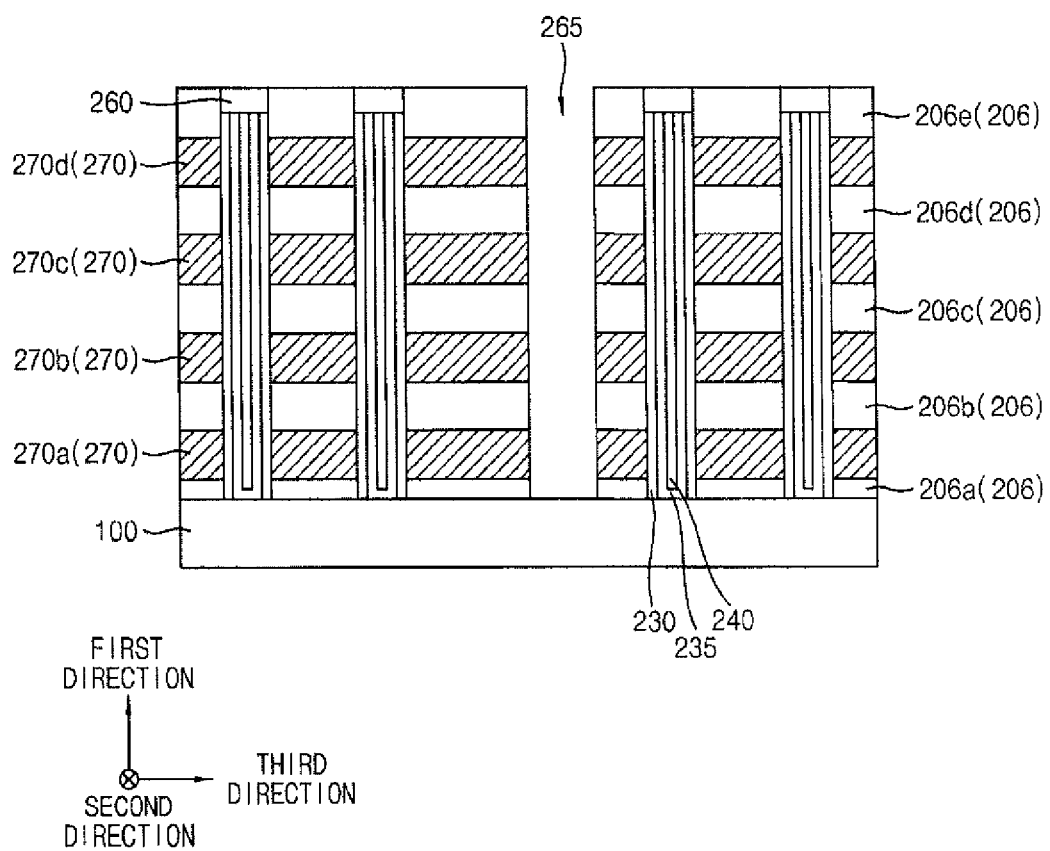
Figure 36A:
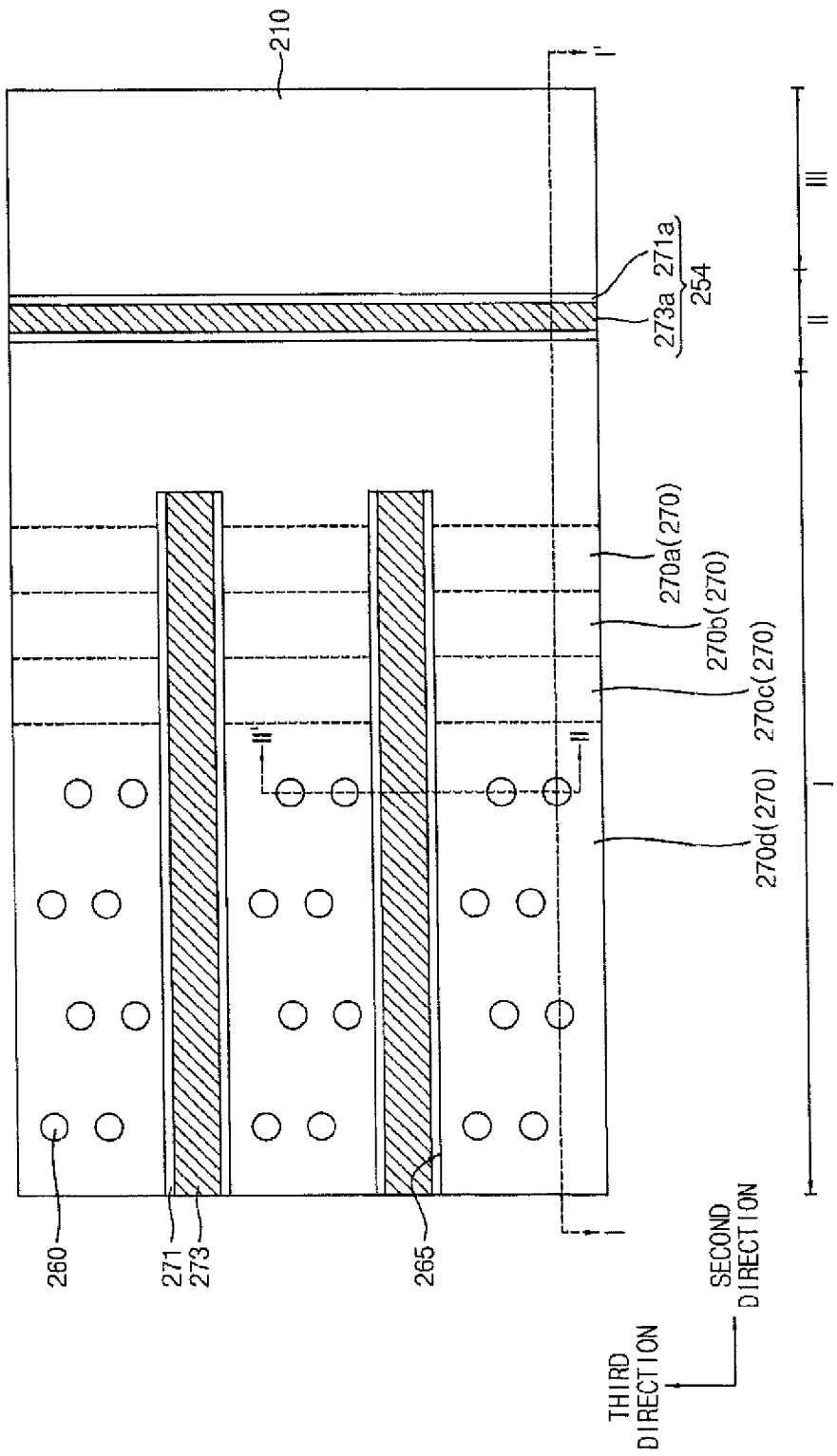

Specifically, FIGS. 34A and 36A are top plan views illustrating the method of manufacturing the vertical memory device. FIGS. 33, 34B, 35A and 36B are cross-sectional views taken along lines I-I' indicated in FIGS. 34A and 36A along the first direction. FIGS. 34C, 35B and 36C are cross-sectional views taken along lines II-IF indicated in FIGS. 34A and 36A along the first direction.

Detailed descriptions on processes and/or materials substantially the same as or similar to those illustrated with reference to FIGS. 4 to 17C, 19 to 24, or 27 to 29B are omitted herein.

Referring to FIG. 33, processes substantially the same as or similar to those illustrated with reference to FIGS. 19 to 21 may be performed. Accordingly, a gate structure 140, a gate spacer 150, a first impurity region 103 and a peripheral circuit protection layer 152 may be formed on a peripheral circuit region III of a substrate 100. A mold structure 205 may be formed on a cell region I of the substrate 100, and a mold protection layer 210 covering a lateral portion of the mold structure 205 may be formed. A plurality of channel holes 215 may be formed through the mold structure 205. A dielectric layer structure 230, a channel 235, a first filling layer pattern 240 and a pad 260 may be formed in the channel hole 215.

Figure 34B:
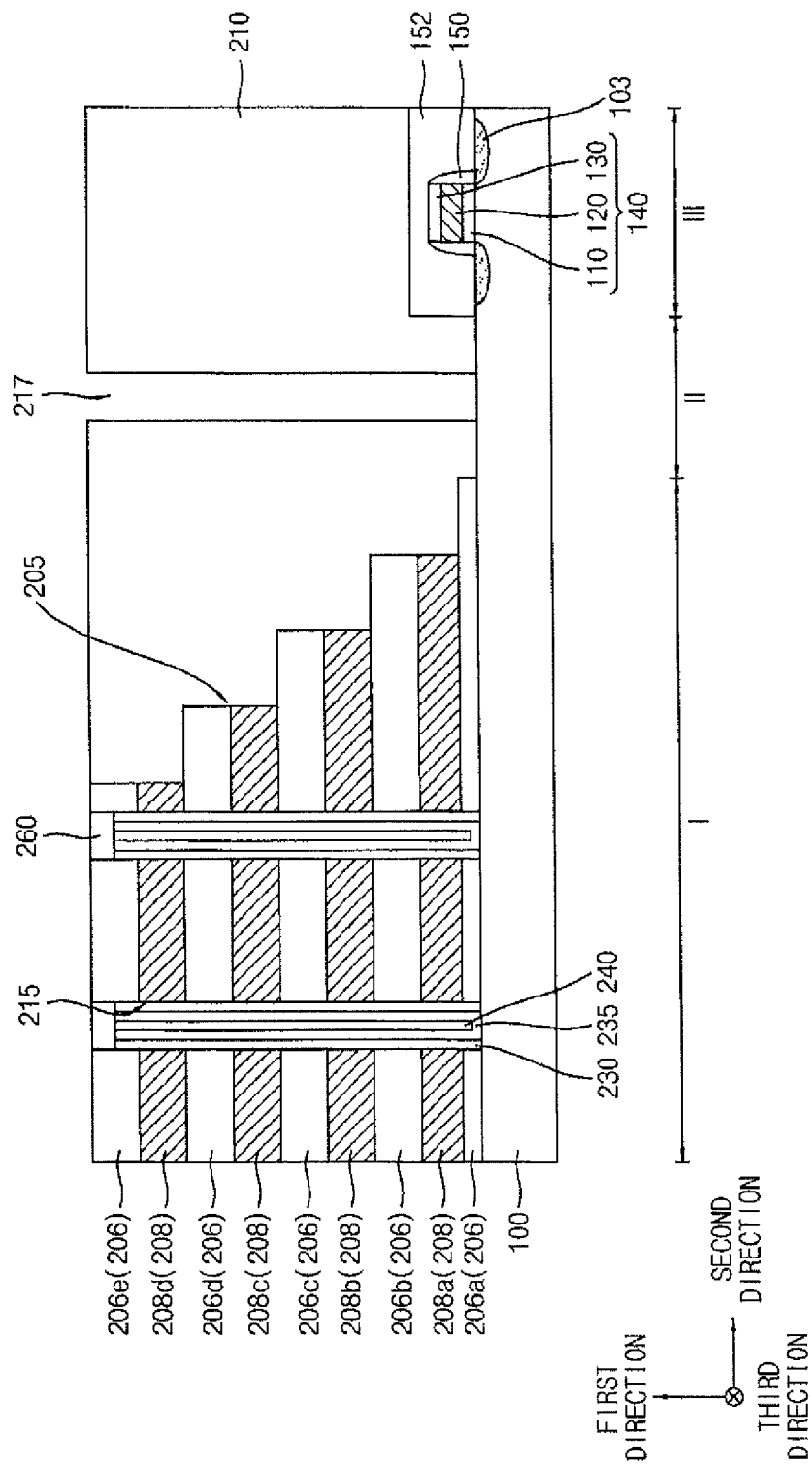
Figure 34C:
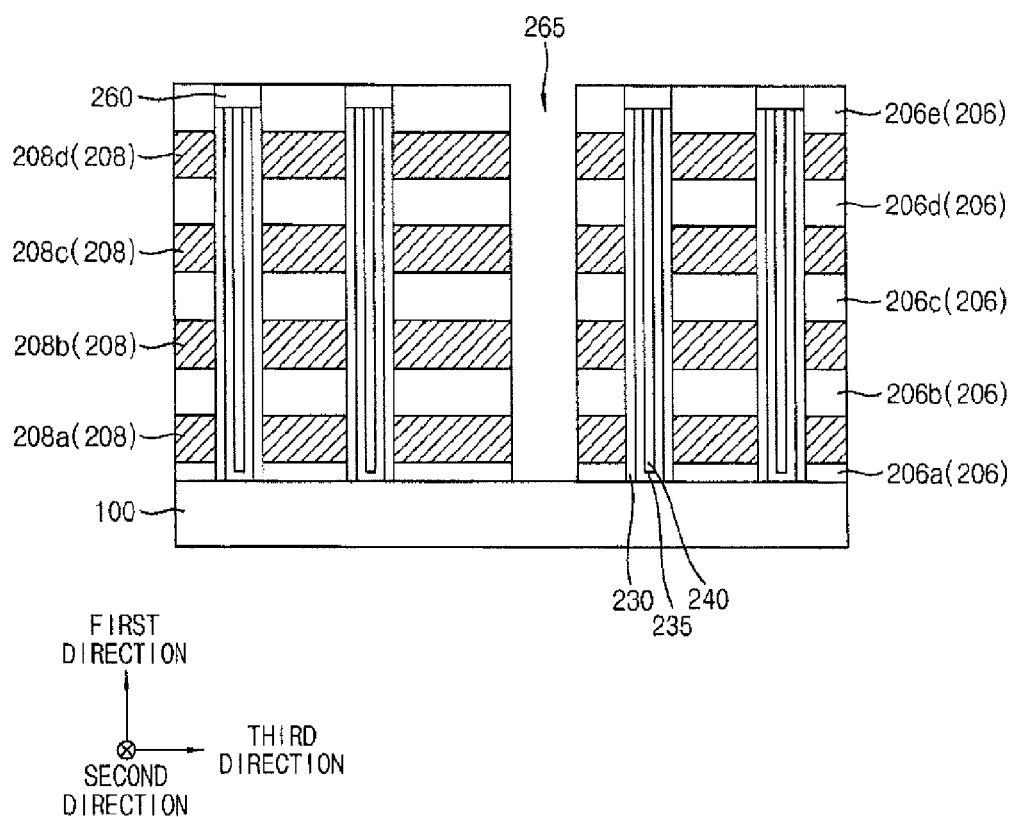

Referring to FIGS. 34A to 34C, a process substantially the same as or similar to that illustrated with reference to FIGS. 14A and 14B may be performed to form second openings 265 through the mold structure 205. The second opening 265 may extend in the second direction on the cell region I. In example embodiments, a first opening 217 may be formed through the mold protection layer 210 on a blocking region II. The first opening 217 may extend in the third direction. A top surface of the substrate 100 may be exposed through the first and second openings 217 and 265.

In example embodiments, the first and second openings 217 and 265 may be formed from substantially the same etching process using a single mask. In this case, the first and second openings 217 and 265 may be formed simultaneously.

Referring to FIGS. 35A and 35B, processes substantially the same as or similar to those illustrated with reference to FIGS. 15A to 16B are performed to replace a sacrificial layer pattern 208 of each level with a gate line 270.

Figure 36B:
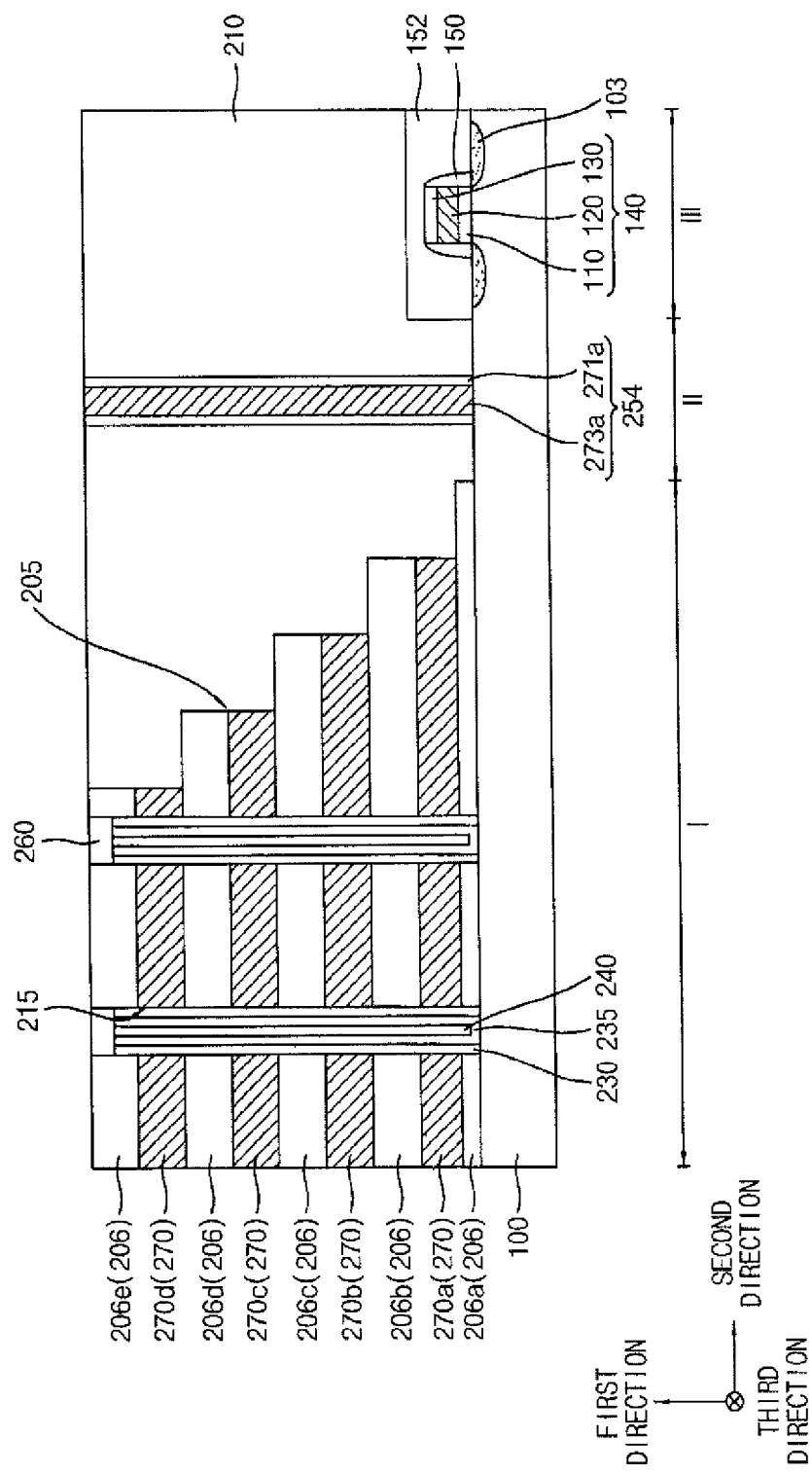
Figure 36C:
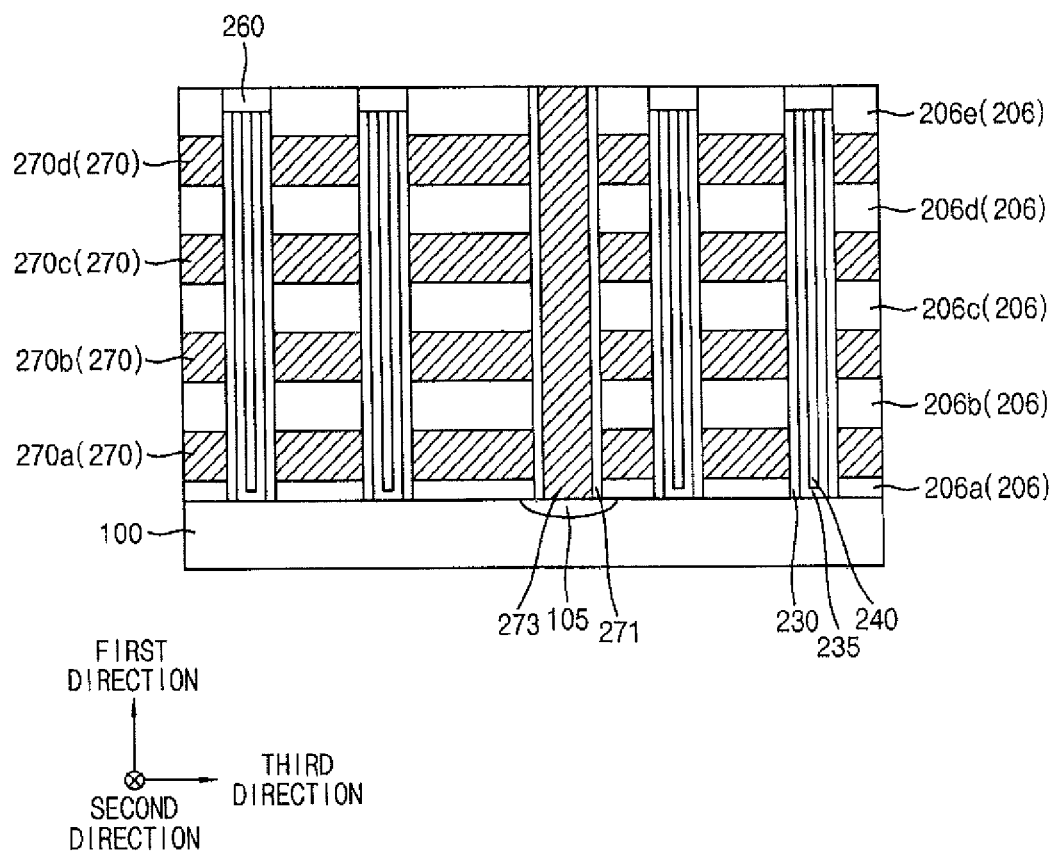

Referring to FIGS. 36A to 36C, a blocking structure 254 including a dummy separation layer pattern 271a and a dummy conductive line 273a may be formed in the first opening 217. A separation layer pattern 271 and a CSL 273 may be formed in the second opening 265.

In example embodiments, impurities may be implanted into an upper portion of the substrate 100 exposed through the second opening 265 to form a second impurity region 105. A separating insulation layer may be formed on an uppermost insulating interlayer pattern 206e, a top surface of the mold protection layer 210, and on bottoms and sidewalls of the first and second openings 217 and 265. Portions of the separating insulation layer formed on the bottoms of the first and second openings 217 and 265 may be removed by, e.g., an etch-back process. Accordingly, the top surface of the substrate 100 may be exposed again through the first and second openings 217 and 265. A conductive layer filling remaining portions of the first and second openings 217 and 265 may be formed on the separating insulation layer and the top surface of the substrate 100. Upper portions of the separating insulation layer and the conductive layer may be planarized by, e.g., a CMP process until the uppermost insulating interlayer pattern 206e and the mold protection layer 210 are exposed such that the dummy separation layer pattern 271a, the dummy conductive line 273a, the separation layer pattern 271 and the CSL 273 may be formed.

In example embodiments, the conductive layer may be formed using a metal, a metal nitride or doped polysilicon by, e.g., an ALD process or a sputtering process. In an embodiment, the conductive layer may be formed using a ductile metal, e.g., tungsten. An upper insulation layer 280 may be formed on the uppermost insulating interlayer pattern 206e, the pad 260, the mold protection layer 210, the dummy separation layer pattern 271a, the dummy conductive line 273a, the separation layer pattern 271 and the CSL 273. Accordingly, the vertical memory device of FIGS. 30 to 32 may be manufactured.

Figure 37:
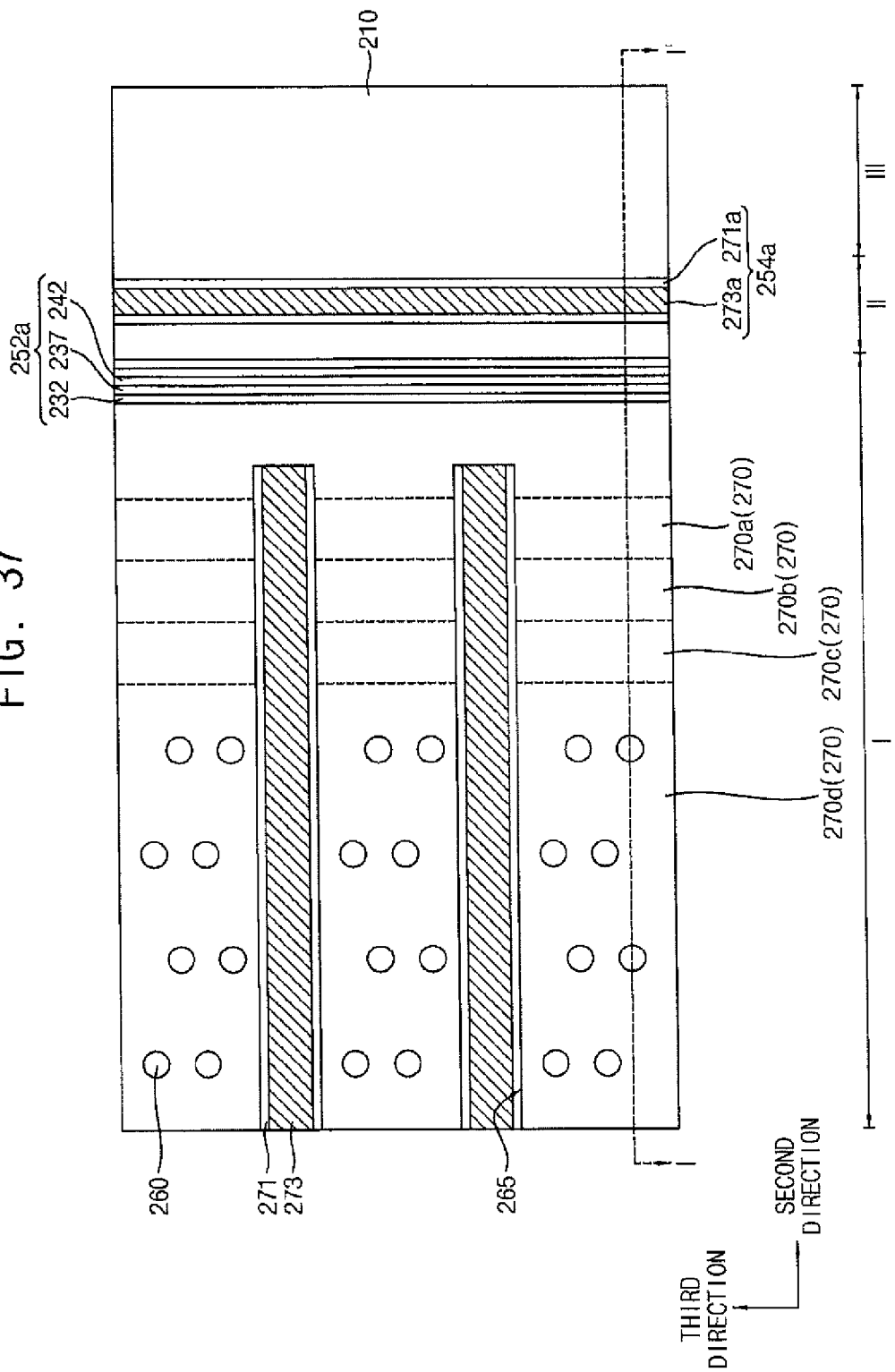
Figure 38:
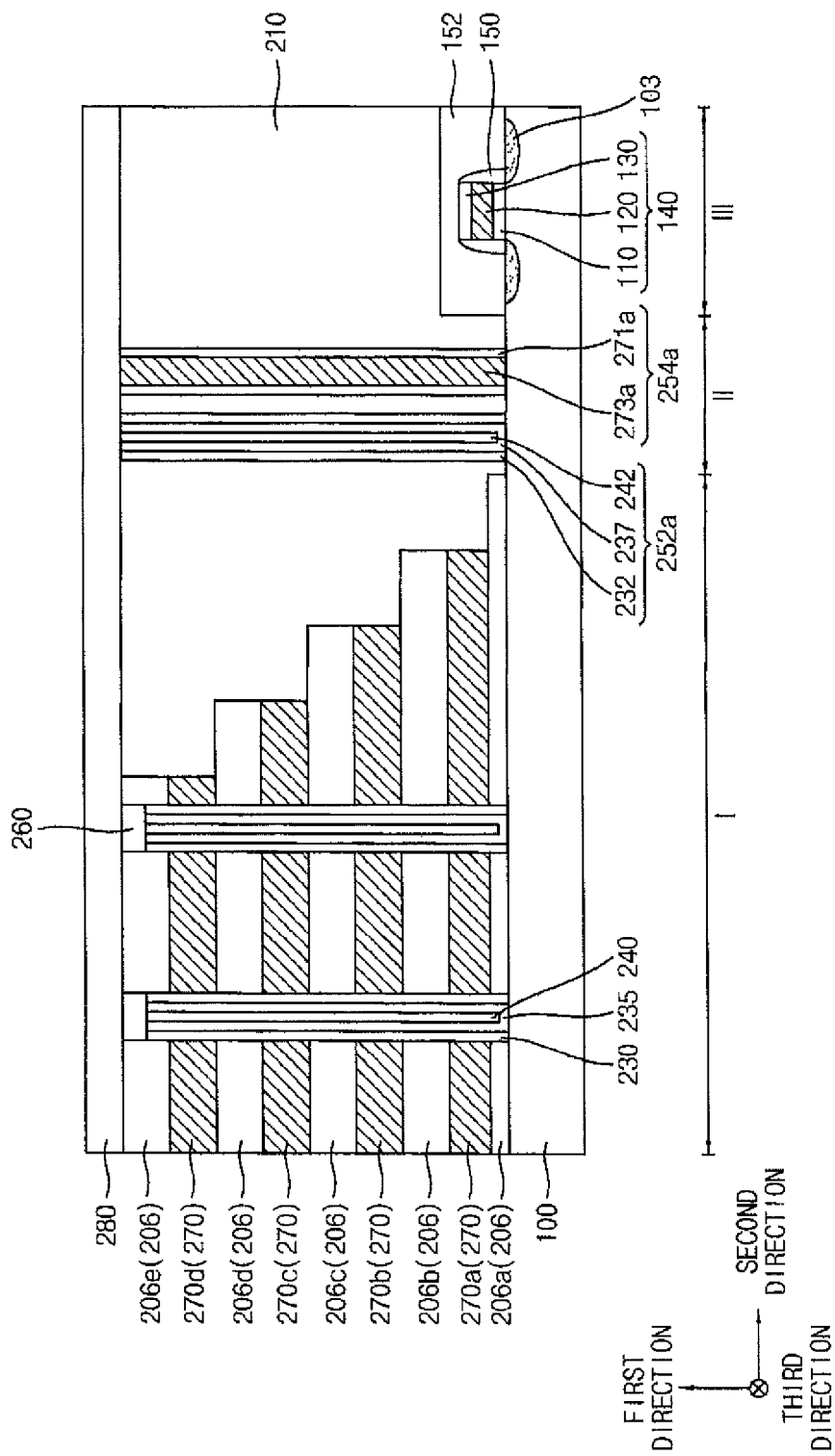

FIGS. 37 and 38 are a top plan view and a cross-sectional view, respectively, illustrating a vertical memory device in accordance with example embodiments. Specifically, FIG. 38 is a cross-sectional view taken along a line I-I' of FIG. 37.

The vertical memory device of FIGS. 37 and 38 may have elements and/or constructions substantially the same as or similar to those illustrated with reference to FIGS. 1 to 3, or FIGS. 30 to 32 except for a blocking structure. Thus, detailed descriptions on repeated elements and/or structures are omitted herein, and like reference numerals are used to designate like elements.

For a convenience of explanation, an illustration of an upper insulation layer is omitted in FIG. 37.

Referring to FIGS. 37 and 38, a first blocking structure 252a and a second blocking structure 254a may be disposed on a blocking region II of a substrate 100.

In example embodiments, the first blocking structure 252a may have a shape or a structure substantially the same as or similar to that of the blocking structure 250 illustrated in FIGS. 1 to 3. For example, the first blocking structure 252a may extend through a mold protection layer 210 and extend in the third direction. The first blocking structure 252a may have a stacked structure including a dummy dielectric layer 232, a dummy channel 237 and a second filling layer pattern 242. In some embodiments, the first blocking structure 252a may extend in the second and third directions. For example, the first blocking structure 252a may have a fence shape surrounding a cell region I.

The second blocking structure 254a may have a shape or a structure substantially the same as or similar to that of the blocking structure 254 illustrated in FIGS. 30 to 32. For example, the first blocking structure 254a may extend through the mold protection layer 210 and extend in the third direction. The second blocking structure 254a may include a dummy separation layer pattern 271a and a dummy conductive line 273a. In some embodiments, the second blocking structure 254a may extend in the second and third directions. For example, the second blocking structure 254a may have a fence shape surrounding the cell region I.

In example embodiments, the first blocking structure 252a may be formed by deposition and/or etching processes for the formations of a dielectric layer structure 230, a channel 235 and a first filling layer pattern 240 of the cell region I. The second blocking structure 254a may be formed by deposition and/or etching processes for the formations of a separation layer pattern 271 and a CSL 273 on the cell region I.

The vertical memory device of FIGS. 37 and 38 may be manufactured by a combination of the methods illustrated in FIGS. 4 to 17B, and FIGS. 33 to 36C. Thus, detailed descriptions on methods of manufacturing the vertical memory device of FIGS. 37 and 38 are omitted herein.

Figure 39:
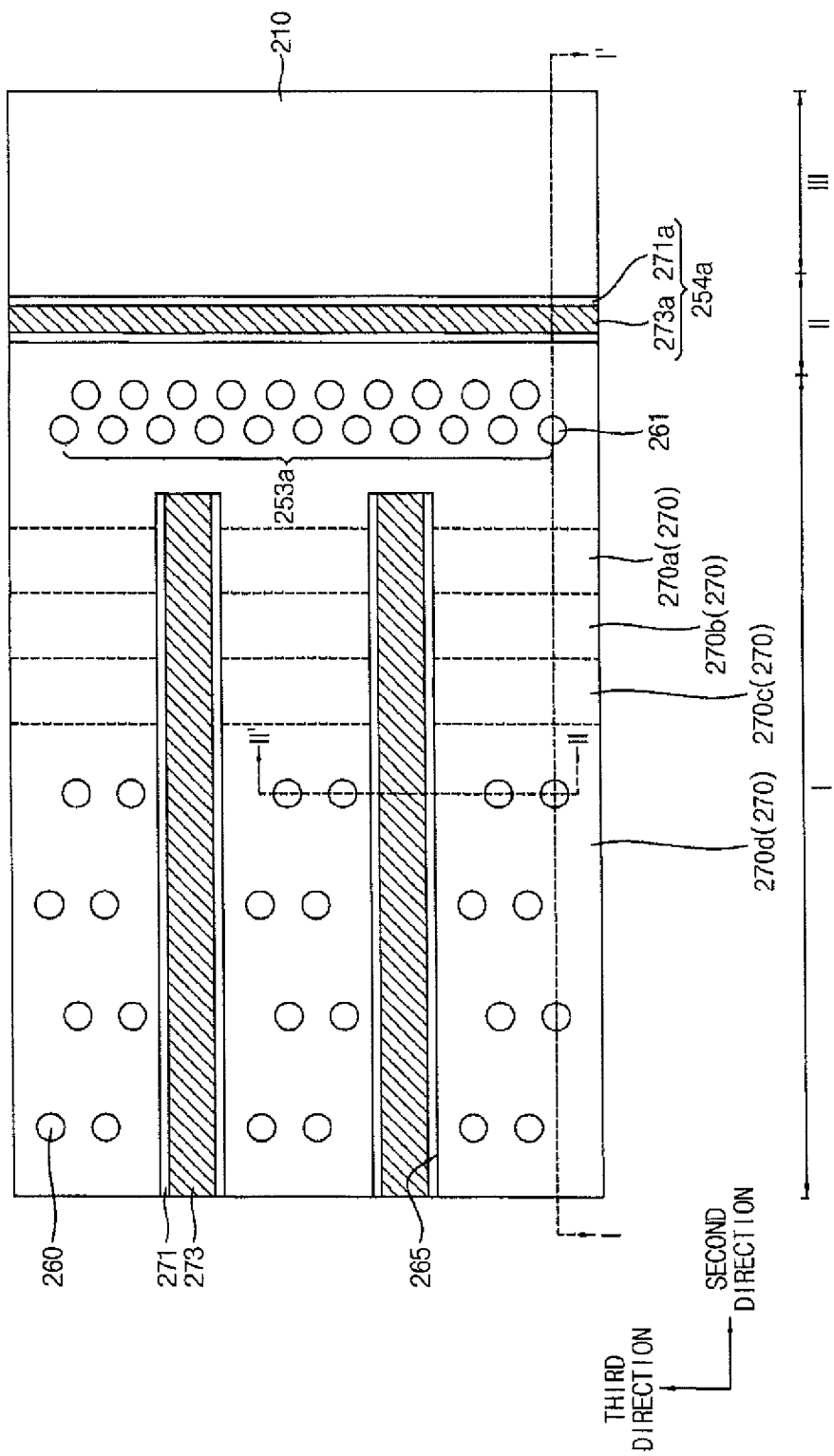
Figure 40:
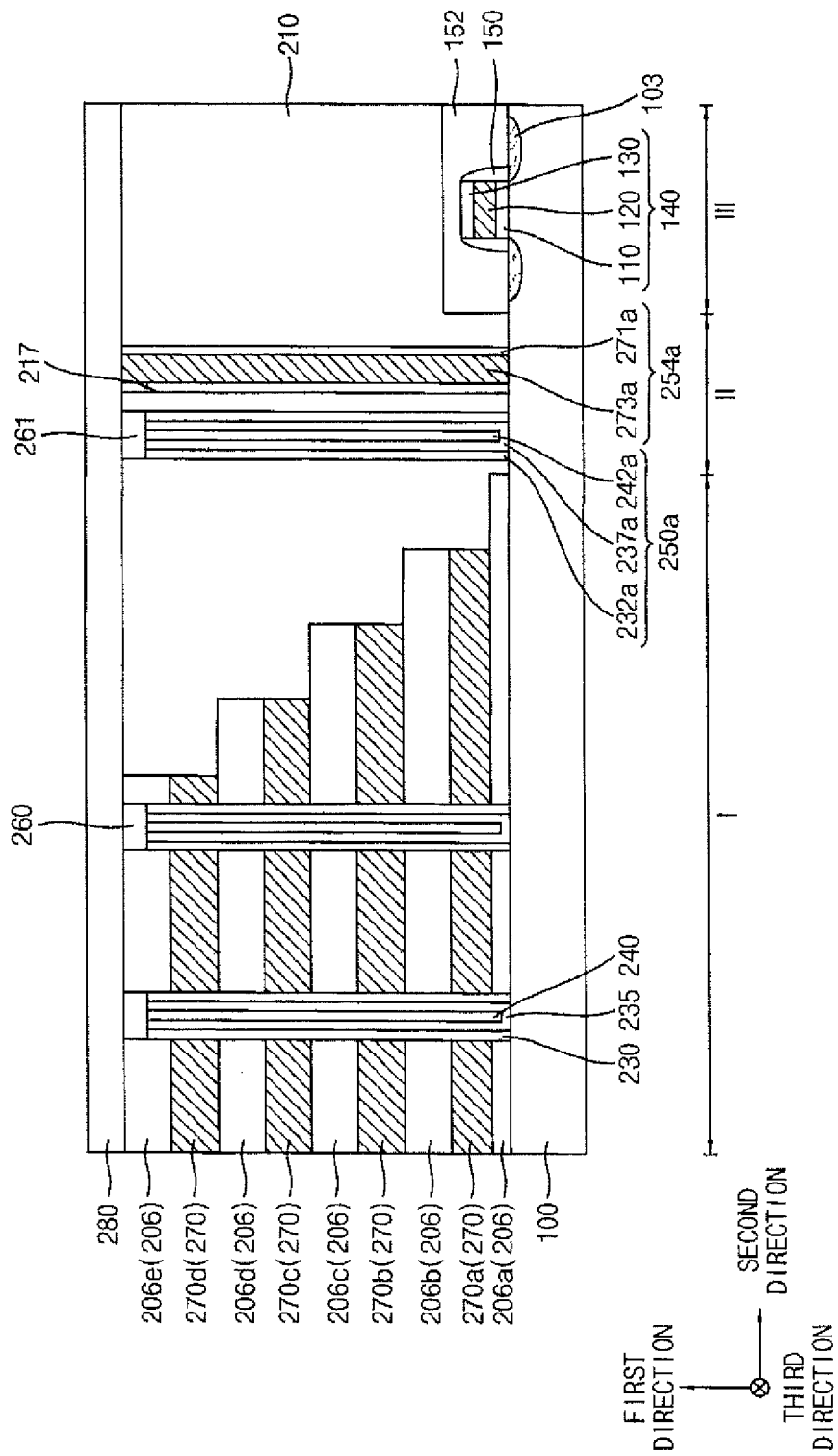

FIGS. 39 and 40 are a top plan view and a cross-sectional view, respectively, illustrating a vertical memory device in accordance with example embodiments. Specifically, FIG. 40 is a cross-sectional view taken along a line I-I' of FIG. 39.

The vertical memory device of FIGS. 39 and 40 may have elements and/or constructions substantially the same as or similar to those illustrated with reference to FIGS. 25 and 26, or FIGS. 30 to 32 except for a blocking structure. Thus, detailed descriptions on repeated elements and/or structures are omitted, and like reference numerals are used to designate like elements.

For a convenience of explanation, an illustration of an upper insulation layer is omitted in FIG. 39.

Referring to FIGS. 39 and 40, a first blocking structure 253a and a second blocking structure 254a may be disposed on a blocking region II of a substrate 100.

In example embodiments, the blocking structure 253a may have a shape and a structure substantially the same as or similar to that of the blocking structure 253 illustrated in FIGS. 25 and 26. For example, the first blocking structure 253a may include at least one dummy channel column having a plurality of dummy channel structures 250a. The dummy channel structure 250a may include a dummy dielectric layer structure 232a, a dummy channel 237a, a second filling layer pattern 242a and a dummy pad 261. In example embodiments, the first blocking structure 253a may be arranged in the second and third directions. For example, the first blocking structure 253a may be arranged as a fence shape surrounding a cell region I.

The second blocking structure 254a may have a shape and a structure substantially the same as or similar to that of the blocking structure 254 illustrated in FIGS. 30 to 32. For example, the second blocking structure 254a may be formed through a mold protection layer 210 and may extend in the third direction. The second blocking structure 254a may include a dummy separation layer pattern 271a and a dummy conductive line 273a. In example embodiments, the second blocking structure 254a may extend in the second and third directions. For example, the second blocking structure 254a may have a fence shape surrounding the cell region I.

In example embodiments, the first blocking structure 253a may be formed by deposition and/or etching processes for the formations of a dielectric layer structure 230, a channel 235, a first filling layer pattern 240 and a pad 260 of the cell region I. The second blocking structure 254a may be formed by deposition and/or etching processes for the formations of a separation layer pattern 271 and a CSL 273 on the cell region I.

The vertical memory device of FIGS. 39 and 40 may be manufactured by a combination of the methods illustrated in FIGS. 27 to 29B, and FIGS. 33 to 36C. Thus, detailed descriptions on methods of manufacturing the vertical memory device of FIGS. 39 and 40 are omitted herein.

According to example embodiments illustrated in FIGS. 37 to 40, the blocking structure having, e.g., a dual structure may be disposed on the blocking region II, so that a stress propagation from the cell region I to a peripheral circuit region III may be efficiently prevented.

Figure 41A:
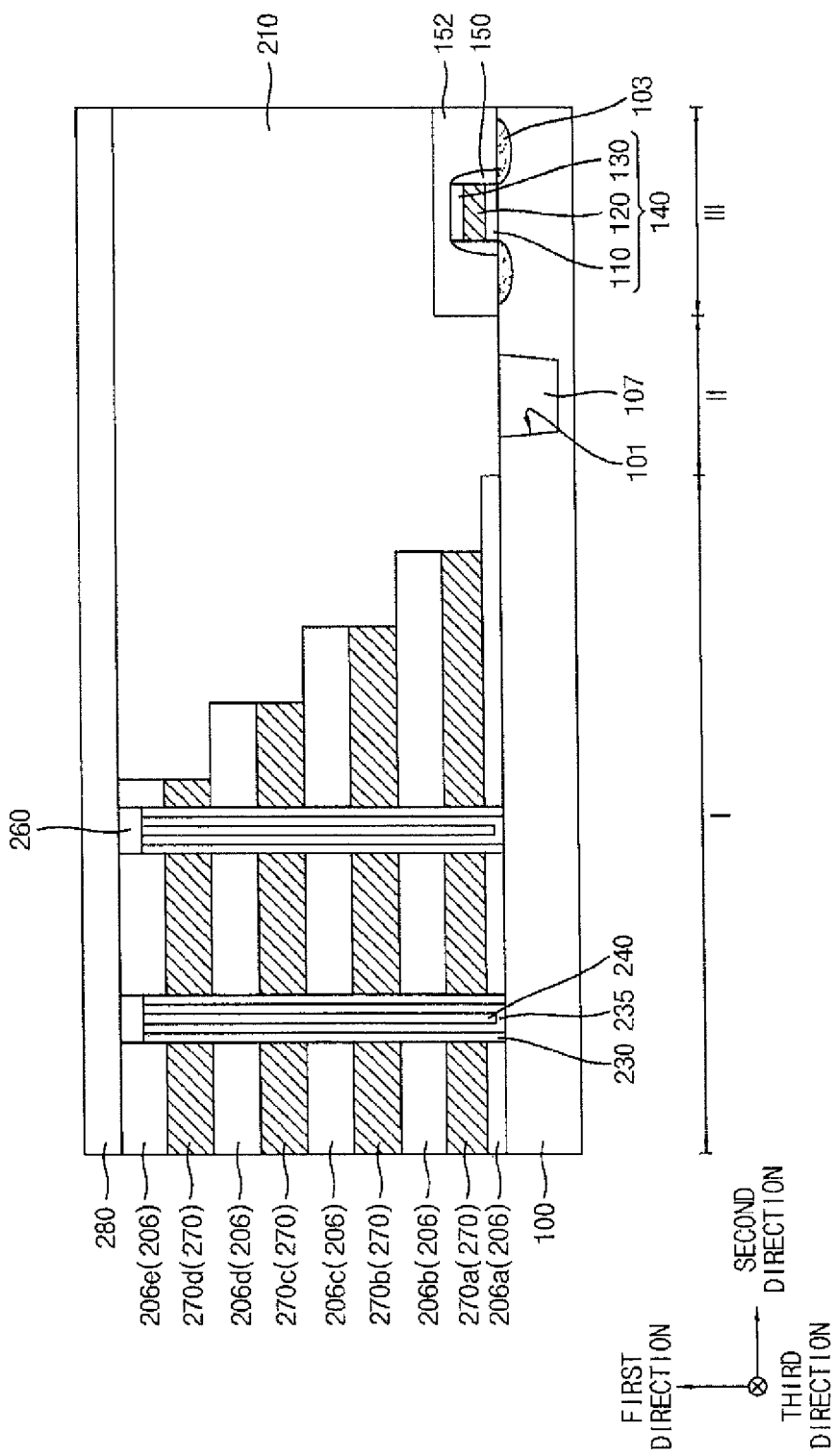
FIGS. 41A and 41B are cross-sectional views illustrating vertical memory devices in accordance with example embodiments.
Figure 41B:
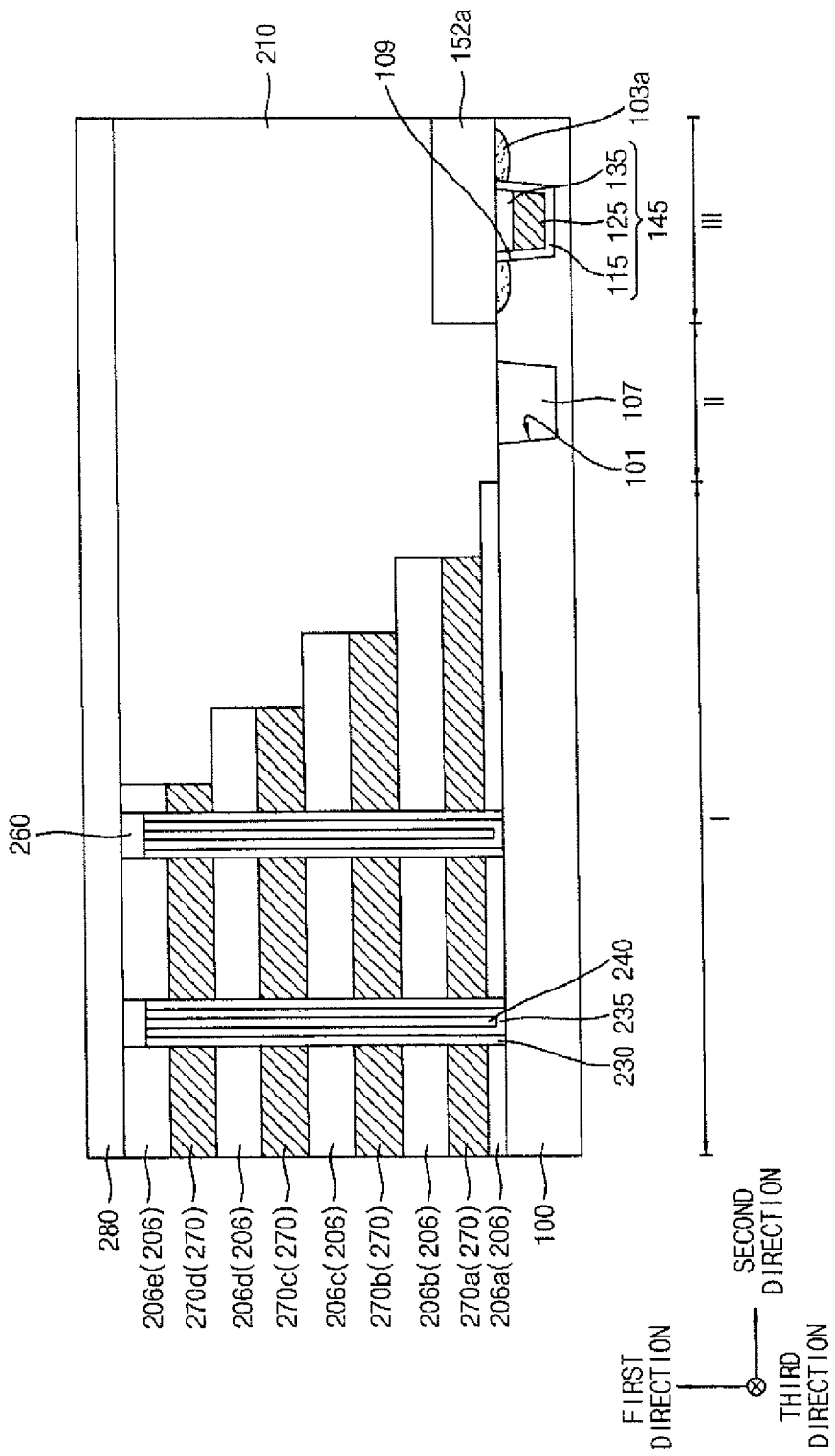

FIGS. 41A and 41B are cross-sectional views illustrating vertical memory devices in accordance with example embodiments. The vertical memory devices of FIGS. 41A and 41B may have elements and/or constructions substantially the same as or similar to those illustrated with reference to FIGS. 1 to 3 except for a blocking structure and/or a gate structure. Thus, detailed descriptions on repeated elements and/or structures are omitted, and like reference numerals are used to designate like elements.

Referring to FIG. 41A, a blocking structure 107 may be buried or embedded in a substrate 100 of a blocking region II. In example embodiments, a trench 101 may be formed at a portion of the substrate 100 of the blocking region II. The blocking structure 107 may fill the trench 101 and may have a linear shape in the third direction. For example, an insulation layer sufficiently filling the trench 101 may be formed on the substrate 100 using, e.g., silicon oxide or silicon nitride. An upper portion of the insulation layer may be planarized until a top surface of the substrate 100 is exposed to form the blocking structure 107. In some embodiments, the trench 101 and the blocking structure 107 may extend in the second and third directions. In this case, the trench 101 and the blocking structure 107 may have a fence shape surrounding a cell region I.

According to example embodiments described above, the blocking structure 107 may be buried in the substrate 100 so that a failure including a dislocation or a crack between the top surface of the substrate 100 and a bottom of a gate structure 140 may be avoided by preventing a stress of the cell region I from being transferred to a peripheral circuit region III through the substrate 100.

In an embodiment, in addition to the blocking structure 107 buried in the substrate 100, at least one blocking structure illustrated with reference to FIGS. 1 to 3, 18, 25 and 26, 30 and 31, 37 and 38, or 39 and 40 may be further formed on the blocking region II.

Referring to FIG. 41B, a gate structure having a buried gate may be formed in a substrate 100 of a peripheral circuit region III.

For example, a first impurity region 103a may be formed at an upper portion of the substrate 100 of the peripheral circuit region III, and the upper portion of the substrate 100 may be etched to form a recess 109. A gate insulation layer pattern 115 may be formed on a bottom and a sidewall of the recess 109 by, e.g., a thermal oxidation process. A conductive layer filling the recess 109 may be formed on the gate insulation layer pattern 115. An upper portion of the conductive layer may be removed by an etch-back process to form a buried gate 125. A gate mask 135 filling a remaining portion of the recess 109 may be formed on the buried gate 125. The gate mask 135 may be formed using, e.g., silicon nitride.

Accordingly, a buried gate structure 145 including the gate insulation layer pattern 115, the buried gate 125 and the gate mask 135 may be formed in the substrate 100 of the peripheral circuit region III. In an embodiment, a peripheral circuit protection layer 152a may be further formed on the substrate 100 of the peripheral circuit region III to cover the first impurity region 103a, the gate insulation layer pattern 115 and the gate mask 135.

In the case that the gate structure is embedded or buried in the substrate 100 of the peripheral circuit region III as illustrated in FIG. 41B, a stress from a cell region I may be transferred through the substrate 100 to cause a defect of the gate structure. However, according to example embodiments, the blocking structure 107 may be buried in the substrate 100 of the blocking region II to prevent the defects of the gate structure.

Figure 42:
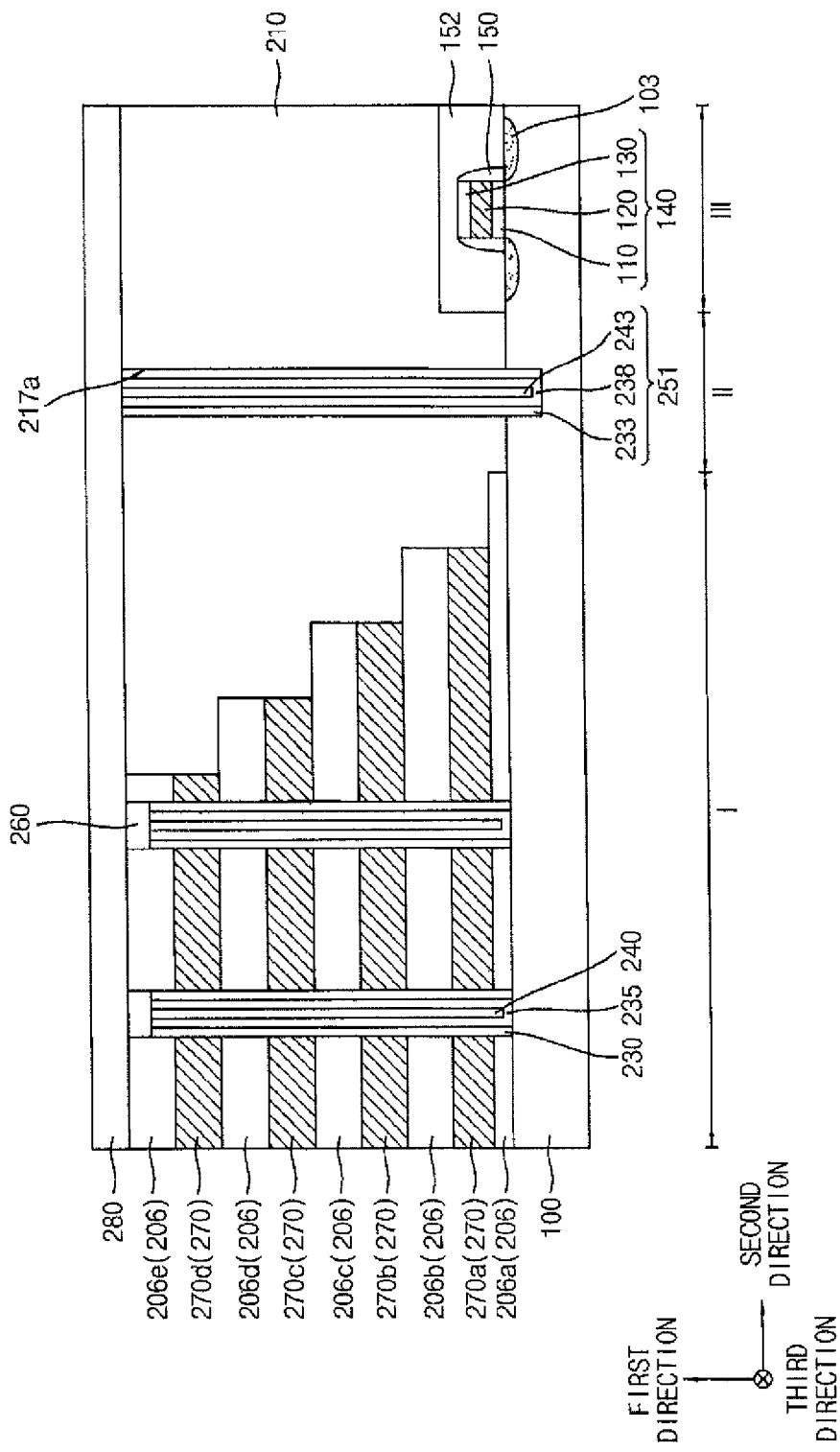
Figure 43:
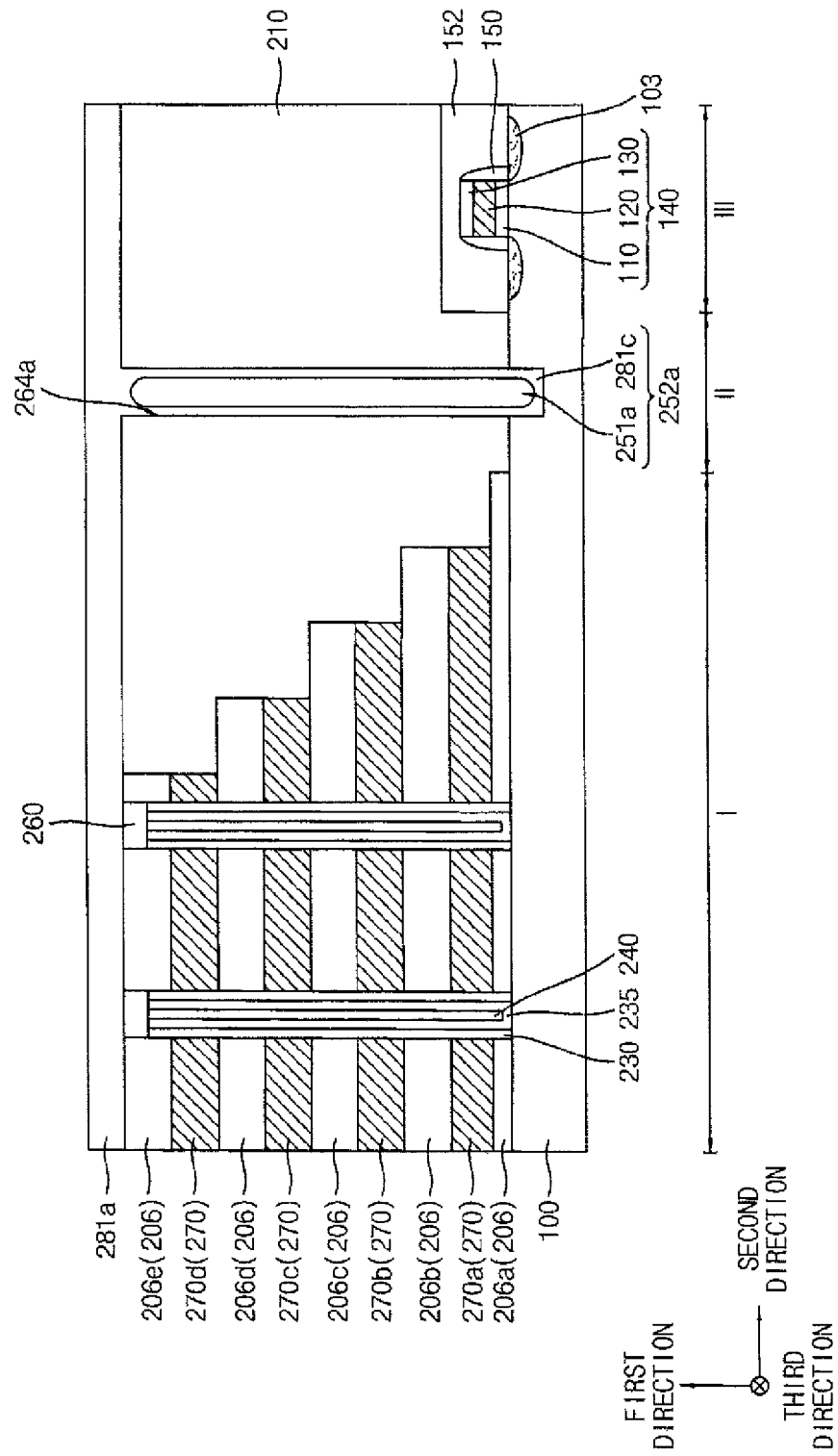
Figure 44:
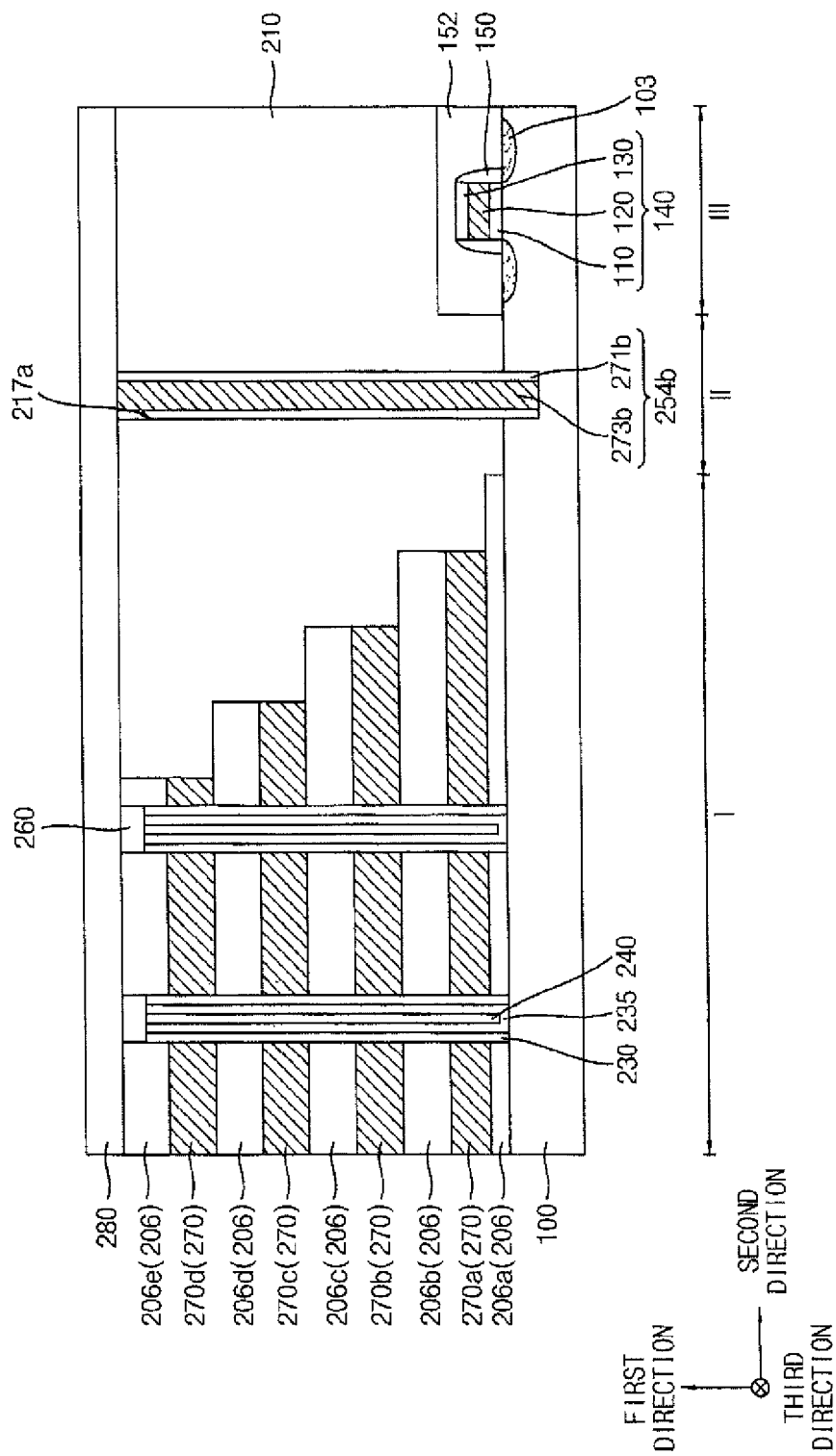

FIGS. 42 to 44 are cross-sectional views illustrating vertical memory devices in accordance with example embodiments. For example, FIGS. 42, 43 and 44 illustrate modified example embodiments of the vertical memory devices illustrated in FIGS. 2, 18 and 31, respectively.

Referring to FIG. 42, a blocking structure 251 including a dummy dielectric layer 233, a dummy channel 238 and a second filling layer pattern 243 may extend through a mold protection layer 210 and may extend in a substrate 100 to be partially buried therein. For example, the substrate 100 of a blocking region II may be partially etched during a formation of a first opening 217a for the blocking structure 251, such that the first opening 217a may extend in the substrate 100. Subsequently, processes substantially the same as or similar to those illustrated with reference to FIGS. 8 to 11B may be performed to form the blocking structure 251 including the dummy dielectric layer 233, the dummy channel 238 and the second filling layer pattern 243 stacked in the first opening 217a.

Referring to FIG. 43, a blocking structure 252a may include an air gap 251a, and the air gap 251a may extend in a substrate 100. For example, the substrate 100 of a blocking region II may be partially etched during a formation of a first opening 264a for the blocking structure 252a, such that the first opening 264a may also extend in the substrate 100. Subsequently, as illustrated in FIG. 24, an upper insulation layer 281a may be formed on a mold protection layer 210 to form a partial filling layer 281c in the first opening 264a, and the air gap 251a extending in the mold protection layer 210 and in the substrate 100.

Referring to FIG. 44, a blocking structure 254b including a dummy separation layer pattern 271b and a dummy conductive line 273b may extend through a mold protection layer 210 and may extend in a substrate 100 to be partially buried therein. For example, the substrate 100 of a blocking region II may be partially etched during a formation of a first opening 217a for the blocking structure 254b, such that the first opening 217a may extend in the substrate 100. Subsequently, processes substantially the same as or similar to those illustrated with reference to FIGS. 38A and 38B may be performed to form the dummy separation layer pattern 271b and the dummy conductive line 273b extending to an upper portion of the substrate 100 in the first opening 217a.

In example embodiments illustrated in FIGS. 42 to 44, a buried gate structure 145 illustrated in FIG. 41B may be formed on a peripheral circuit region III.

Figure 45A:
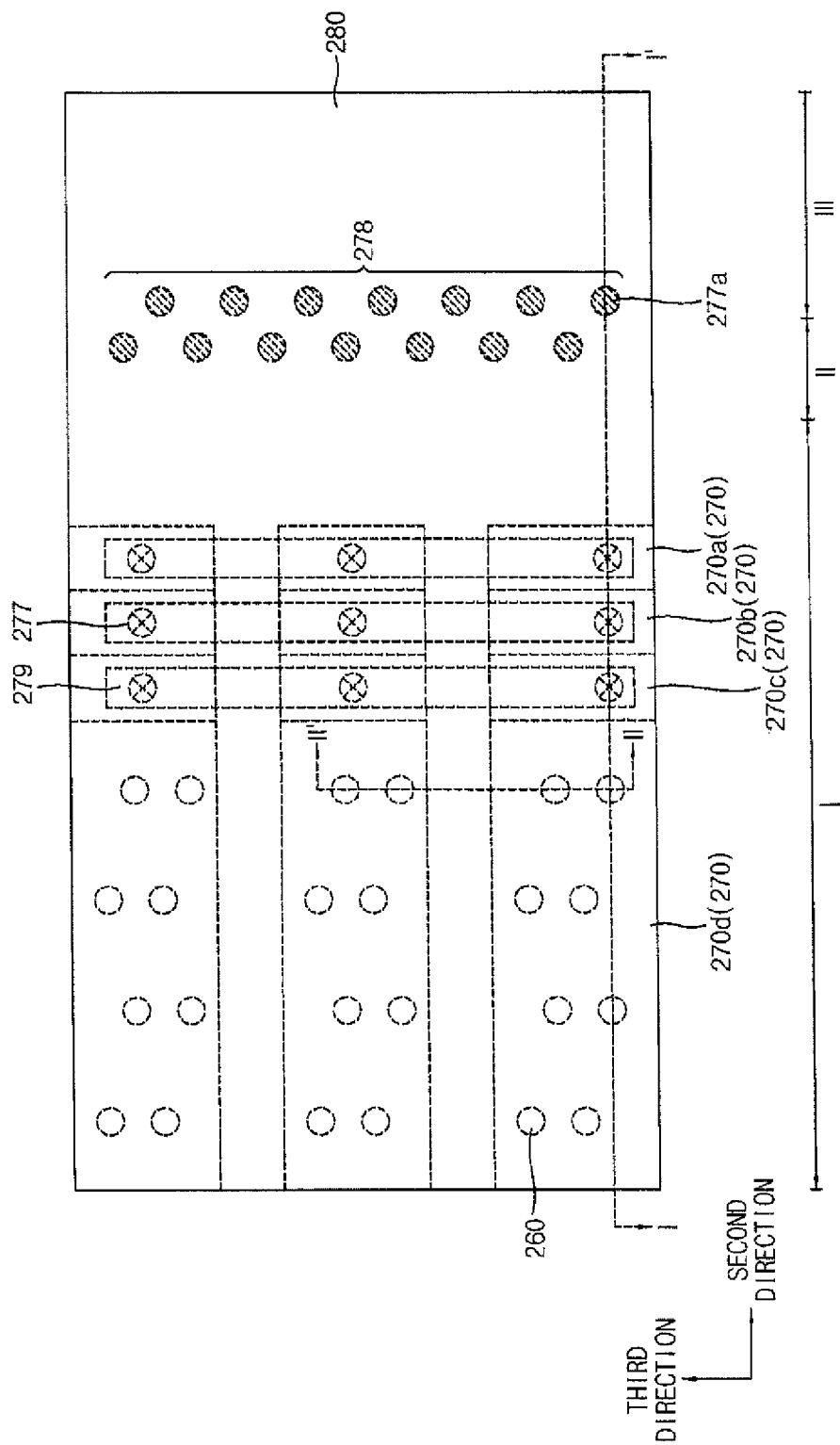
FIGS. 45A and 45B are a top plan view and a cross-sectional view, respectively, illustrating a vertical memory device in accordance with example embodiments.
Figure 45B:
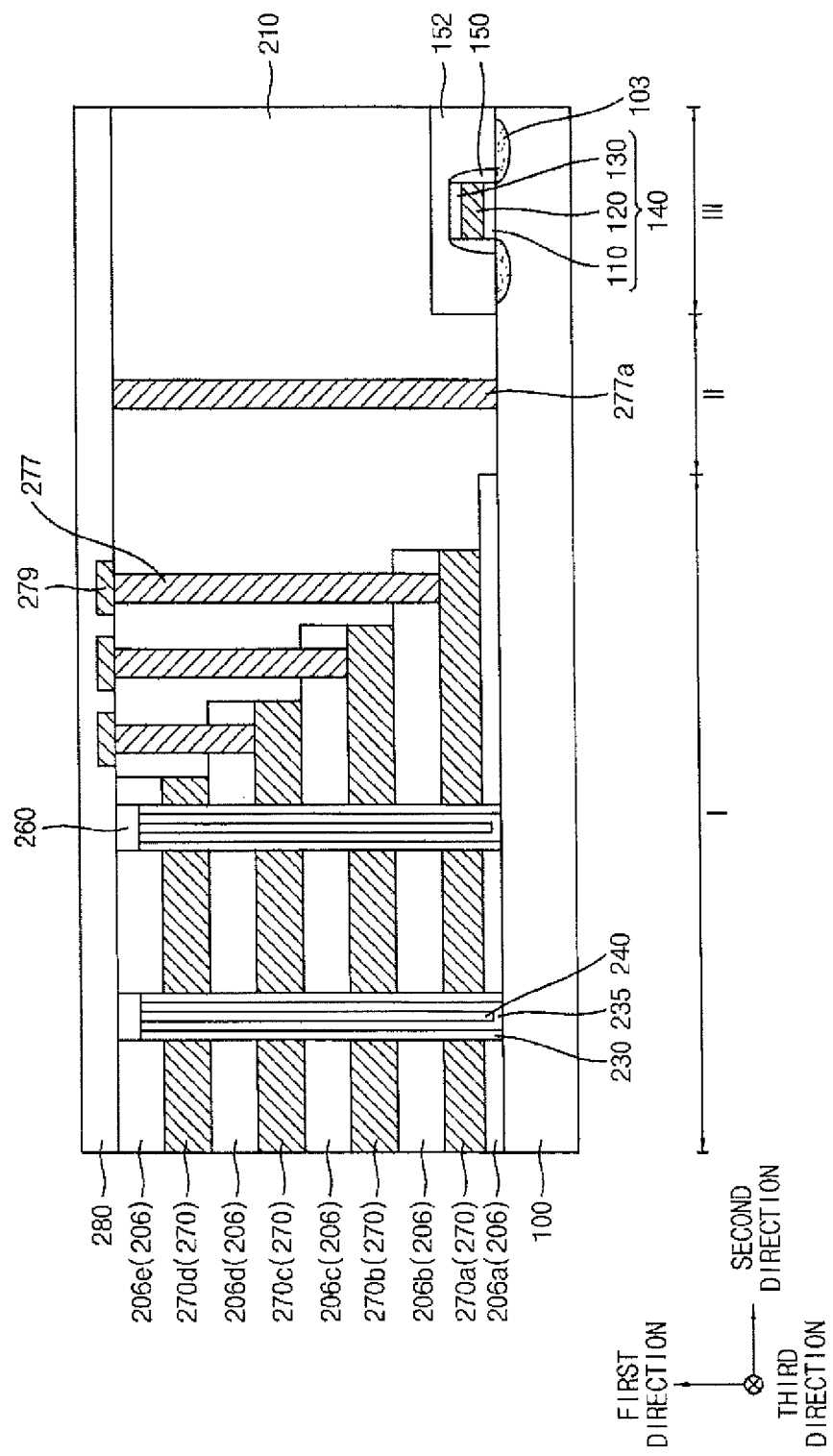

FIGS. 45A and 45B are a top plan view and a cross-sectional view, respectively, illustrating a vertical memory device in accordance with example embodiments. Specifically, FIG. 45B is a cross-sectional view taken along a line I-I' of FIG. 45A.

The vertical memory device of FIGS. 45A and 45B may have elements and/or constructions substantially the same as or similar to those illustrated with reference to FIGS. 1 to 3 except for an addition of contacts and wirings, and a construction of a blocking structure. Thus, detailed descriptions on repeated elements and/or structures are omitted herein, and like reference numerals are used to designate like elements.

Referring to FIGS. 45A and 45B, contacts 277 extending through a mold protection layer 210 and insulating interlayer patterns 206 may be formed on a cell region I of a substrate 100. The contact 277 may be in contact with a gate line 270 at each level. For example, the contacts 277 may be in contact with steps of word lines and a GSL included in each gate line structure. Wirings 279 may be formed on the mold protection layer 210 to be electrically connected to the contacts 277.

As illustrated in FIG. 45A, each wiring 279 may extend in the third direction, and may be electrically connected to a plurality of the contacts 277 in contact with the gate lines 270 included in different gate line structures.

In example embodiments, a plurality of dummy contacts 277a may be arranged on a blocking region II of the substrate 100. For example, the dummy contacts 277a may extend through a portion of the mold protection layer 210 formed on the blocking region II, and may be in contact with the substrate 100.

As illustrated in FIG. 45A, a plurality of the dummy contacts 277a may be arranged in the third direction such that a dummy contact column may be defined. A plurality of the dummy contact columns may be formed along the second direction. In some embodiments, the dummy contacts 277a may be arranged in the second and third directions, and may continuously surround the cell region I.

Accordingly, a blocking structure 278 including at least one dummy contact column may be disposed on the blocking region II of the substrate 100 so that a stress propagation between the cell region I and a peripheral circuit region III may be prevented by the blocking structure 278. FIG. 45A illustrates that the blocking structure 278 includes two dummy contact columns, however, the blocking structure 278 may include at least three dummy contact columns.

In example embodiments, the dummy contacts 277a included in the different dummy contact columns may be arranged to be staggered with each other. For example, the dummy contacts 277a may be formed in a zigzag arrangement. Thus, a density of the dummy contacts 277a may be increased on the blocking region II so that the stress propagation may be more efficiently prevented.

In some embodiments, a peripheral circuit contact (not illustrated) may be further formed on the peripheral circuit region III. The peripheral circuit contact may extend through the mold protection layer 210 to be electrically connected to a first impurity region 103. A peripheral circuit wiring (not illustrated) electrically connected to the peripheral circuit contact may be disposed on the mold protection layer 210.

An upper insulation layer 280 may be formed on an uppermost insulating interlayer pattern 206e, pads 260 and the mold protection layer 210, and may cover the wirings 279 and the dummy contacts 277a. In some embodiments, a bit line may be further disposed on the upper insulation layer 280 so that an electrical signal may be provided through the pad 260.

FIGS. 46A to 48 are top plan views and cross-sectional views illustrating a method of manufacturing a vertical memory device in accordance with example embodiments. For example, FIGS. 46A to 48 illustrate a method of manufacturing the vertical memory device illustrated in FIGS. 45A and 45B.

Figure 46B:
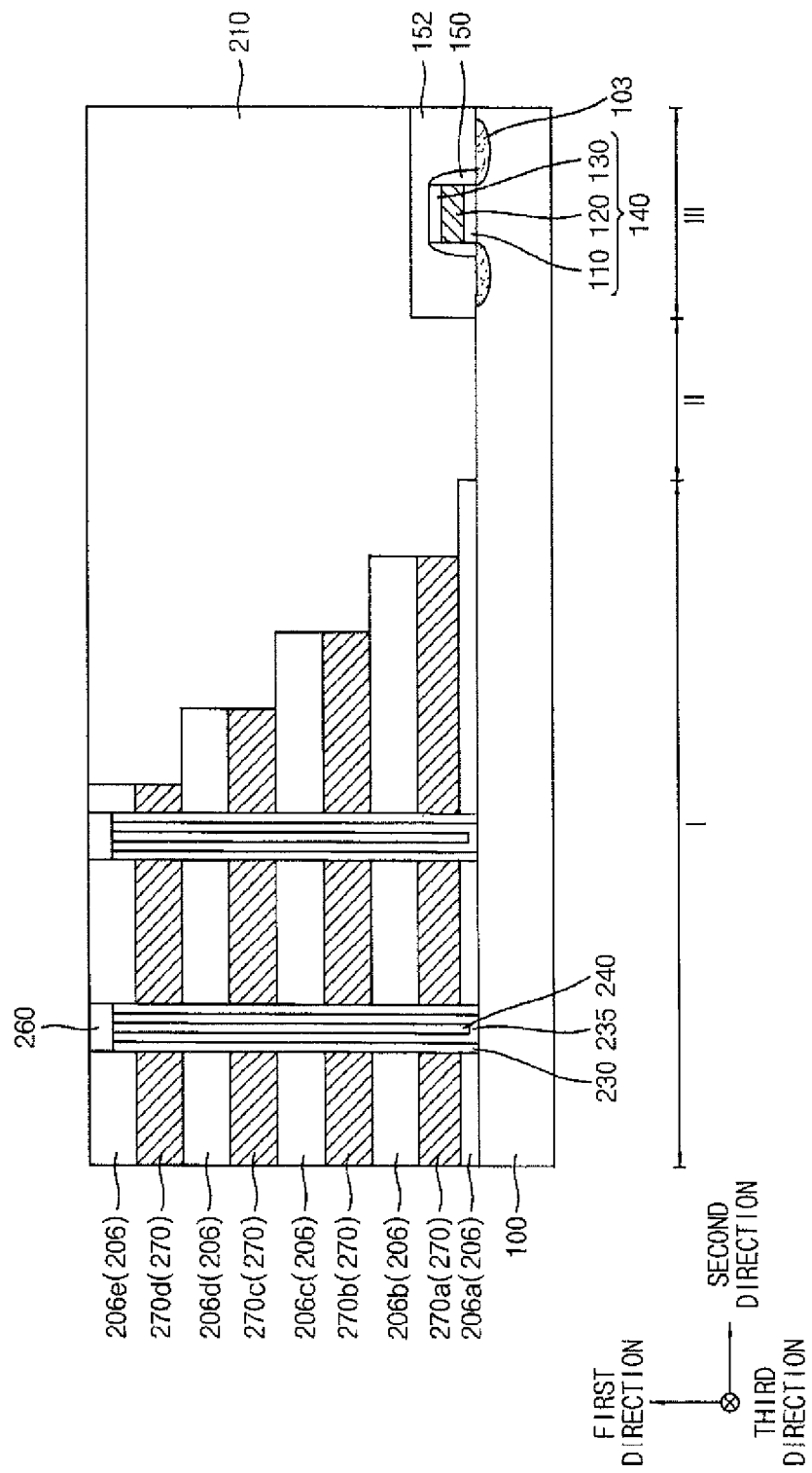
FIGS. 46A to 48 are top plan views and cross-sectional views illustrating a method of manufacturing a vertical memory device in accordance with example embodiments.
Figure 47B:
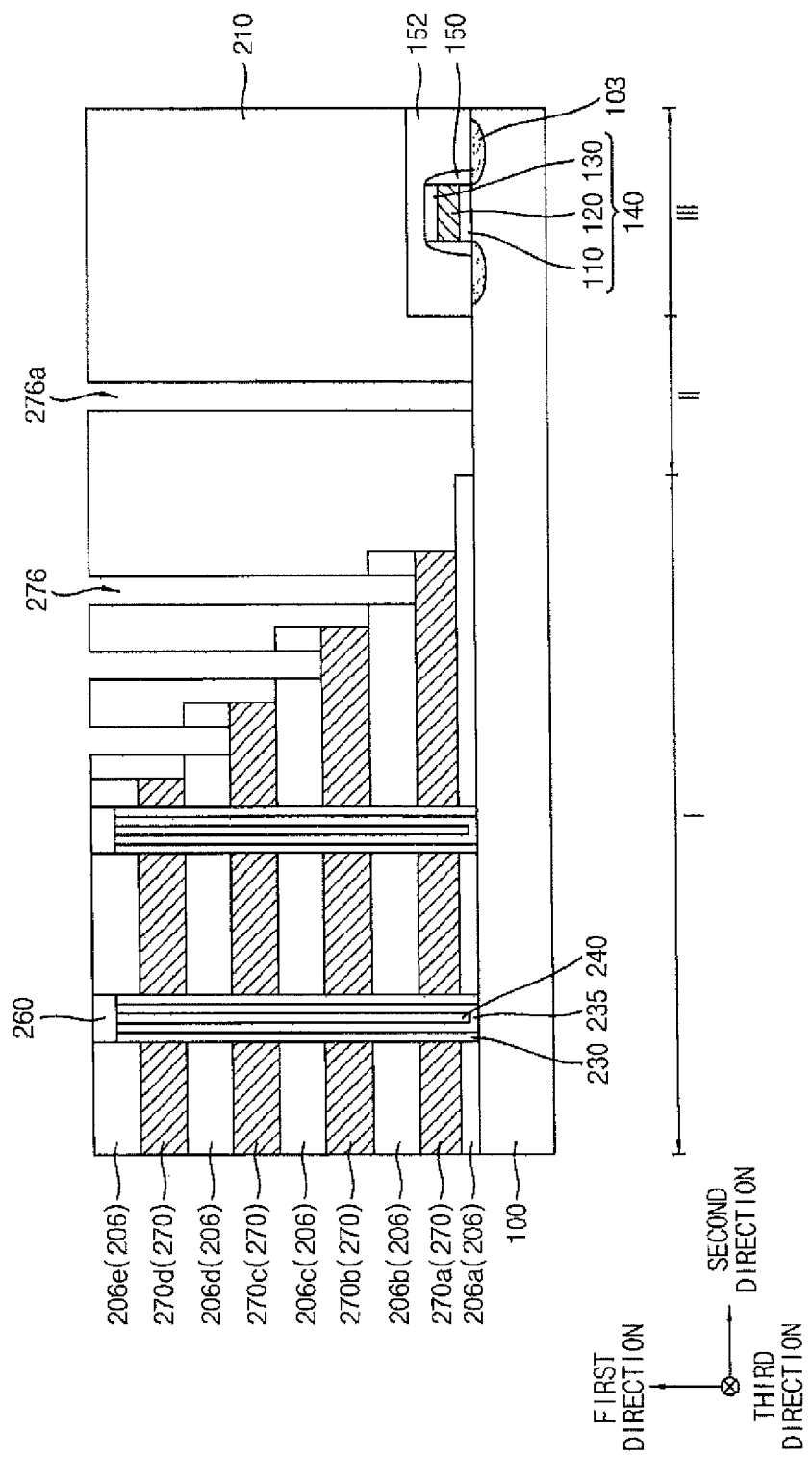
Figure 48:
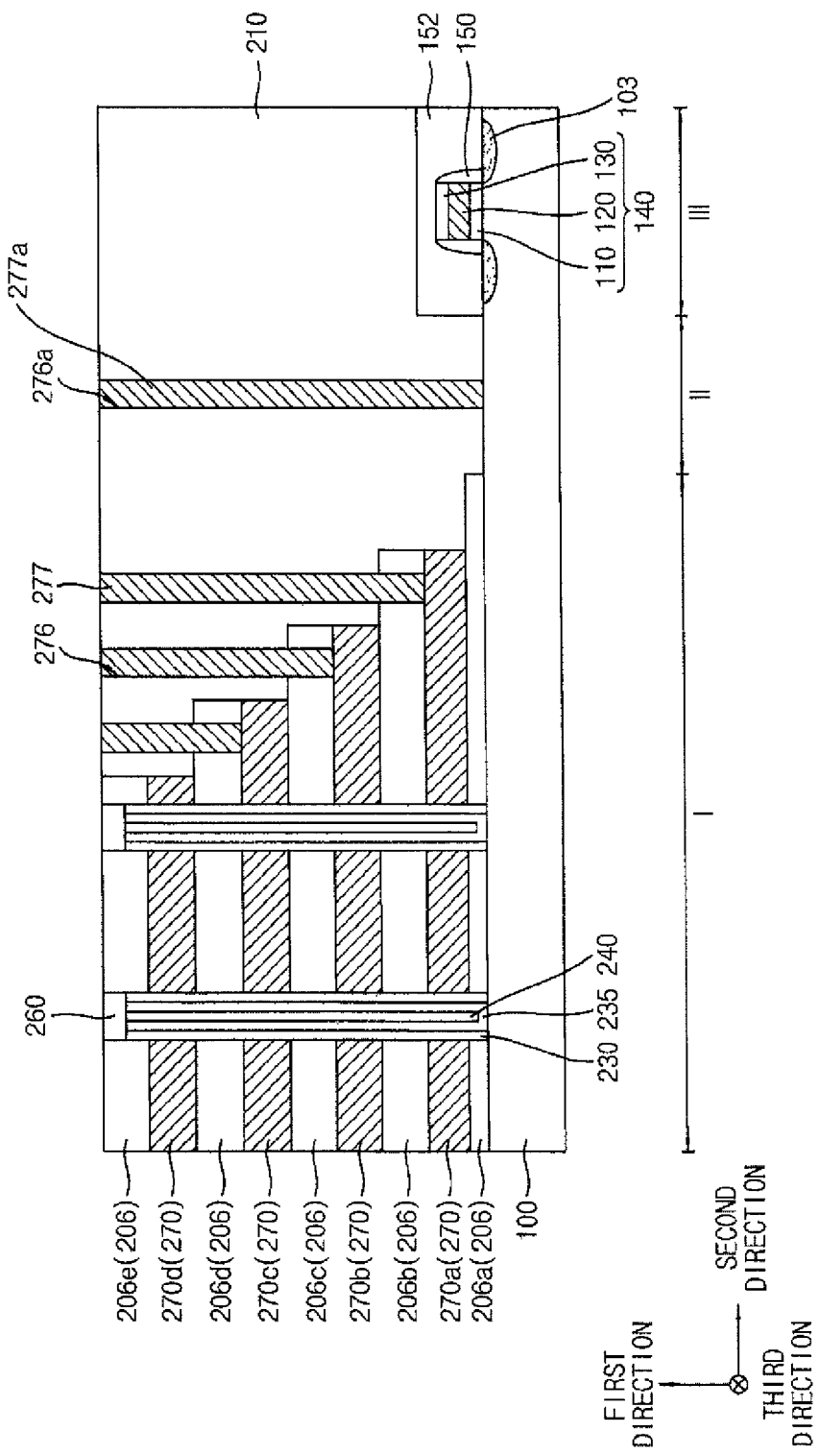

Specifically, FIGS. 46A and 47A are top plan views illustrating the method. FIGS. 46B, 47B and 48 are cross-sectional views taken along lines I-I' indicated in FIGS. 46A and 47A.

Detailed descriptions on processes and/or materials substantially the same as or similar to those illustrated with reference to FIGS. 4 to 17B are omitted herein.

Referring to FIGS. 46A and 46B, processes substantially the same as or similar to those illustrated with reference to FIGS. 4 to 17B may be performed.

Accordingly, insulating interlayer patterns 206 and gate lines 270 may be alternately and repeatedly stacked on a cell region I of a substrate 100, and channel rows may be formed through the insulating interlayer patterns 206 and the gate lines 270. A separation layer pattern 275 may be formed in a second opening 265 such that a gate line structure may be defined.

A peripheral circuit including a transistor that may be defined by a gate structure 140 and a first impurity region 103 may be formed on a peripheral circuit region III, and a peripheral circuit protection layer 152 covering the peripheral circuit may be formed.

The mold protection layer 210 may cover a lateral portion of the gate line structure, a portion of the substrate 100 of a blocking region II, and the peripheral circuit protection layer 152.

However, processes for formations of a first opening 217 and a blocking structure 250 illustrated with reference to FIGS. 7A to 13 may be omitted. Accordingly, the blocking region II may be substantially and fully covered by the mold protection layer 210.

Referring to FIGS. 47A and 47B, the mold protection layer 210 and the insulating interlayer pattern 206 on the cell region I may be partially etched to form contact holes 276 through which the gate lines 270 may be exposed. A dummy contact hole 276a may be formed through the mold protection layer 210 on the blocking region II.

In some embodiments, steps of word lines and a GSL included in the gate line structure may be exposed through the contact holes 276. The portion of the substrate 100 of the blocking region II may be exposed through the dummy contact hole 276a.

A plurality of the dummy contact holes 276a may be formed along the third direction such that a dummy contact hole column may be defined. A plurality of the dummy contact hole columns may be formed along the second direction. In some embodiments, a plurality of the dummy contact holes 276a may be formed along the second and third directions to surround the cell region I.

In example embodiments, the contact hole 276 and the dummy contact hole 276a may be formed by a substantially single etching process using the same etching mask. In some embodiments, a peripheral circuit contact hole (not illustrated) through which the first impurity region 103 may be exposed on the peripheral circuit region III may be formed together with the contact hole 276 and the dummy contact hole 276a.

Referring to FIG. 48, a contact 277 and a dummy contact 277a may be formed in the contact hole 276 and the dummy contact hole 276a, respectively.

For example, a first conductive layer sufficiently filling the contact hole 276 and the dummy contact hole 276a may be formed on the mold protection layer 210, the exposed gate lines 270 and the substrate 100. An upper portion of the first conductive layer may be planarized by a CMP process and/or an etch-back process until a top surface of the mold protection layer 210 is exposed to form the contacts 277 and the dummy contacts 277a. As described above, if the peripheral circuit contact hole is formed, a peripheral circuit contact electrically connected to the peripheral circuit may be formed together with the contact 277 and the dummy contact 277a.

According to the arrangement of the contact holes 276, the contacts 277 may be in contact with the word lines and the GSL included in the gate line structure. The dummy contacts 277a may be formed according to the arrangement of the dummy contact holes 276a such that a plurality of dummy contact columns may be defined. A blocking structure illustrated in FIG. 45A may be defined by the plurality of the dummy contact columns on the blocking region II.

A second conductive layer may be formed on the mold protection layer 210, and may be patterned to form wirings 279 as illustrated in FIG. 45B.

Each of the wirings 279 may extend in, e.g., the third direction, and may be electrically connected to the contacts 277 that may be in contact with the gate lines 270 of the same level and the different gate line structures. In some embodiments, a peripheral circuit wiring electrically connected to the peripheral circuit contact may be also formed from the second conductive layer.

The first and second conductive layers may be formed of a metal, a metal nitride or a doped polysilicon by a CVD process, an ALD process, a sputtering process, or the like.

An upper insulation layer 280 covering the wirings 279 and the dummy contacts 277a may be formed on an uppermost insulating interlayer pattern 206e, pads 260 and the mold protection layer 210.

Figure 49B:
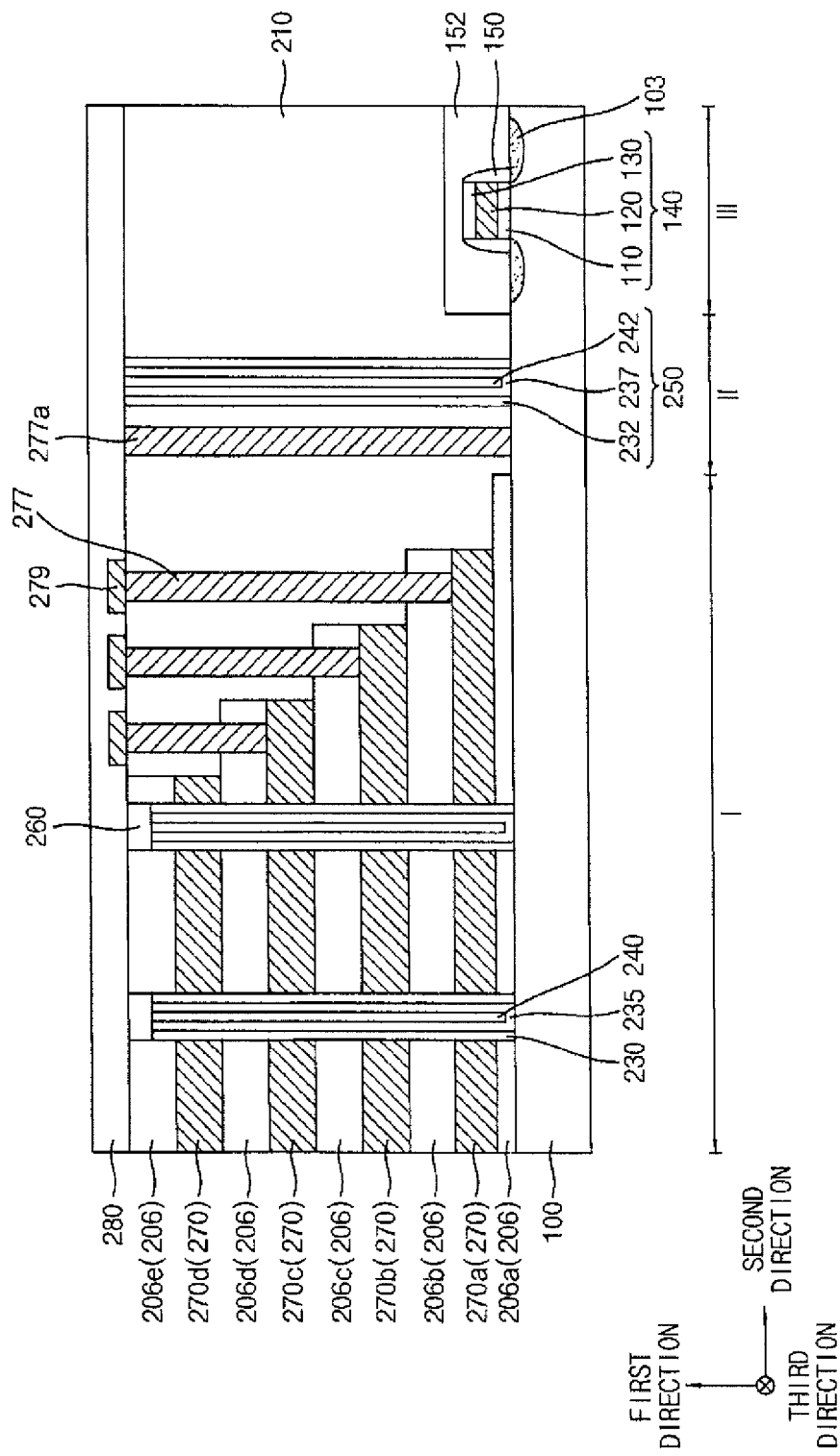

FIGS. 49A and 49B are a top plan view and a cross-sectional view, respectively, illustrating a vertical memory device in accordance with example embodiments. Specifically, FIG. 49B is a cross-sectional view taken along a line I-I' of FIG. 49A. The vertical memory device of FIGS. 49A and 49B may have elements and/or constructions substantially the same as or similar to those illustrated with reference to FIGS. 1 to 3, or FIGS. 45A and 45B except for a blocking structure. Thus, detailed descriptions on repeated elements and structures are omitted herein.

Referring to FIGS. 49A and 49B, a plurality of blocking structures having different constructions may be disposed on a blocking region II.

In example embodiments, a first blocking structure may be defined by dummy contacts 277a substantially the same as or similar to those illustrated with reference to FIGS. 45A and 45B, and a second blocking structure may be defined by a blocking structure 250 substantially the same as or similar to that illustrated with reference to FIGS. 1 to 3. The second blocking structure may include a dummy dielectric layer 232, a dummy channel 237 and a second filling layer pattern 242 extending continuously in the third direction.

Accordingly, the blocking structure may have a hybrid structure including the first blocking structure defined by a dummy contact column, and the second blocking structure that may have a fence or a ring shape. Thus, a stress propagation between a cell region I and the peripheral circuit region III may be more efficiently prevented.

Figure 50A:
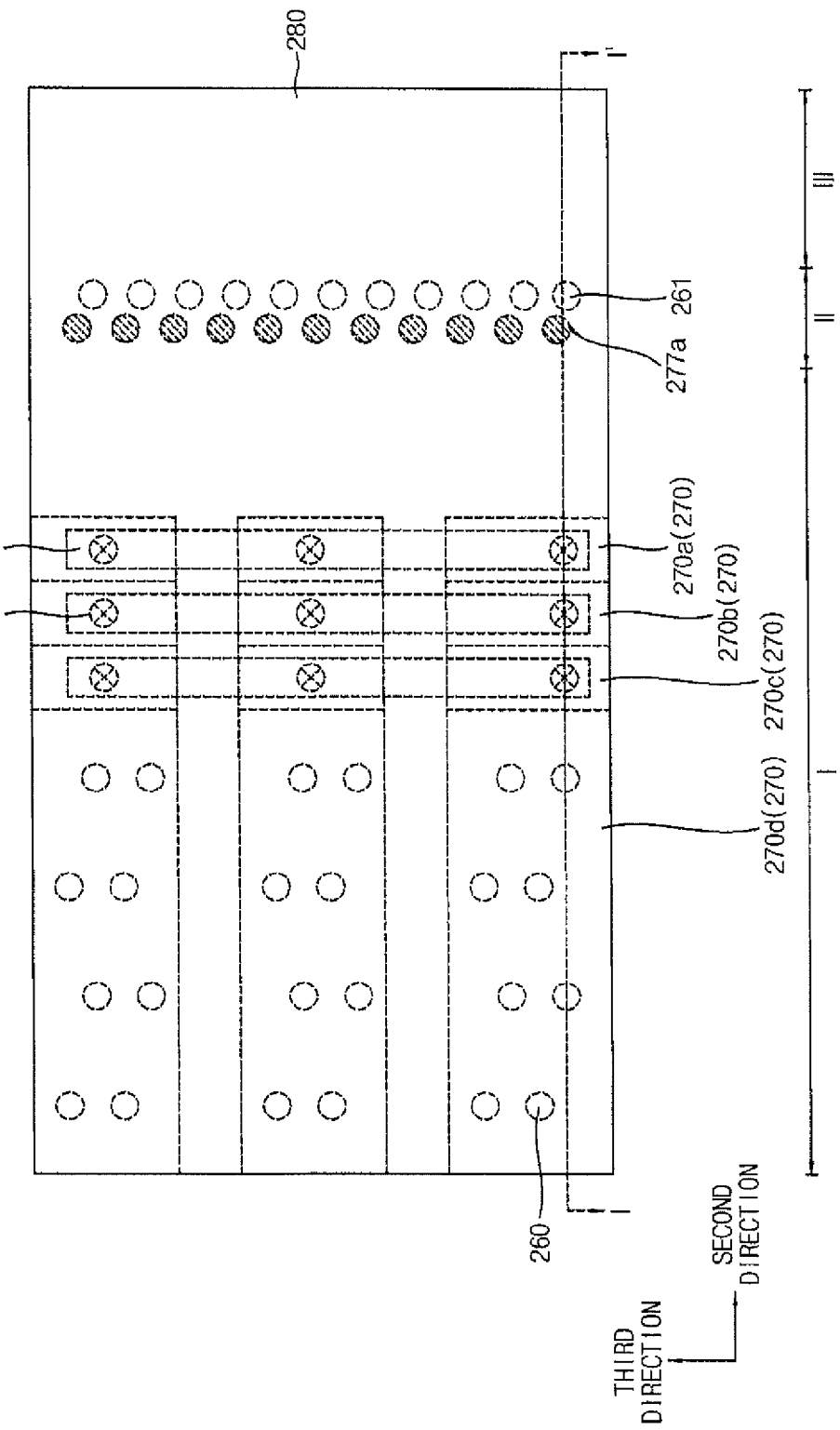
FIGS. 50A and 50B are a top plan view and a cross-sectional view, respectively, illustrating a vertical memory device in accordance with example embodiments.
Figure 50B:
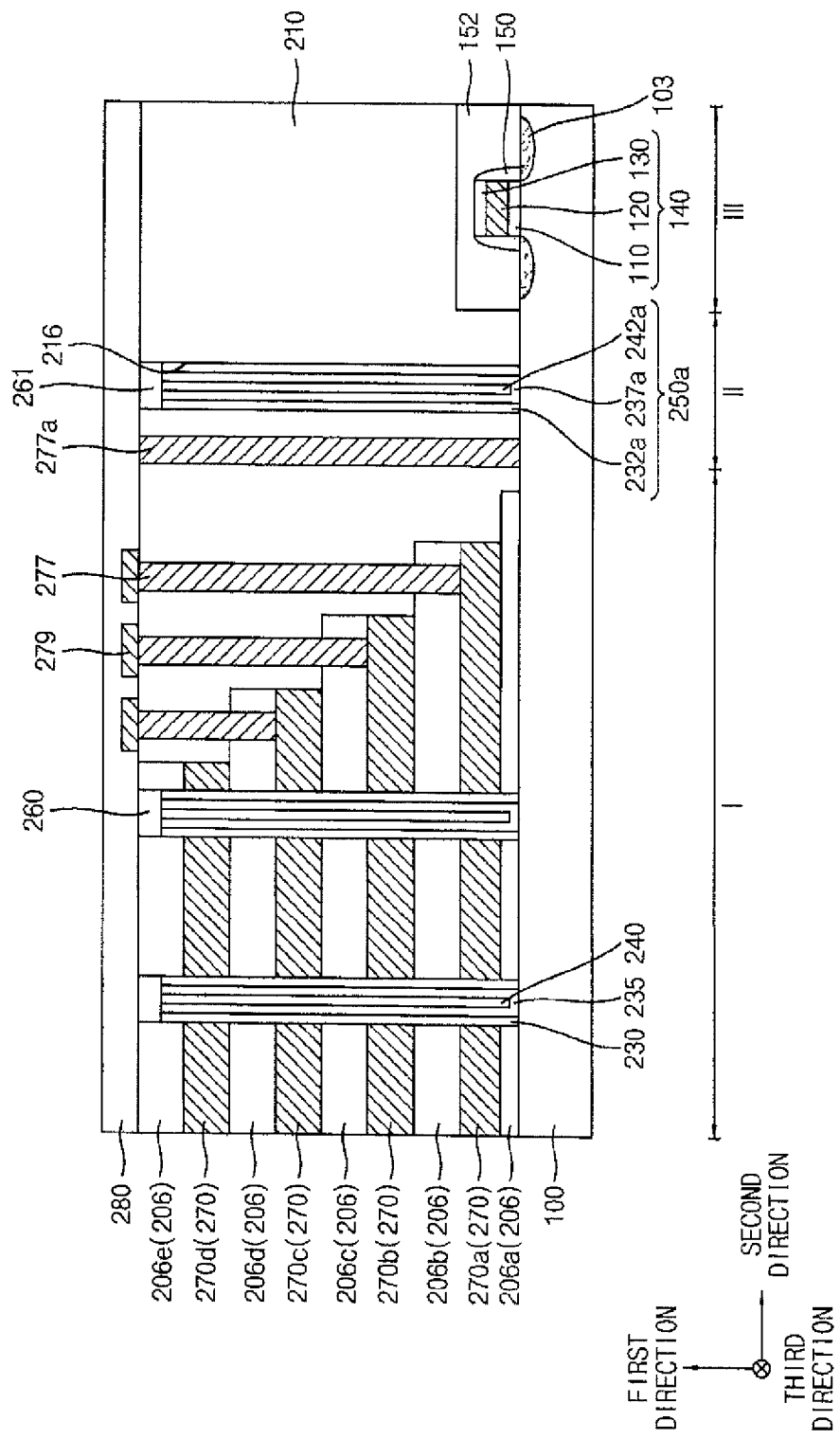

FIGS. 50A and 50B are a top plan view and a cross-sectional view, respectively, illustrating a vertical memory device in accordance with example embodiments. Specifically, FIG. 50B is a cross-sectional view taken along a line I-I' of FIG. 50A. The vertical memory device of FIGS. 50A and 50B may have elements and/or constructions substantially the same as or similar to those illustrated with reference to FIGS. 25 and 26, or FIGS. 45A and 45B except for a blocking structure. Thus, detailed descriptions on repeated elements and structures are omitted herein.

Referring to FIGS. 50A and 50B, a blocking structure having a hybrid structure formed of different materials may be disposed on a blocking region II.

In example embodiments, a first blocking structure may be defined by dummy contacts 277a substantially the same as or similar to those illustrated with reference to FIGS. 45A and 45B, and a second blocking structure may be defined by dummy channel structures 250a substantially the same as or similar to those illustrated with reference to FIGS. 25 and 26. The dummy channel structure 250a may extend in, e.g., the first direction, and may include a dummy dielectric layer structure 232a, a dummy channel 237a and a second filling layer pattern 242a extending through a mold protection layer 210. The dummy channel structure 250a may further include a dummy pad 261 at an upper portion thereof.

For example, the first blocking structure may include a dummy contact column defined by a plurality of the dummy contacts 277a. The second blocking structure may include a dummy channel column defined by a plurality of the dummy channel structures 250a.

FIG. 50A only illustrates one dummy contact column and one dummy channel column, however, at least two of the respective dummy contact columns and the dummy channel columns may be arranged on the blocking region II. In some embodiments, the dummy contact column and the dummy channel column may be continuously arranged along the second and third directions to surround a cell region I.

In some embodiments, the dummy contact column may be combined with various example embodiments of the present inventive concepts. For example, the dummy contact column may be combined with the blocking structure including the air gap 251 as illustrated in FIG. 24. The dummy contact column may be combined with the blocking structure including the dummy conductive line 273a as illustrated in FIG. 30.

Figure 51:
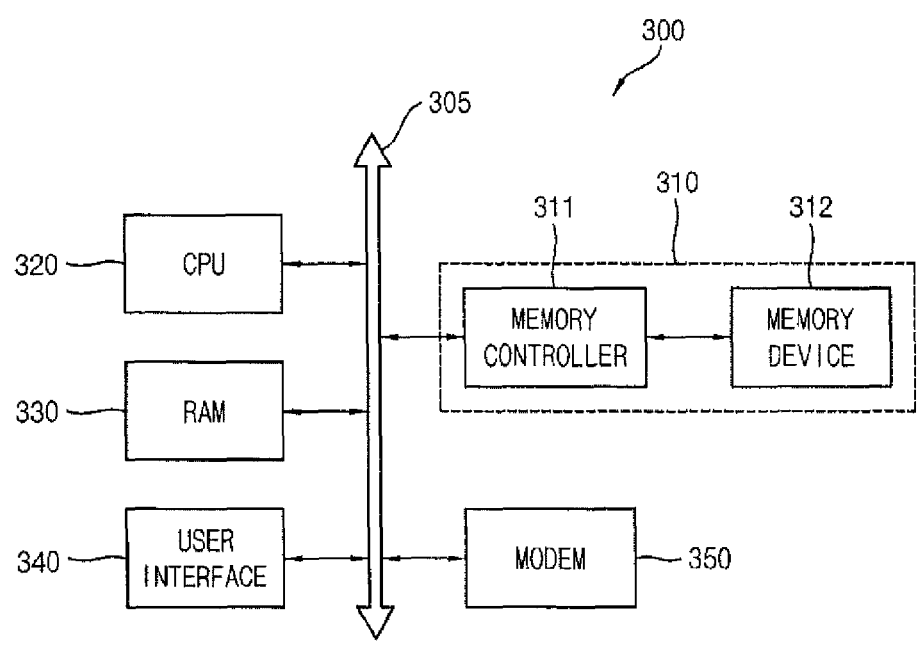
FIG. 51 is a block diagram illustrating a schematic construction of an information processing system in accordance with example embodiments.

FIG. 51 is a block diagram illustrating a schematic construction of an information processing system in accordance with example embodiments.

Referring to FIG. 51, an information processing system 300 may include a CPU 320, a RAM 330, a user interface 340, a modem 350 such as a baseband chipset and a memory system 510 electrically connected to a system bus 305. The memory system 310 may include a memory device 312 and a memory controller 311. The memory device 312 may include the vertical memory device in accordance with example embodiments described above. Thus, large data processed by the CPU 320 or input from an external device may be stored in the memory device 312 with high stability. The memory controller 311 may have a construction capable of controlling the memory device 312. The memory system 310 may be provided as, e.g., a memory card or a solid state disk (SSD) by a combination of the memory device 312 and the memory controller 311. In a case that the information processing system 300 is implemented to a mobile device, a battery may be further provided for supplying an driving voltage of the information processing system 300. The information processing system 300 may further include an application chipset, a camera image processor (CIS), a mobile DRAM, etc.

According to example embodiments of the present invention, a vertical memory device may include a blocking structure between a cell region and a peripheral circuit region. A stress generated when a channel, a dielectric layer structure, etc., are formed on the cell region may be prevented from being transferred to the peripheral circuit region by the blocking structure. Therefore, defects including, e.g., a dislocation or a malfunction of a peripheral circuit may be reduced.

According to example embodiments of the present invention, a blocking structure having various structures and/or shapes may be employed to a vertical memory device to prevent a stress transfer or a stress propagation between a cell region and a peripheral circuit region. Therefore, a vertical memory device without defects by a stress generated from, e.g. the large stacked number of various layers may be obtained, and thus the vertical memory device may have an improved reliability.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A vertical memory device, comprising:
    a substrate including a cell region and a peripheral circuit region, the peripheral circuit region including a gate structure, the gate structure including a transistor;
    a plurality of channels on the cell region, each of the channels extending in a first direction that is vertical with respect to a top surface of the substrate;
    a plurality of gate lines stacked in the first direction and spaced apart from each other, the gate lines surrounding outer sidewalls of the channels; and
    a blocking structure between the cell region and the peripheral circuit region, a height of the blocking structure being greater than a height of the gate structure in the peripheral circuit region.

2. The vertical memory device of claim 1, wherein
    the gate lines extend in a second direction that is parallel with respect to the top surface of the substrate, and
    the blocking structure extends in at least a third direction that is parallel with respect to the top surface of the substrate and crosses the second direction.

3. The vertical memory device of claim 2, wherein the blocking structure includes a dummy channel having a material that is the same as that of the channel.

4. The vertical memory device of claim 1, further comprising:
    a dielectric layer structure on each of the outer sidewalls of the channels,
    wherein the blocking structure includes a dummy dielectric layer having a material that is the same as that of the dielectric layer structure.

5. The vertical memory device of claim 1, wherein the blocking structure includes an air gap.

6. The vertical memory device of claim 1, wherein the blocking structure includes:
    at least one dummy channel column including a plurality of dummy channel structures.

7. The vertical memory device of claim 1, further comprising:
    contacts electrically connected to the gate lines on the cell region,
    wherein the blocking structure includes at least one dummy contact column, and
    the at least one dummy contact column includes a plurality of dummy contacts.

8. The vertical memory device of claim 1, wherein the blocking structure includes a dummy conductive line, the dummy conductive line contacting the top surface of the substrate.

9. The vertical memory device of claim 8, further comprising:
    a common source line on the cell region,
    wherein the common source line and the dummy conductive line include the same conductive material.

10. The vertical memory device of claim 1, wherein the blocking structure is at least partially buried in the substrate.

11. The vertical memory device of claim 10, wherein the gate structure includes a gate electrode buried in the substrate.

12. A vertical memory device, comprising:
    a substrate including a cell region and a peripheral circuit region, the peripheral circuit region including a gate structure, the gate structure including a transistor;
    a plurality of channels on the cell region, each of the channels extending in a first direction that is vertical with respect to a top surface of the substrate;
    a plurality of gate lines stacked in the first direction and spaced apart from each other, the gate lines surrounding outer sidewalls of the channels;
    a common source line on the cell region; and
    a blocking structure between the cell region and the peripheral circuit region, the blocking structure surrounding the cell region, a height of the blocking structure being greater than a height of the gate structure in the peripheral circuit region.

13. The vertical memory device of claim 12, wherein the blocking structure includes a dummy channel having a material the same as that of the channel.

14. The vertical memory device of claim 12, wherein the blocking structure includes at least one dummy channel column having a shape that is the same as that of the channels.

15. The vertical memory device of claim 12, wherein the blocking structure has a material that is the same as that of the common source line.

16. The vertical memory device of claim 15, further comprising;
a separation layer pattern formed on both sidewalls of the common source line facing each other,
wherein the blocking structure includes,
a dummy conductive line having a conductive material that is the same as that of the common source line, and
a dummy separation layer pattern formed on both sidewalls of the dummy conductive line facing each other, and
the dummy separation layer pattern includes an insulation material that is the same as that of the separation layer pattern.

17. The vertical memory device of claim 12, wherein
the common source line extends in a second direction that is parallel with respect to the top surface of the substrate, and
the blocking structure extends in at least a third direction that is parallel with respect to the top surface of the substrate and crosses the second direction.

18. A vertical memory device, comprising:
a substrate including a cell region, a blocking region and a peripheral circuit region, the peripheral circuit region including a gate structure, the gate structure including a transistor;
a gate line structure on the cell region, the gate line structure including
a plurality of insulating interlayer patterns and a plurality of gate lines alternately stacked in a first direction that is vertical with respect to a top surface of the substrate,
a plurality of channels extending through the plurality of insulating interlayer patterns and the plurality of gate lines;
a peripheral circuit on the peripheral circuit region; and
a blocking structure on the blocking region, the blocking structure defining a boundary between the gate line structure and the peripheral circuit region, a height of the blocking structure being greater than a height of the gate structure in the peripheral circuit region.

19. The vertical memory device of claim 18, wherein
the gate line structure extends in a second direction that is parallel with respect to the top surface of the substrate, and
a plurality of the gate line structures are arranged in a third direction that is parallel with respect to the top surface of the substrate and crosses the second direction.

20. The vertical memory device of claim 19, wherein the blocking structure extends in the third direction.

\* \* \* \* \*